United States Patent
Kunitake et al.

(10) Patent No.: US 11,043,186 B2
(45) Date of Patent: Jun. 22, 2021

(54) SEMICONDUCTOR DEVICE, MANUFACTURING METHOD THEREOF, DISPLAY DEVICE, AND ELECTRONIC DEVICE

(71) Applicant: Semiconductor Energy Laboratory Co., Ltd., Atsugi (JP)

(72) Inventors: Hitoshi Kunitake, Kanagawa (JP); Yoshiyuki Kurokawa, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 15/792,235

(22) Filed: Oct. 24, 2017

(65) Prior Publication Data

US 2018/0122336 A1 May 3, 2018

(30) Foreign Application Priority Data

Nov. 2, 2016 (JP) .............................. JP2016-214967
Jan. 11, 2017 (JP) .............................. JP2017-002285

(51) Int. Cl.
*G09G 5/10* (2006.01)
*H04L 27/18* (2006.01)
(Continued)

(52) U.S. Cl.
CPC ............... *G09G 5/10* (2013.01); *H04L 27/02* (2013.01); *H04L 27/18* (2013.01);
(Continued)

(58) Field of Classification Search
CPC ... H04L 1/0003; H04L 1/0001; H04L 1/0026; H04L 5/143; H04L 25/4902;
(Continued)

(56) References Cited

U.S. PATENT DOCUMENTS 6,747,524 B2 * 6/2004 Takahashi ................ H03C 3/40
332/103
7,908,021 B1 * 3/2011 Bogard ................. H04L 25/028
700/94
(Continued)

FOREIGN PATENT DOCUMENTS

JP 2003-157026 A 5/2003

OTHER PUBLICATIONS

Okada.K et al., "A Full 4-Channel 6.3Gb/s 60GHz Direct-Conversion Transceiver with Low-Power Analog and Digital Baseband Circuitry", ISSCC 2012 (Digest of Technical Papers. IEEE International Solid-State Circuits Conference), dated Feb. 19, 2012, pp. 218-220.

*Primary Examiner* — Dismery Mercedes
(74) *Attorney, Agent, or Firm* — Fish & Richardson P.C.

(57) ABSTRACT

A method for transmitting image data to a display device at high speed is provided. Image data to be transmitted is input to a phase modulation portion, and is mixed with a high-frequency carrier wave. The carrier wave is modulated with a technique of phase-shift keying, and output to a transmission line determined in consideration of the transmission characteristics of the high-frequency wave. A phase regulating portion of the phase modulation portion has a function of adjusting the amount of change in phase with the use of an electric signal. A phase demodulation portion beyond the transmission line demodulates the modulated carrier wave and extracts the image data. The multi-bit image data can be transmitted by the technique of the phase-shift keying. The high-speed transmission enables serial conversion of the original image data and decreases the number of transmission lines.

21 Claims, 23 Drawing Sheets

(51) Int. Cl.
  *H04L 27/32* (2006.01)
  *H04L 5/06* (2006.01)
  *H04L 27/02* (2006.01)
  *H04L 27/26* (2006.01)
  *G02F 1/1335* (2006.01)
  *G02F 1/13357* (2006.01)
  *G02F 1/1343* (2006.01)
  *G02F 1/1368* (2006.01)
  *H01L 27/12* (2006.01)
  *H01L 27/32* (2006.01)
  *H01L 29/786* (2006.01)

(52) U.S. Cl.
  CPC .......... *H04L 27/2627* (2013.01); *H04L 27/32* (2013.01); *G02F 1/1368* (2013.01); *G02F 1/13439* (2013.01); *G02F 1/133553* (2013.01); *G02F 1/133603* (2013.01); *G02F 2201/123* (2013.01); *G02F 2201/44* (2013.01); *G09G 2310/08* (2013.01); *G09G 2320/0646* (2013.01); *G09G 2330/021* (2013.01); *H01L 27/1225* (2013.01); *H01L 27/3232* (2013.01); *H01L 27/3244* (2013.01); *H01L 29/7869* (2013.01); *H01L 29/78651* (2013.01)

(58) Field of Classification Search
  CPC .......... H04L 25/03159; H04L 27/2649; H04L 27/2627; H04L 27/0012; H04L 27/02; H04L 27/04; H04L 27/36; H04L 27/38; H04L 27/12; H04L 27/14; H04L 27/18; H04L 27/361; H04L 2025/03522; G09G 2310/08; G09G 2320/0646; H01L 27/3232; H01L 27/3244
  See application file for complete search history.

(56) References Cited

U.S. PATENT DOCUMENTS

| | | | |
|---|---|---|---|
| 8,411,078 B2 * | 4/2013 | Choe | G09G 3/2096 345/214 |
| 2003/0001782 A1 * | 1/2003 | Takahashi | H03C 3/40 343/701 |
| 2003/0052869 A1 * | 3/2003 | Fujii | H01L 27/3232 345/204 |
| 2005/0111582 A1 * | 5/2005 | Sasaki | H04L 27/2071 375/308 |
| 2005/0162338 A1 * | 7/2005 | Ikeda | G09G 5/006 345/2.1 |
| 2006/0062331 A1 * | 3/2006 | Shirazi | H04L 27/1525 375/326 |
| 2006/0103620 A1 * | 5/2006 | Joo | G09G 3/3611 345/98 |
| 2008/0149737 A1 * | 6/2008 | Ohshima | G11C 5/142 235/492 |
| 2008/0237779 A1 * | 10/2008 | Yamazaki | H01L 21/76254 257/507 |
| 2008/0242352 A1 * | 10/2008 | Koshijima | H04M 1/72555 455/556.1 |
| 2010/0137042 A1 * | 6/2010 | Na | H01Q 1/243 455/575.5 |
| 2010/0265247 A1 * | 10/2010 | Choe | G09G 3/2096 345/214 |
| 2011/0038282 A1 | 2/2011 | Mihota et al. | |
| 2011/0165847 A1 * | 7/2011 | Kawasaki | H04B 3/20 455/73 |
| 2015/0054863 A1 * | 2/2015 | Tanaka | G09G 3/3618 345/691 |
| 2015/0099474 A1 * | 4/2015 | Yarga | H04B 1/0064 455/77 |
| 2016/0179243 A1 * | 6/2016 | Schwartz | G06F 3/044 345/174 |
| 2017/0134198 A1 * | 5/2017 | Okuni | H04L 27/227 |

* cited by examiner

FIG. 11A1
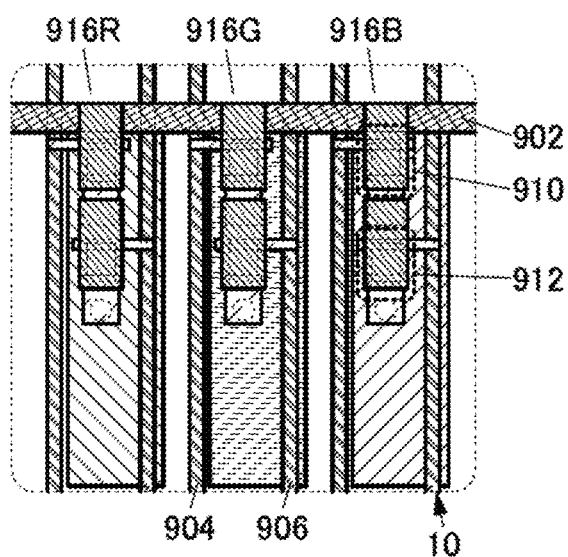
FIG. 11A2
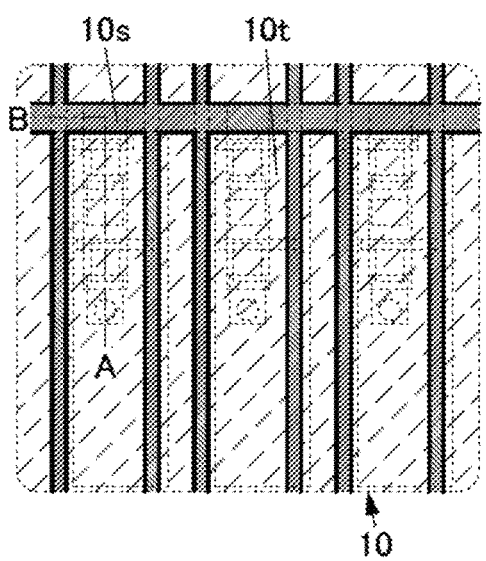
FIG. 11B
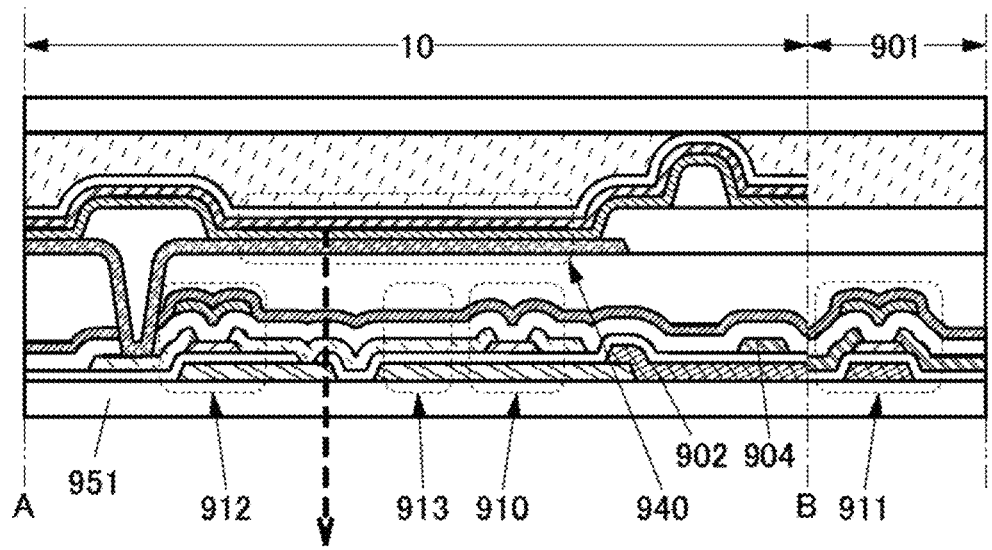

FIG. 12A1
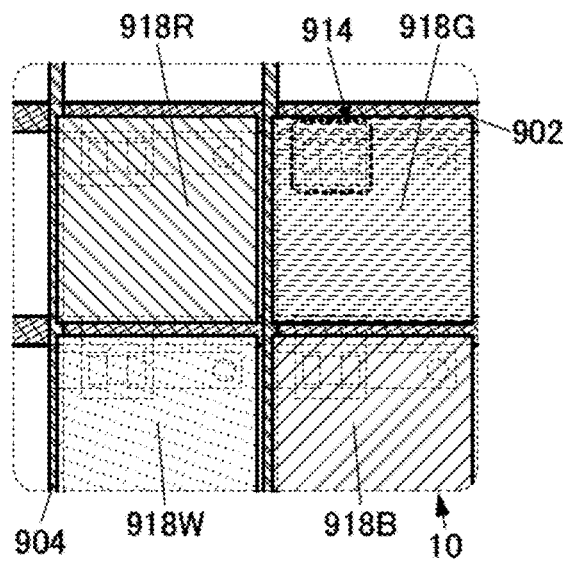
FIG. 12A2
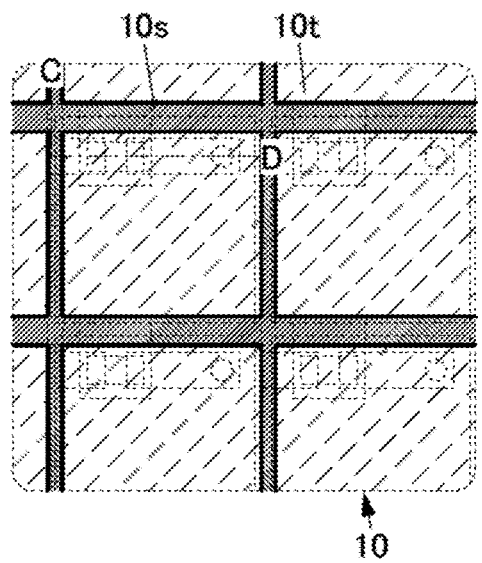
FIG. 12B
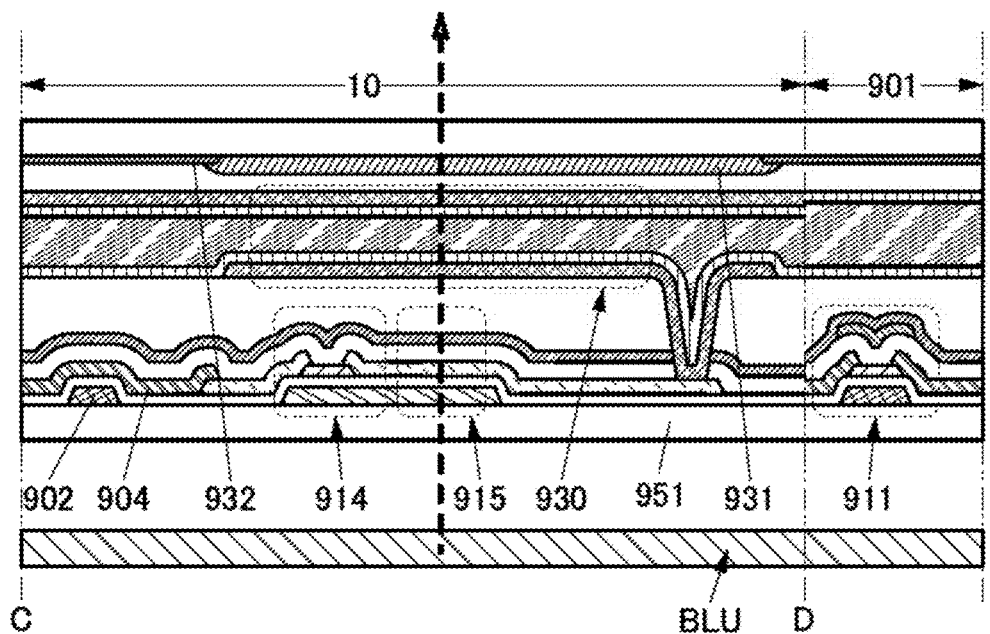

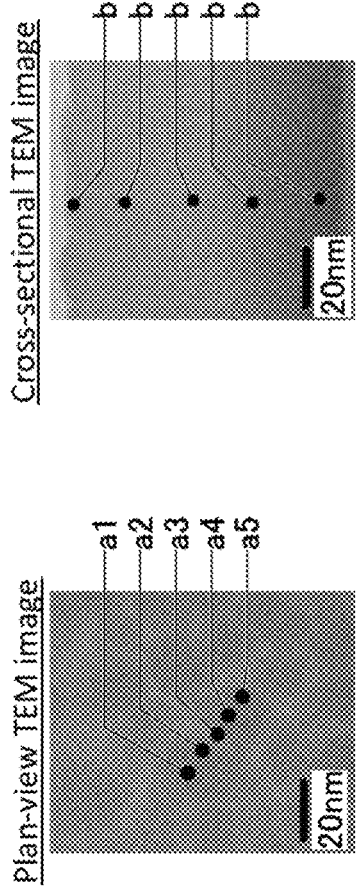
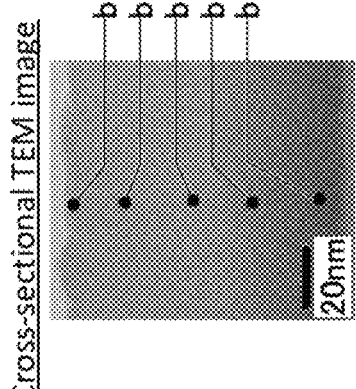
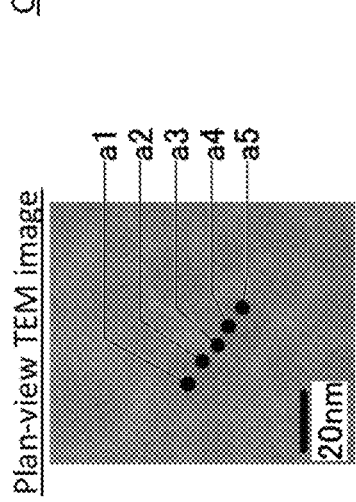
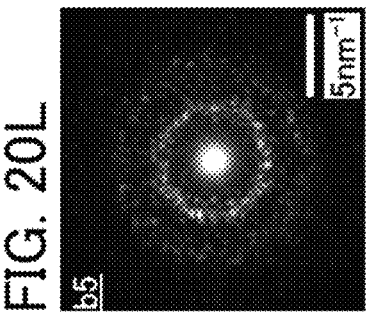
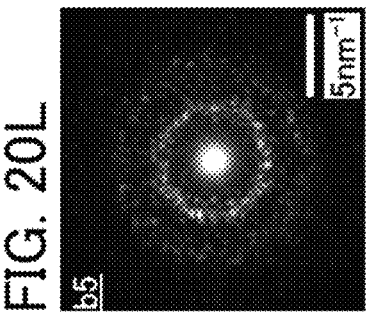
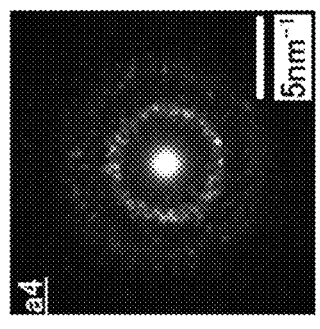
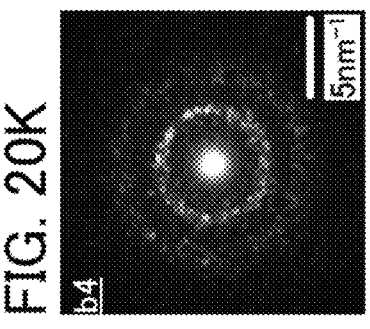
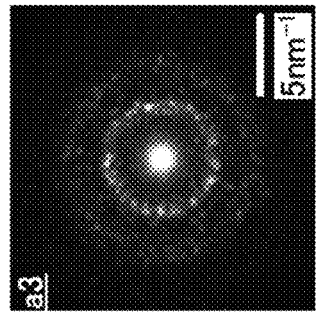
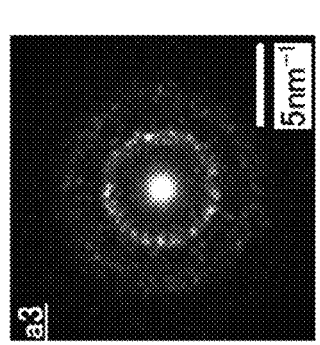
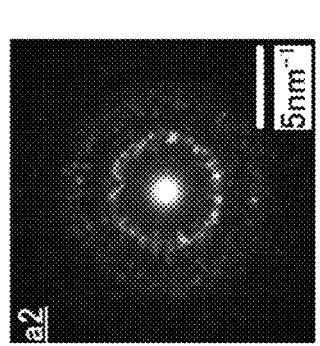
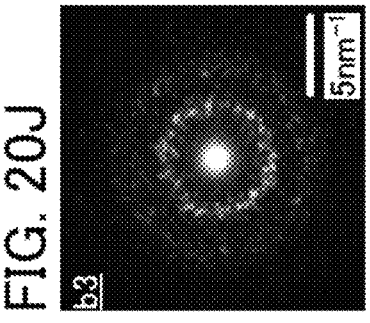
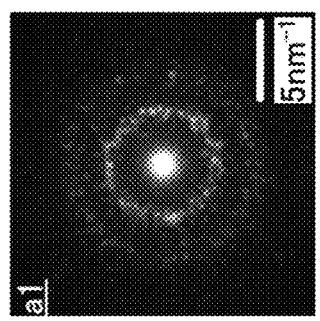
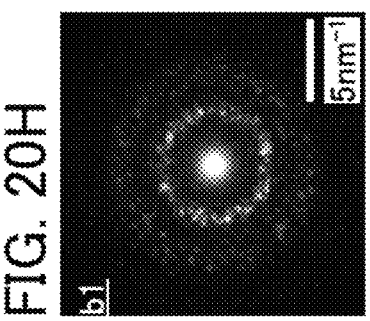
FIG. 20A Plan-view TEM image
FIG. 20B Cross-sectional TEM image
FIG. 20C FIG. 20D FIG. 20E FIG. 20F FIG. 20G
FIG. 20H FIG. 20I FIG. 20J FIG. 20K FIG. 20L

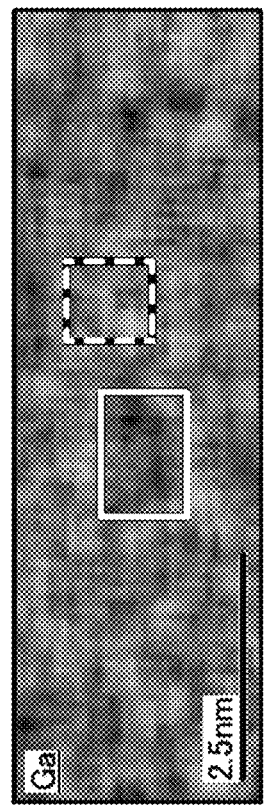
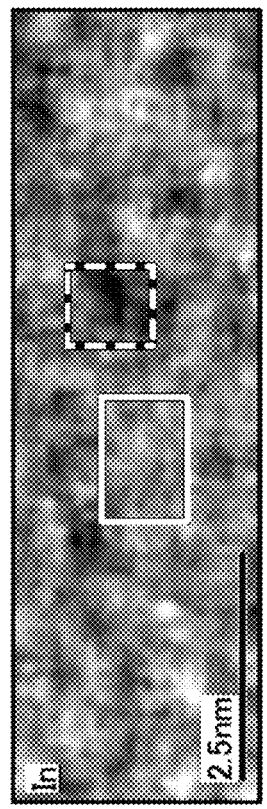
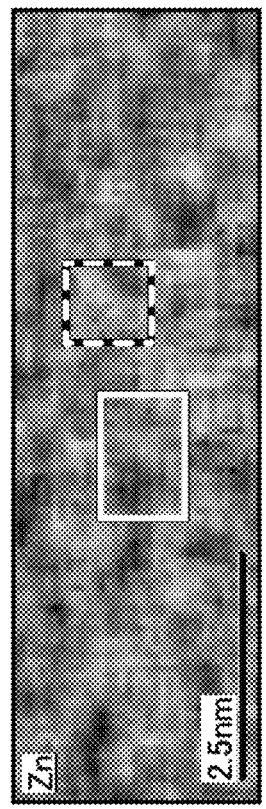
FIG. 21A
FIG. 21B
FIG. 21C

SEMICONDUCTOR DEVICE, MANUFACTURING METHOD THEREOF, DISPLAY DEVICE, AND ELECTRONIC DEVICE

BACKGROUND OF THE INVENTION

1. Field of the Invention

One embodiment of the present invention relates to a semiconductor device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter.

Specific examples of the technical field of one embodiment of the present invention disclosed in this specification and the like include a semiconductor device, a display device, an electronic device, a method for driving any of them, and a method for manufacturing any of them. In this specification and the like, a semiconductor device generally means a device that can function by utilizing semiconductor characteristics. For example, an integrated circuit, a chip including an integrated circuit, an electronic component including a packaged chip, and an electronic device including an integrated circuit are examples of a semiconductor device.

2. Description of the Related Art

In recent years, display devices are utilized in various electronic devices such as mobile phones (e.g., smartphones), tablet information terminals, laptop personal computers (PCs), and televisions (TVs), and their image qualities get higher and higher. For example, display devices with higher resolution, higher color reproducibility (higher NTSC ratio), or higher response speed are being developed.

A display device in which a reflective element and a light-emitting element are used in combination has been proposed (Patent Document 1). The reflective element is used in bright environments and the light-emitting element is used in dark environments; accordingly, the display device can have low power consumption and high display quality regardless of external light environment. Furthermore, novel usage has been proposed; for example, a still image is displayed with the reflective element and a moving image is displayed with the light-emitting element.

Millimeter-wave band communication with a silicon CMOS (Si-CMOS) has been researched as one of data transmission methods. Development of Si-CMOS technology leads to development of 60-GHz wireless communication with a relatively inexpensive Si-CMOS integrated circuit without a compound semiconductor (Non-Patent Document 1).

REFERENCE

Patent Reference

[Patent Document 1] Japanese Published Patent Application No. 2003-157026

Non-Patent Reference

Non-Patent Document 1

Kenichi Okada, et al., "A Full 4-Channel 6.3 Gb/s 60 GHz Direct-Conversion Transceiver with Low-Power Analog and Digital Baseband Circuitry," IEEE International Solid-State Circuits Conference (ISSCC), pp. 218-219, February 2012.

SUMMARY OF THE INVENTION

The image quality of a display device is improved by, for example, an increase in the number of pixels, the number of display colors, or the frame frequency, which increases the image data. A display device including both a reflective element and a light-emitting element has increased image data when the reflective element and the light-emitting element display different images. The increase in image data causes an increase in data amount transmitted between a controller of the display device in an electronic device and a host of the electronic device. An object of one embodiment of the present invention is to provide a semiconductor device that has high data transmission capacity.

A method for increasing the data transmission capacity is to increase the number of wirings and transmit signals in parallel. However, this method causes, for example, increases in the number of input/output terminals, the power consumption, and the semiconductor chip size. Thus, another object is to provide a semiconductor device that has high data transmission capacity with a small number of wirings.

For example, a display device with 1920×1080 pixels that is called a full high-definition (FHD) display device is employed in TVs, laptop PCs, smartphones, and the like. When image data for full high-definition display is transmitted by low-voltage differential signaling (LVDS) that is used for short-distance (several centimeters to approximately twenty centimeters) data transmission, 12 pairs of wirings (24 wirings) are required at a frame frequency of 60 Hz. Furthermore, a display device that has four times as much pixels as a FHD display device does, which is called an ultra-high-definition (4K2K) display device, is employed in part of TVs, laptop PCs, smartphones, and the like. Thus, another object is to provide a semiconductor device with high data transmission capacity that can transmit image data for these display devices with a small number of wirings.

An object of one embodiment of the present invention is to provide a novel semiconductor device. Another object is to provide a semiconductor device with high data transmission capacity. Another object is to provide a semiconductor device that has high data transmission capacity with a small number of wirings. Another object of one embodiment of the present invention is to provide a novel display device.

Note that one embodiment of the present invention does not necessarily achieve all the objects listed above and only needs to achieve at least one of the objects. The description of the above objects does not preclude the existence of other objects. Other objects will be apparent from and can be derived from the description of the specification, the drawings, the claims, and the like.

One embodiment of the present invention is a semiconductor device including a phase modulation portion, an FPC, a phase demodulation portion, a controller, and a display panel. Image data is input to the phase modulation portion. The phase modulation portion generates a high-frequency signal including the image data, and transmits the high-frequency signal to the phase demodulation portion through the FPC. The phase demodulation portion demodulates the high-frequency signal and extracts the image data. The controller makes the display panel display an image on the basis of the image data extracted by the phase demodulation portion.

One embodiment of the present invention is the semiconductor device according to the above embodiment in which the phase demodulation portion includes a phase shifter. The phase shifter is provided over a substrate included in the display panel.

In the above embodiment, a transistor in each of the phase modulation portion and the phase demodulation portion is a silicon transistor.

In the above embodiment, the FPC has a stripline structure or a microstripline structure.

In the above embodiment, the FPC has a coplanar line structure.

In the above embodiment, the phase modulation portion performs phase-shift keying.

One embodiment of the present invention is the semiconductor device according to the above embodiment in which the controller includes a source driver and the display panel includes a reflective element and a light-emitting element. The source driver is configured to generate a first data signal and a second data signal on the basis of the image data extracted by the phase demodulation portion. The reflective element performs display in accordance with the first data signal and the light-emitting element performs display in accordance with the second data signal.

In the above embodiment, the reflective element is a liquid crystal element and the light-emitting element is an organic EL element.

In the above embodiment, the display panel includes a transistor including a metal oxide in its channel formation region.

One embodiment of the present invention is a display device including a display panel, a controller, and a phase demodulation portion. A high-frequency signal including image data is input to the phase demodulation portion. The phase demodulation portion demodulates the high-frequency signal and extracts the image data. The controller makes the display panel display an image on the basis of the image data extracted by the phase demodulation portion.

One embodiment of the present invention is the display device according to the above embodiment in which the phase demodulation portion includes a phase shifter. The phase shifter is provided over a substrate included in the display panel.

In the above embodiment, a transistor in the phase demodulation portion is a silicon transistor.

One embodiment of the present invention is the display device according to the above embodiment further including an FPC. The high-frequency signal is input to the phase demodulation portion through the FPC.

In the above embodiment, the FPC has a stripline structure or a microstripline structure.

In the above embodiment, the FPC has a coplanar line structure.

In the above embodiment, the high-frequency signal is phase-shift keying modulated.

One embodiment of the present invention is the display device according to the above embodiment in which the controller includes a source driver and the display panel includes a reflective element and a light-emitting element. The source driver is configured to generate a first data signal and a second data signal on the basis of the image data extracted by the phase demodulation portion. The reflective element performs display in accordance with the first data signal and the light-emitting element performs display in accordance with the second data signal.

In the above embodiment, the reflective element is a liquid crystal element and the light-emitting element is an organic EL element.

In the above embodiment, the display panel includes a transistor including a metal oxide in its channel formation region.

One embodiment of the present invention is a method for manufacturing a semiconductor device including a phase modulation portion, an FPC, a phase demodulation portion, a controller, and a display panel. Image data is input to the phase modulation portion. The phase modulation portion generates a high-frequency signal including the image data, and transmits the high-frequency signal to the phase demodulation portion through the FPC. The phase demodulation portion demodulates the high-frequency signal and extracts the image data. The controller makes the display panel display an image on the basis of the image data extracted by the phase demodulation portion. A transistor in a pixel of the display panel and a transistor in the phase demodulation portion are formed through the same process.

One embodiment of the present invention is a method for manufacturing a display device including a display panel, a controller, and a phase demodulation portion. A high-frequency signal including image data is input to the phase demodulation portion. The phase demodulation portion demodulates the high-frequency signal and extracts the image data. The controller makes the display panel display an image on the basis of the image data extracted by the phase demodulation portion. A transistor in a pixel of the display panel and a transistor in the phase demodulation portion are formed through the same process.

One embodiment of the present invention is a semiconductor device including a phase modulation portion, an FPC, a phase demodulation portion, a controller, and a display panel. The phase modulation portion includes a phase regulating portion that is configured to adjust a signal phase in accordance with an electric signal. Image data is input to the phase modulation portion. The phase modulation portion generates a high-frequency signal including the image data, and the phase regulating portion adjusts the phase of the high-frequency signal in accordance with the characteristics of the FPC. The phase modulation portion transmits the high-frequency signal adjusted by the phase regulating portion to the phase demodulation portion through the FPC. The phase demodulation portion demodulates the high-frequency signal and extracts the image data. The controller makes the display panel display an image on the basis of the image data extracted by the phase demodulation portion.

One embodiment of the present invention is the semiconductor device according to the above embodiment in which the phase regulating portion includes one or more phase shifters.

One embodiment of the present invention is the semiconductor device according to the above embodiment in which the phase demodulation portion includes a phase shifter. The phase shifter is provided over a substrate included in the display panel.

In the above embodiment, the phase regulating portion includes a transistor including a metal oxide in its channel formation region.

In the above embodiment, the FPC has a stripline structure or a microstripline structure.

In the above embodiment, the FPC has a coplanar line structure.

In the above embodiment, the phase modulation portion performs phase-shift keying.

In the above embodiment, the display panel includes a transistor including a metal oxide in its channel formation region.

One embodiment of the present invention is a method for manufacturing a semiconductor device including a phase modulation portion, an FPC, a phase demodulation portion, a controller, and a display panel. The phase modulation portion includes a phase regulating portion that is configured to adjust a signal phase in accordance with an electric signal. Image data is input to the phase modulation portion. The phase modulation portion generates a high-frequency signal including the image data, and the phase regulating portion adjusts a phase of the high-frequency signal in accordance with the characteristics of the FPC. The phase modulation portion transmits the high-frequency signal adjusted by the phase regulating portion to the phase demodulation portion through the FPC. The phase demodulation portion demodulates the high-frequency signal and extracts the image data. The controller makes the display panel display an image on the basis of the image data extracted by the phase demodulation portion. A transistor in a pixel of the display panel and a transistor in the phase demodulation portion are formed through the same process.

According to one embodiment of the present invention, a novel semiconductor device can be provided. A novel semiconductor device with high data transmission capacity can be provided. A novel semiconductor device that has high data transmission capacity with a small number of wirings can be provided. According to one embodiment of the present invention, a novel display device can be provided.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF THE DRAWINGS

FIGS. 11A1, 11A2, and 11B are top views and a cross-sectional view illustrating an example of a pixel.

FIGS. 12A1, 12A2, and 12B are top views and a cross-sectional view illustrating an example of a pixel.

FIGS. 20A and 20B are TEM images of samples and FIGS. 20C to 20L are electron diffraction patterns thereof.

FIG. 21A to 21C show EDX mapping images of a sample.

DETAILED DESCRIPTION OF THE INVENTION

Figure 1A:
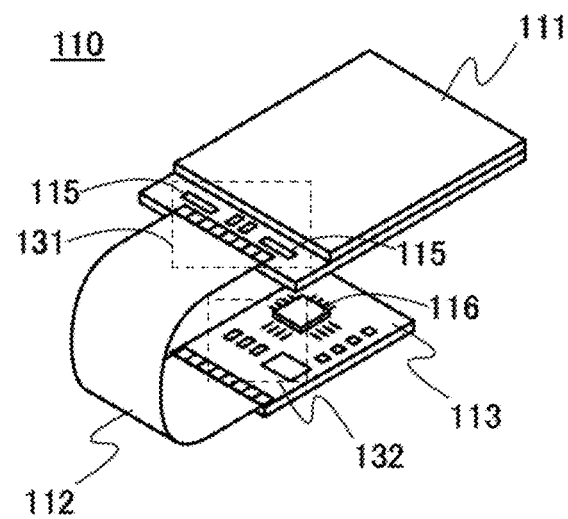
FIG. 1A is a perspective view illustrating a structure example of a semiconductor device.

Hereinafter, embodiments will be described with reference to drawings. Note that the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Any of the embodiments described below can be combined as appropriate.

A semiconductor device described in embodiments below includes a phase modulation portion, a flexible printed circuit (FPC), a phase demodulation portion, a controller IC, a display panel, and the like. Therefore, the semiconductor device is also referred to as a display device, an electronic device, or the like in some cases.

In the drawings, the size, the layer thickness, the region, or the like is sometimes exaggerated for clarity, and thus is not limited to the illustrated scale. Note that the drawings are schematic views showing ideal examples, and embodiments of the present invention are not limited to the shapes or values shown in the drawings.

In the drawings and the like, the same elements, elements having similar functions, elements formed of the same material, elements formed at the same time, and the like are sometimes denoted by the same reference numerals, and the description thereof is not repeated in some cases.

In this specification and the like, the terms "film" and "layer" can be interchanged with each other depending on the case or circumstances. For example, the term "conductive layer" can be changed into the term "conductive film" in some cases. In addition, the term "insulating film" can be changed into the term "insulating layer" in some cases.

Note that in this specification and the like, the terms for describing arrangement such as "over" and "under" do not necessarily mean "directly on" and "directly beneath", respectively, in the description of a physical relationship between components. For example, the expression "a gate electrode over a gate insulating layer" does not exclude the case where there is an additional component between the gate insulating layer and the gate electrode.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, ordinal numbers, such as "first", "second", and "third", are used in order to avoid confusion among components, and the terms do not limit the number of components.

In this specification and the like, the term "electrically connected" includes the case where components are connected through an object having any electric function. There is no particular limitation on the "object having any electric function" as long as electric signals can be transmitted and received between components that are connected through the object. Examples of the "object having any electric function" include an electrode, a wiring, a switching element such as a transistor, a resistor, an inductor, a capacitor, and an element with a variety of functions.

In this specification and the like, the term "voltage" often refers to a potential difference between a given potential and a reference potential (e.g., a ground potential). Therefore, the words "voltage" and "potential difference" can be replaced with each other.

In this specification and the like, a transistor is an element having at least three terminals: a gate, a drain, and a source. The transistor has a channel region between a drain (a drain terminal, a drain region, or a drain electrode) and a source (a source terminal, a source region, or a source electrode), and current can flow between the source and the drain through the channel region. Note that in this specification and the like, a channel region refers to a region through which current mainly flows.

Furthermore, functions of a source and a drain might be switched when a transistor of opposite polarity is employed or a direction of current flow is changed in circuit operation, for example. Therefore, the terms "source" and "drain" can be switched in this specification and the like.

Unless otherwise specified, off-state current in this specification and the like refers to drain current of a transistor in an off state (also referred to as a non-conducting state and a cutoff state). Unless otherwise specified, the off state of an n-channel transistor means that a gate voltage with respect to a source voltage ($V_{gs}$) is lower than the threshold voltage (Vth), and the off state of a p-channel transistor means that $V_{gs}$ is higher than Vth. That is, the off-state current of an n-channel transistor sometimes refers to a drain current that flows when the gate voltage $V_{gs}$ with respect to the source voltage is lower than the threshold voltage Vth.

In the above description of off-state current, a drain may be replaced with a source. That is, the off-state current sometimes refers to current that flows through a source of a transistor in the off state.

In this specification and the like, the term "leakage current" sometimes expresses the same meaning as "off-state current". In this specification and the like, the off-state current sometimes refers to a current that flows between a source and a drain when a transistor is off.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is to say, a metal oxide that has at least one of an amplifying function, a rectifying function, and a switching function can be called a metal oxide semiconductor, or OS for short. An OS transistor or an OS FET refers to a transistor including a metal oxide or an oxide semiconductor.

Embodiment 1

This embodiment will describe a semiconductor device including a phase modulation portion, an FPC, a phase demodulation portion, a controller IC, and a display panel.

Figure 1B:
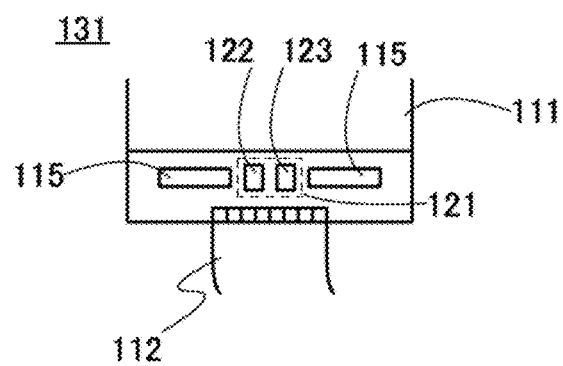
FIG. 1B is a top view illustrating a structure around a region 131.

FIG. 1A is a perspective view illustrating a structural example of a semiconductor device 110. FIG. 1B is a top view illustrating a structure around a region 131, and FIG. 1C is a top view illustrating a structure around a region 132.

Figure 1C:
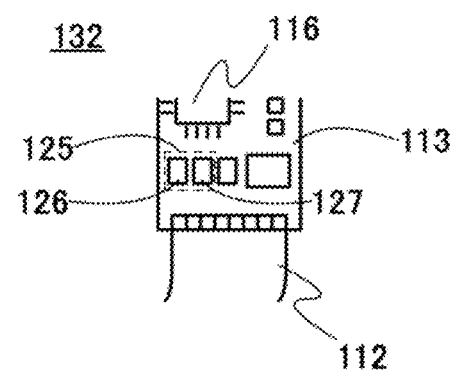
FIG. 1C is a top view illustrating a structure around a region 132.

The semiconductor device 110 shown in FIGS. 1A to 1C includes a display panel 111, an FPC 112, a substrate 113, a controller IC 115, a phase demodulation portion 121, a phase modulation portion 125, and a CPU 116.

The CPU 116 in an electronic device such as a mobile phone or a laptop PC has a function of processing information and generating image data. The function of generating image data is not necessarily unique to the CPU, and a graphics processing unit (GPU) may generate image data, for example. What generates image data changes depending on electronic devices; thus, the CPU 116 is sometimes referred to as a host in this specification and the like.

The CPU 116 and the phase modulation portion 125 are over the substrate 113, and the FPC 112 electrically connects the display panel 111 to the substrate 113. The phase demodulation portion 121 and the controller IC 115 are over a substrate for the display panel 111.

In the example of FIGS. 1A and 1B, the phase demodulation portion 121 and the controller IC 115 are mounted by a chip on glass (COG) method; however, there is no particular limitation on the mounting method. A chip on flexible (COF) method, a tape automated bonding (TAB) method, or the like may be employed.

The phase demodulation portion 121 includes a phase shifter 122 and a demodulator 123. The phase modulation portion 125 includes a phase shifter 126 and a modulator 127. The phase shifter 122 and the demodulator 123 can be provided in the same chip; however, as described below, the phase shifter 122 requires the line length as long as one fourth of an effective wavelength, increasing the chip size of the demodulator 123. In the example of FIGS. 1A and 1B, the phase shifter 122 is provided separately from the demodulator 123. The phase shifter 126 and the modulator 127 have a similar relationship.

The phase shifter 122 can be formed through the process for forming pixels and the like of the display panel 111. That is, the phase shifter 122 and the pixels and the like of the display panel 111 can be collectively formed over the same substrate.

<<Image Data>>

Figure 2:
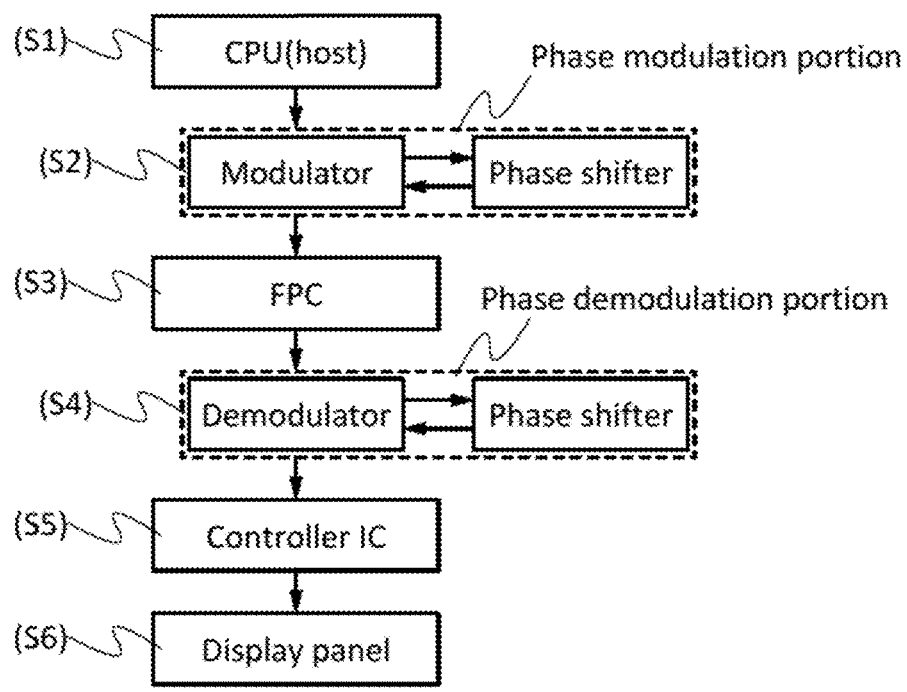
FIG. 2 illustrates the flow of image data.

FIG. 2 illustrates the flow of image data.

The CPU 116 generates image data (step S1), and the phase modulation portion 125 mixes the image data with a carrier wave to generate a high-frequency signal (step S2). The phase modulation portion 125 generates a 90-degree phase-shifted signal with the use of the phase shifter 126. In this embodiment, the image data is a digital signal and the carrier wave is an analog high-frequency signal.

The high-frequency signal generated in the step S2 is transmitted through the FPC 112 to the phase demodulation portion 121 (step S3). The phase demodulation portion 121 extracts the image data from the high-frequency signal (step S4). The controller IC 115 processes the extracted image data as necessary and supplies it to the display panel 111 with a timing signal and the like (step S5).

The display panel 111 receives the signals from the controller IC 115 and displays an image (step S6).

If necessary, a serializer may be provided between the CPU 116 and the phase modulation portion 125. The serializer can perform serial conversion on the image data output from the CPU 116 and input the converted data to the phase modulation portion 125. In that case, a deserializer is provided between the phase demodulation portion 121 and the controller IC 115.

<<Phase Modulation Portion>>

Figure 3A:
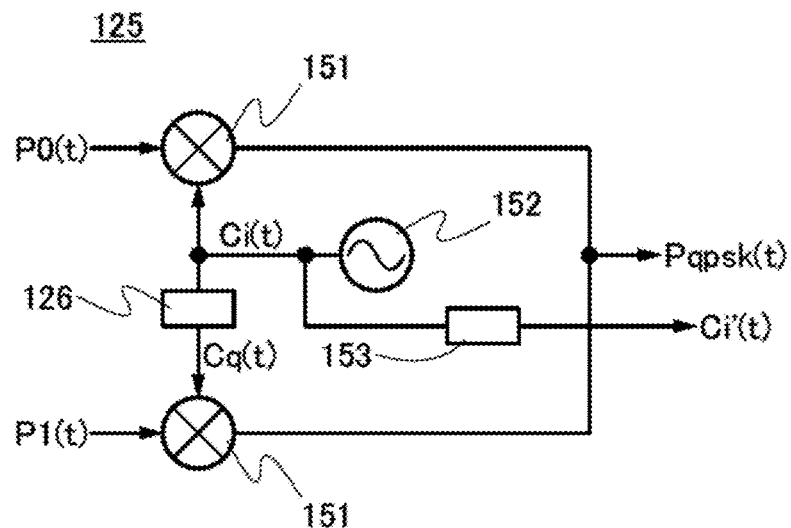
FIG. 3A is a circuit diagram illustrating a structure example of a phase modulation portion.

FIG. 3A is a circuit diagram illustrating a structure example of the phase modulation portion 125.

The phase modulation portion changes part of the characteristics of a carrier wave generated by an oscillator, in accordance with an input signal. In particular, when the input signal is a digital signal, a technique called phase-shift keying, which shifts the phase of a carrier wave, is available. The phase modulation portion 125 shown in FIG. 3A as an example utilizes a technique called quadrature phase-shift keying (QPSK), which is a type of phase-shift keying and uses four phases.

The phase modulation portion 125 includes mixers 151, an oscillator 152, the phase shifter 126, and a phase regulating portion 153. The phase modulation portion 125 uses four phases and can superimpose a 2-bit digital signal on a carrier wave. In the drawing, P0($t$) and P1($t$) denote digital signals input to the phase modulation portion 125.

The oscillator 152 generates a carrier wave Ci(t). The phase shifter 126 generates a carrier wave Cq(t) delayed by a phase of 90 degrees from the carrier wave Ci(t). The carrier waves Ci(t) and Cq(t) are mixed with the digital signals P0($t$) and P1($t$), respectively, by the mixers 151. The obtained results are summed up, and a high-frequency signal Pqpsk(t) is generated and output from the phase modulation portion 125. The phase regulating portion 153 generates a carrier wave Ci'(t) by fine tuning of the phase of the carrier wave Ci(t), and the carrier wave Ci'(t) is output from the phase modulation portion 125.

Figure 3B:
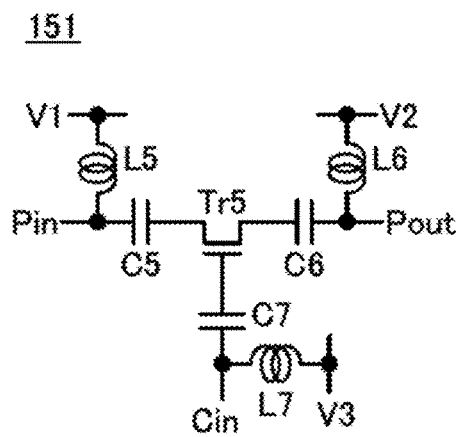
FIG. 3B is a circuit diagram illustrating a structure example of a mixer.

FIG. 3B is a circuit diagram illustrating a structure example of the mixer 151.

The mixer 151 in FIG. 3B includes a transistor Tr5, capacitors C5 to C7, and inductors L5 to L7.

In the mixer 151, a digital signal is input to Pin, a carrier wave is input to Cin, and a generated high-frequency signal is output from Pout. Constant potentials input to V1 to V3 are input to L5 to L7, respectively. A combination of C5 and L5, a combination of C6 and L6, and a combination of C7 and L7 each form a matching circuit.

The mixer 151 in FIG. 3B has a minimum function as a mixer; however, a single balanced mixer or a double balanced mixer, which has a wide applicable frequency range and high resistance to noise, may be used, for example.

Figure 3C:
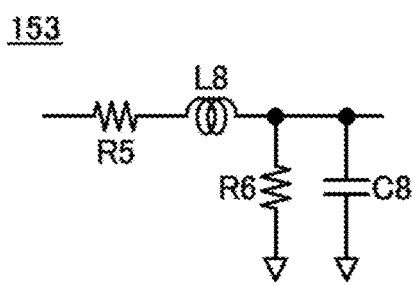
FIG. 3C is a circuit diagram illustrating a structure example of a phase regulating portion.

FIG. 3C is a circuit diagram illustrating a structure example of the phase regulating portion 153.

The phase regulating portion 153 in FIG. 3C includes resistors R5 and R6, a capacitor C8, and an inductor L8.

The phase regulating portion 153 has a function of fine tuning of a phase in accordance with the transmission characteristics of the FPC 112 or the like.

Another structure example of the phase regulating portion 153 is described later.

Although the phase modulation portion 125 in this example utilizes the QPSK technique, it may utilize a technique called quadrature amplitude modulation (QAM) that changes not only the phase of a carrier wave but also the amplitude. The QAM technique is superior to QPSK in data transmission capacity; however, a high-frequency signal decays in the FPC 112 in QAM. In light of stable data transmission, QPSK is preferred to QAM.

<<Phase Shifter>>

Figure 4A:
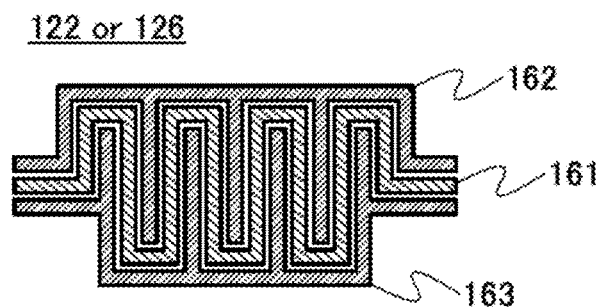
FIG. 4A is a layout illustrating a structure example of a phase shifter.

FIG. 4A is a layout illustrating a structure example of a phase shifter.

In this specification and the like, the phase modulation portion 125 includes the phase shifter 126, and the phase demodulation portion 121 includes the phase shifter 122. The phase shifters 126 and 122 can each be formed with a line shown in FIG. 4A.

The line in FIG. 4A includes wirings 161, 162, and 163. The wirings 162 and 163 are GND and the wiring 161 transmits the carrier wave Ci(t). When the line length of the wiring 161 is one fourth of the effective wavelength of the carrier wave Ci(t), the phase of the wave can be delayed by 90 degrees. For example, the carrier wave Ci(t) of 10 GHz has a wavelength of 30 mm in a vacuum, which is obtained by dividing a light speed of $3.0 \times 10^8$ m/s by $10 \times 10^9$ Hz. The effective wavelength is approximate to a value obtained by multiplying the wavelength in a vacuum by the inverse of the square root of the effective dielectric constant, and is thus smaller than 30 mm. When the phase shifters 126 and 122 have different wiring structures and different effective dielectric constants, they have different line lengths.

<<FPC>>

Figure 4B:
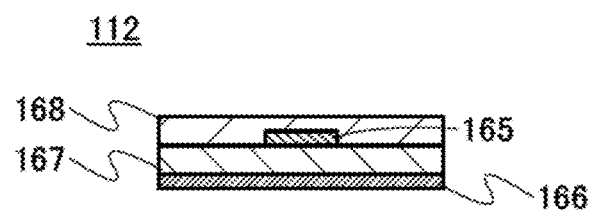
FIGS. 4B, 4C, and 4D are cross-sectional views each illustrating a structure example of an FPC.
Figure 4C:
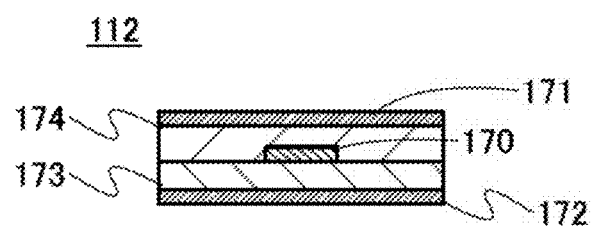
Figure 4D:
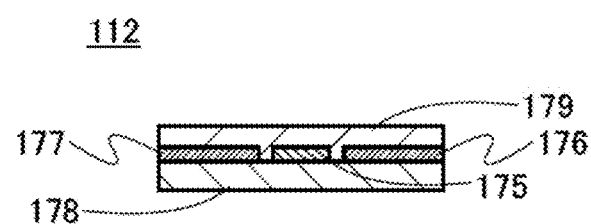

FIGS. 4B to 4D are cross-sectional views each illustrating a structure example of the FPC 112.

The FPC 112 electrically connects the phase modulation portion 125 over the substrate 113 to the phase demodulation portion 121 over the display panel 111. The FPC 112 preferably has a structure determined in consideration of the transmission characteristics of a high-frequency signal. The structure determined in consideration of the transmission characteristics of a high-frequency signal is, for example, a microstripline structure, a stripline structure, or a coplanar line structure.

FIG. 4B shows an example where the FPC 112 has a microstripline structure. The FPC 112 in FIG. 4B includes wirings 165 and 166 and dielectrics 167 and 168. The wiring 166 is GND and sufficiently wide as compared with the wiring 165. The dielectric 167 is between the wiring 165 and the wiring 166, and the dielectric 168 is over the wiring 165. The wiring 166 may be a meshed wiring.

The microstripline structure has a good balance between the cost and performance and can be designed easily, as compared with the stripline structure. The microstripline structure can be combined with the coplanar line structure described later.

FIG. 4C shows an example where the FPC 112 has a stripline structure. The FPC 112 in FIG. 4C includes wirings 170, 171 and 172 and dielectrics 173 and 174. The wirings 171 and 172 are GND and sufficiently wide as compared with the wiring 170. The dielectric 173 is between the wiring 170 and the wiring 172, and the dielectric 174 is between the wiring 171 and the wiring 170. The wirings 171 and 172 may each be a meshed wiring.

The stripline structure has excellent high-frequency signal transmission characteristics as compared with the microstripline structure and the coplanar line structure. The stripline structure also can be combined with the coplanar line structure described later.

FIG. 4D shows an example where the FPC 112 has a coplanar line structure. The FPC 112 in FIG. 4D includes wirings 175, 176 and 177 and dielectrics 178 and 179. The wirings 176 and 177 are GND. The wirings 175, 176, and 177 are over the dielectric 178, and the dielectric 179 is over the wirings 175, 176, and 177.

The coplanar line structure can have a small number of layers of wirings and dielectrics as compared with the microstripline structure and the stripline structure.

In the cross-sectional views of FIGS. 4B to 4D, a base, a protective film, and the like are not illustrated.

<<Phase Regulating Portion>>

Figure 5:
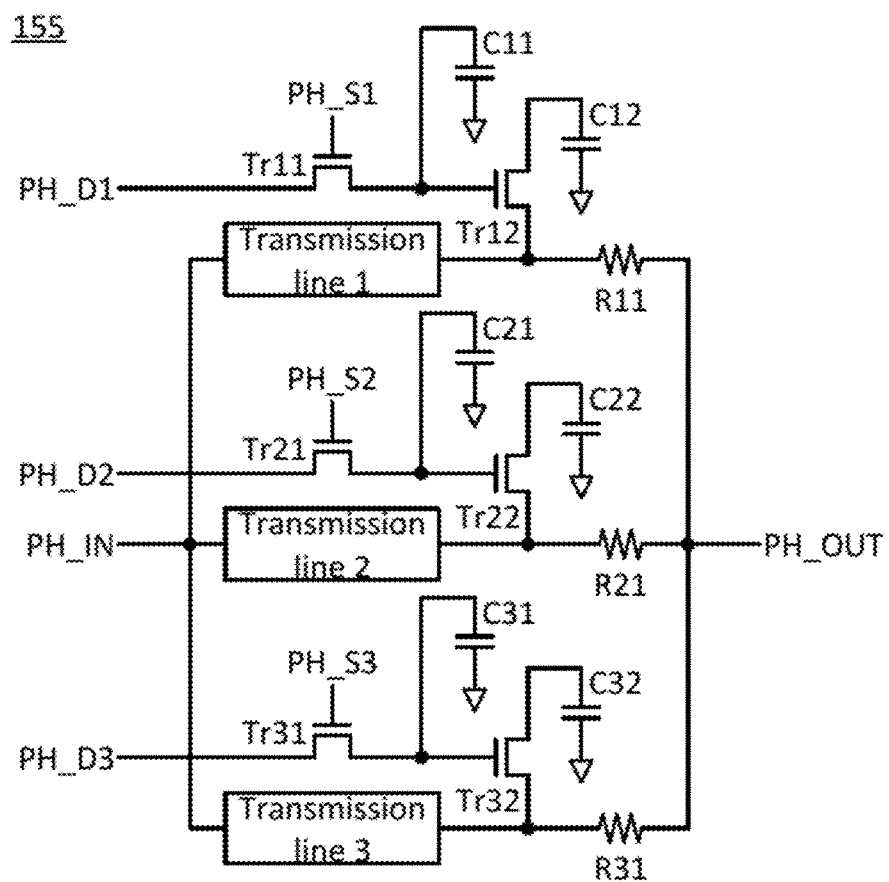
FIG. 5 is a circuit diagram illustrating a structure example of a phase regulating portion.

FIG. 5 is a circuit diagram illustrating another structure example of the phase regulating portion 153.

A phase regulating portion 155 in FIG. 5 includes transmission lines 1 to 3, transistors Tr11, Tr12, Tr21, Tr22, Tr31, and Tr32, capacitors C11, C12, C21, C22, C31, and C32, and resistors R11, R21, and R31.

A high-frequency signal PH_IN, control data PH_D1 to PH_D3, and control signals PH_S1 to PH_S3 are input to the phase regulating portion 155. The phase regulating portion 155 changes and adjusts the phase of the high-frequency signal PH_IN in accordance with the transmission characteristics of the FPC 112 or the like. The control data PH_D1 to PH_D3 control the amount of change in the phase of the high-frequency signal PH_IN by the phase regulating portion 155. The control signals PH_S1 to PH_S3 control the timings of loading the control data PH_D1 to PH_D3, respectively. The phase regulating portion 155 outputs a phase-adjusted high-frequency signal PH_OUT.

For the transmission lines 1 to 3 of the phase regulating portion 155, the phase shifter shown in FIG. 4A can be used, for example. The transmission lines 1 to 3 change the phase of the high-frequency signal PH_IN by different amounts. For example, the transmission lines 1 to 3 can be designed such that the transmission line 1 delays the phase by 90 degrees, the transmission line 2 delays the phase by 180 degrees, and the transmission line 3 delays the phase by 270 degrees.

The transistor Tr12 defines the proportion of transmission of the 90-degree phase-delayed high-frequency signal PH_IN, the transistor Tr22 defines the proportion of transmission of the 180-degree phase-delayed high-frequency signal PH_IN, and the transistor Tr32 defines the proportion of transmission of the 270-degree phase-delayed high-frequency signal PH_IN.

Figure 6A:
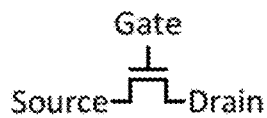
FIG. 6A is a circuit diagram of a transistor.
Figure 6B:
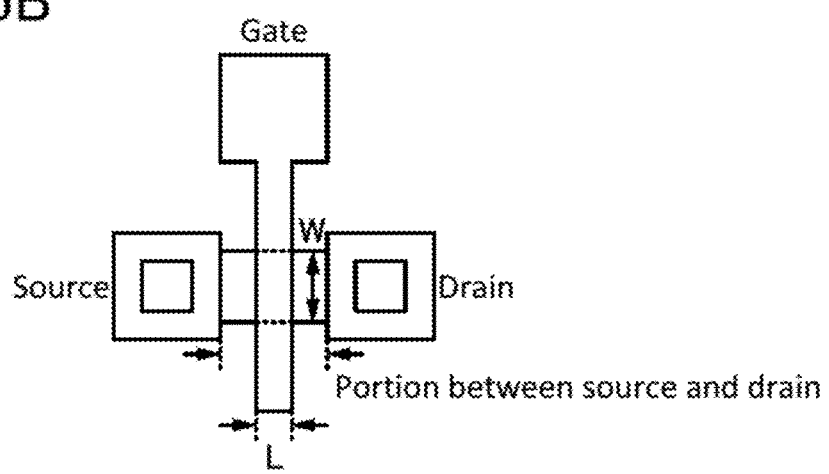
FIG. 6B is a layout of a transistor.
Figure 6C:
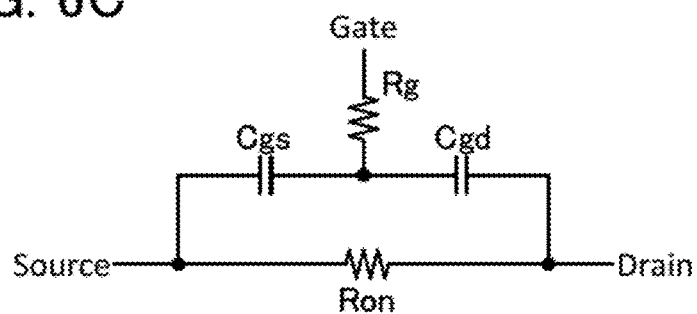
FIGS. 6C and 6D are each a small-signal equivalent circuit of a transistor.
Figure 6D:
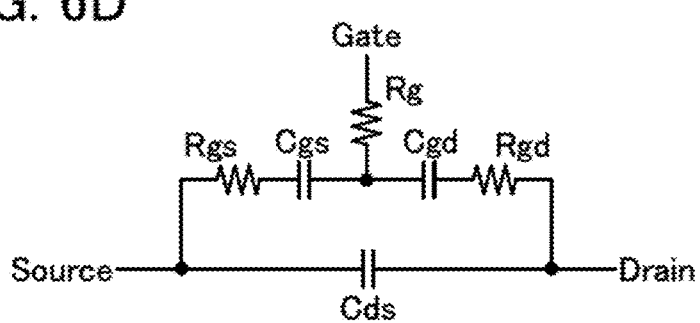

FIGS. 6A to 6D are a circuit diagram, a layout, and small-signal equivalent circuits of a transistor that is used for the transistors Tr12, Tr22, and Tr32. FIG. 6A is the circuit diagram, FIG. 6B is the layout, FIG. 6C is the small-signal equivalent circuit of the on-state transistor, and FIG. 6D is the small-signal equivalent circuit of the off-state transistor.

The transistor includes three terminals of a gate, a drain, and a source (see FIG. 6A). As shown in FIG. 6B, the transistor has a channel region between the drain and the source. The width of the channel region is referred to as W, and the width of the gate in a region where the gate overlaps with the channel region is referred to as L. In the small-signal equivalent circuit of the on-state transistor, a portion between the drain and the source is simply represented as a resistor Ron, and a capacitor Cgs (capacitance between the gate and the source) and a capacitor Cgd (capacitance between the gate and the drain) are electrically connected to the gate through a resistor Rg (see FIG. 6C). In the small-signal equivalent circuit of the off-state transistor, the portion between the source and the drain is represented as a capacitor Cds. In addition, the capacitor Cgs and a resistor Rgs are electrically connected to the gate through the resistor Rg, and the capacitor Cgd and a resistor Rgd are electrically connected to the gate through the resistor Rg (see FIG. 6D).

The case where the transistor Tr12 is on and the transistors Tr22 and Tr32 are off will be described below. The on-resistance between the drain and the source of the transistor Tr12 is represented by Ron, and capacitance between the drain and the source of each of the transistors Tr22 and Tr32 is represented by the capacitor Cds. The capacitor Cds has a reactance component that depends on frequency, and the impedance of the capacitor Cds is $1/j\omega Cds$ (j is an imaginary unit and $\omega$ is an angular frequency).

The greater value of $\omega$ (i.e., the higher signal frequency) leads to the smaller absolute value of the impedance of the capacitor Cds, and the transistor Tr22 and the capacitor C22, and the transistor Tr32 and the capacitor C32 release the high-frequency signals to the ground.

As a result, the high-frequency signal PH_OUT output from the phase regulating portion 155 include few components delayed from the high-frequency signal PH_IN by a phase of 180 degrees and 270 degrees, and is close to a signal delayed by a phase of 90 degrees from the high-frequency signal PH_IN.

Changing the on/off states of the transistors Tr12, Tr22, and Tr32 also enables the high-frequency signal PH_OUT to be close to a signal delayed by a phase of 180 degrees from the high-frequency signal PH_IN or a signal delayed by a phase of 270 degrees from the high-frequency signal PH_IN. That is, changing the on/off states of the transistors Tr12, Tr22, and Tr32 enables the high-frequency signal PH_OUT to be a signal delayed in the range of 90 degrees to 270 degrees from the high-frequency signal PH_IN.

In this way, the phase regulating portion 155 can change and adjust the phase of the input high-frequency signal PH_IN in accordance with the transmission characteristics of the FPC 112 or the like. The phase regulating portion 155 may be provided in the phase demodulation portion 121 and adjust the phase of a high-frequency signal transmitted through the FPC 112.

The transistor Tr11 takes in the control data PH_D1 in accordance with the control signal PH_S1, the transistor Tr21 takes in the control data PH_D2 in accordance with the control signal PH_S2, and the transistor Tr31 takes in the control data PH_D3 in accordance with the control signal PH_S3. Each of the transistors Tr11, Tr21, and Tr31 is preferably a transistor with a low off-state current. When each of the transistors Tr11, Tr21, and Tr31 has a low off-state current, the taken control data PH_D1 to PH_D3 can be retained for a long time. For example, as a transistor with a low off-state current, an OS transistor described later can be used.

<<Phase Demodulation Portion>>

Figure 7A:
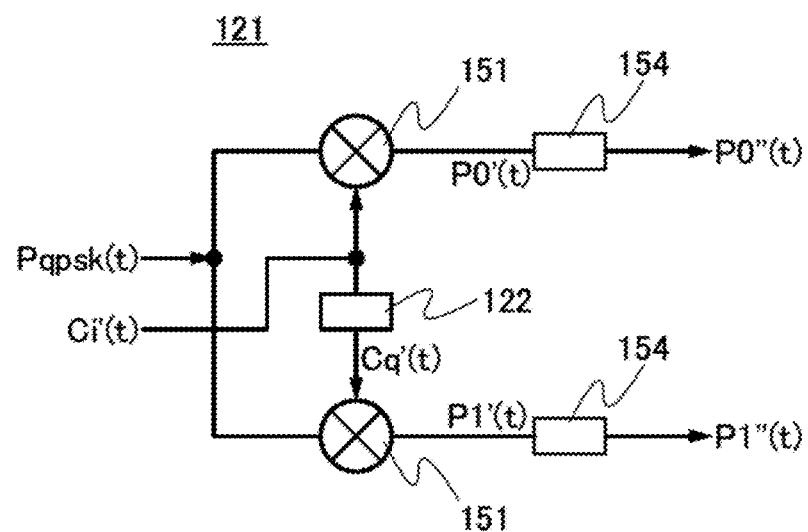
FIG. 7A is a circuit diagram illustrating a structure example of a phase demodulation portion.

FIG. 7A is a circuit diagram illustrating a structure example of the phase demodulation portion 121.

The phase demodulation portion 121 includes the mixers 151, the phase shifter 122, and low pass filters (LPFs) 154. The phase demodulation portion 121 has a function of extracting the 2-bit digital signals P0(t) and P1(t) from the high-frequency signal Pqpsk(t) output from the phase modulation portion 125.

The high-frequency signal Pqpsk(t) and the carrier wave Ci'(t) are input to the phase demodulation portion 121. The phase shifter 122 generates a carrier wave Cq'(t) delayed by a phase of 90 degrees from the carrier wave Ci'(t). The mixers 151 mixes the carrier waves Ci'(t) and Cq'(t) with the high-frequency signal Pqpsk(t). Resulting signals P0'(t) and P1'(t) are input to the LPFs 154 and their high-frequency components are removed, whereby signals P0"(t) and P1"(t) which are the same as the digital signals P0(t) and P1(t) except for the amplitude are obtained. This is explained with formulae below.

The 2-bit digital signals P0(t) and P1(t) are represented as follows.

$$P0(t)=\text{Cos}\{\pi m_0(t)\} \quad (a1)$$

$$P1(t)=\text{Cos}\{\pi m_1(t)\} \quad (a2)$$

The carrier waves Ci(t) and Cq(t) are represented as follows.

$$Ci(t) = A_c \text{Cos}\{\omega_c t + \varphi_c\} \quad (a3)$$

$$Cq(t) = A_c \text{Cos}\{\omega_c t + \varphi_c - \pi/2\} \quad (a4)$$
$$= A_c \text{Sin}\{\omega c t + \varphi_c\}$$

In that case, Pqpsk satisfies the following equation.

$$\text{Pqpsk}(t)=P0(t)\times Ci(t)+P1(t)\times Cq(t) \quad (a5)$$

Next, α, Ci'(t), and Cq'(t) are assumed to satisfy the following equations.

$$\alpha=\omega_c t+\varphi_c \quad (a6)$$

$$Ci'(t)\approx Ci(t) \quad (a7)$$

$$Cq'(t)\approx Cq(t) \quad (a8)$$

This leads to the following formula.

$$P0'(t) = Ci'(t)\{P0(t) \times Ci(t) + P1(t) \times Cq(t)\} \quad (a9)$$
$$= A_c^2 \{P0(t) \times \text{Cos}^2(\alpha) + P1(t) \times \text{Sin}(\alpha)\text{Cos}(\alpha)\}$$
$$= A_c^2/2 \times P0(t) + A_c^2/2 \times \{P0(t) \times \text{Cos}(2\alpha) + P1(t) \times \text{Sin}(2\alpha)\}$$

The formula (a9) represents the sum of a signal obtained by changing the amplitude of the digital signal P0(t) and a harmonic having a frequency twice as high as the carrier waves Ci(t) and Cq(t). When the harmonic component is removed by the LPF 154, the following P0"(t) is obtained.

$$P0"(t)=A_c^2/2\times P0(t) \quad (a10)$$

Similarly, P1'(t) is calculated as follows.

$$P1'(t) = Cq'(t)\{P0(t) \times Ci(t) + P1(t) \times Cq(t)\} \quad (a11)$$
$$= A_c^2 \{P0(t) \times \text{Sin}(\alpha)\text{Cos}(\alpha) + P1(t) \times \text{Sin}^2(\alpha)\}$$
$$= A_c^2/2 \times P1(t) + A_c^2/2 \times \{P0(t) \times \text{Sin}(2\alpha) + P1(t) \times \text{Cos}(2\alpha)\}$$

The formula (a11) represents the sum of the digital signal P1(t) having the changed amplitude and a harmonic having a frequency twice as high as the carrier waves Ci(t) and Cq(t). When the harmonic component is removed by the LPF 154, the following P1"(t) is obtained.

$$P1"(t)=A_c^2/2\times P1(t) \quad (a12)$$

In this way, the phase demodulation portion 121 outputs the signals P0"(t) and P1"(t) whose amplitudes are respectively $A_c^2/2$ times as large as those of the digital signals P0(t) and P1(t).

Figure 7B:
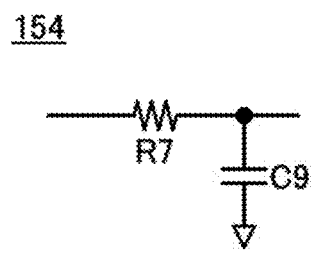
FIG. 7B is a circuit diagram illustrating a structure example of an LPF.

FIG. 7B is a circuit diagram illustrating a structure example of the LPF 154.

The LPF 154 in FIG. 7B includes a resistor R7 and a capacitor C9.

A harmonic having a frequency twice as high as the carrier wave Ci(t) or Cq(t) included in the signals P0'(t) and P1'(t) has a frequency range apart from that of the digital signal P0(t) or P1(t). Accordingly, the LPF 154 can remove the harmonic component relatively easily.

As described above, a digital signal can be transmitted by changing part of the characteristics of a carrier wave. Here, the carrier wave has a higher frequency than the digital signal, and thus a high transmission speed can be expected as compared with the case of transmitting the digital signal just as it is. The higher transmission speed enables serial conversion of the digital signal with the use of a serializer and can decrease the number of wirings required for transmission.

A transmission speed required for transmitting full high-definition image data (information volume per second) is approximately 2.24 Gbps at a frame frequency of 60 Hz and a color depth of 12 bits, for example. When full high-definition image data is transmitted with LVDS, 12 pairs of wirings (24 wirings) are necessary. On the other hand, Non-Patent Document 1 reports that the transmission in wireless communication at 60 GHz with the modulation method of QPSK achieves 3.1 Gbps. The use of the semiconductor device of one embodiment of the present invention can reduce the number of wirings required for transmission.

A transistor used in the phase modulation portion and the phase demodulation portion can be a silicon transistor. The development of semiconductor process technology allows a silicon transistor to deal with, for example, a signal over 5 GHz, in place of an expensive composite semiconductor. Non-Patent Document 1 reports the achievement of 60 GHz wireless communication with the use of Si-CMOS technology.

When the controller IC 115 is manufactured with a relatively new process rule, the controller IC 115 can include the phase demodulation portion. Here, the "relatively new process rule" means a 130-nm process, preferably a 90-nm process, or still preferably a process newer than the 65-nm process.

A transistor in the phase demodulation portion 121 may be formed with the same semiconductor material as that in a transistor in the pixel of the display panel 111 and the like. That is, the transistor in the phase demodulation portion 121 may be formed through the same step as the transistor in the pixel of the display panel 111 and the like. This simplifies the manufacturing process of the semiconductor device 110.

<<Controller IC>>

Figure 8:
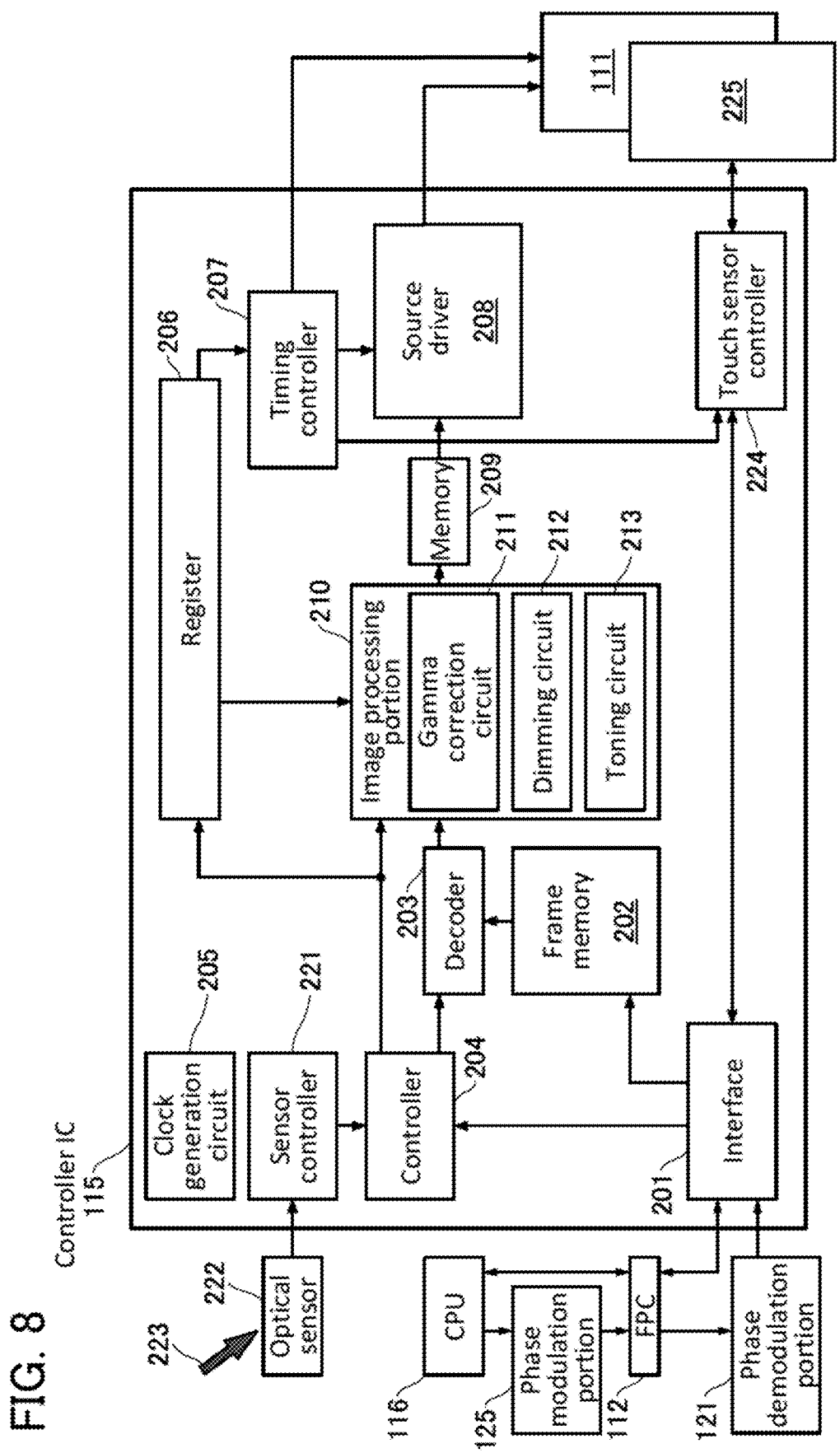
FIG. 8 is a block diagram illustrating a structure example of a controller IC.
Figure 9:
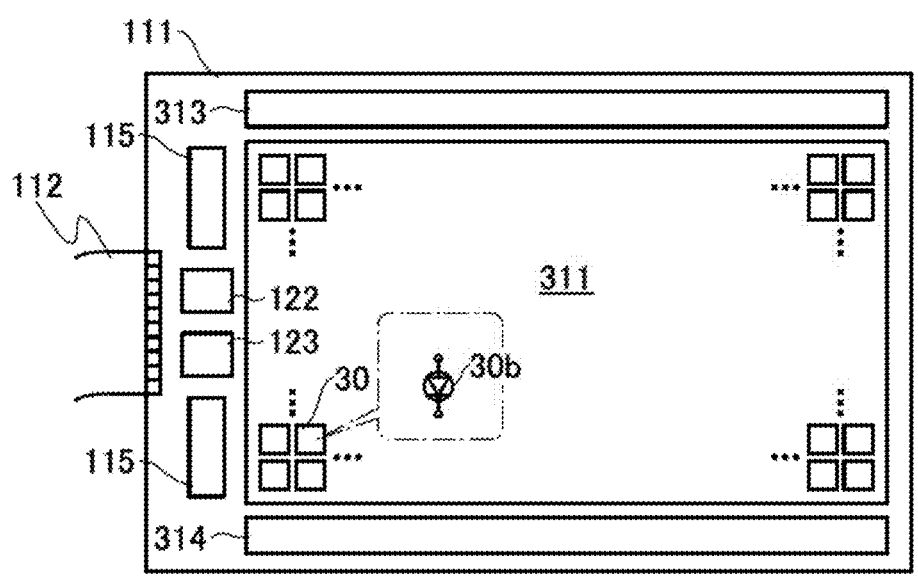
FIG. 9 is a block diagram illustrating a structure example of a display panel.

FIG. 8 is a block diagram illustrating a structure example of the controller IC 115. FIG. 9 is a block diagram illustrating a structure example of the display panel 111.

The controller IC 115 includes an interface 201, a frame memory 202, a decoder 203, a controller 204, a clock generation circuit 205, a register 206, a timing controller 207, an image processing portion 210, a memory 209, and a source driver 208.

The display panel 111 includes a pixel array 311, a gate driver 313, a gate driver 314, the controller IC 115, the phase shifter 122, the demodulator 123, and the FPC 112. Note that either the gate driver 313 or the gate driver 314 is not necessarily provided.

The controller IC 115 communicates with the CPU 116 through the interface 201 of the controller IC 115. The CPU 116 sends image data, control signals, and the like to the controller IC 115 through the phase modulation portion 125, the FPC 112, and the phase demodulation portion 121. Control signals and the like that have a relatively small data amount may be sent to the controller IC 115 through the FPC 112. Signals and the like output from the controller IC 115 is sent to the CPU 116 through the FPC 112.

The frame memory 202 is a memory for storing the image data input to the controller IC 115. In the case where compressed image data is sent from the CPU 116, the frame memory 202 can store the compressed image data. In that case, the decoder 203 decompresses the compressed image data. Alternatively, the decoder 203 may be provided between the frame memory 202 and the interface 201 so that the frame memory 202 can store the decompressed image data.

The image processing portion 210 has a function of performing a variety of image processing on image data. The image processing portion 210 includes a gamma correction circuit 211, a dimming circuit 212, and a toning circuit 213, for example. The image data processed in the image processing portion 210 is output to the source driver 208 through the memory 209. The memory 209 is a memory for temporarily storing the image data. The source driver 208 has a function of processing the input image data and writing the image data to the source line of the pixel array 311.

The clock generation circuit 205 has a function of generating a clock signal used in the controller IC 115. The timing controller 207 has a function of generating a variety of timing signals used in the source driver 208 and the gate drivers 313 and 314 of the display panel 111. Note that a clock signal, a power source line, and the like are not illustrated in FIG. 8.

The register 206 stores data used for the operation of the controller IC 115. The data stored in the register 206 includes a parameter for performing a variety of image processing in the image processing portion 210 and a parameter for generating waveforms of a variety of timing signals in the timing controller 207, for example.

The controller IC 115 may include a touch sensor controller 224. When the display panel 111 is used in combination with a touch sensor unit 225, the touch sensor controller 224 controls the touch sensor unit 225 and outputs obtained information such as a touched position. The information such as a touched position is sent to the CPU 116 through the interface 201 and the like. The touch sensor unit 225 can be of any detection type, for example, a projected capacitive type, a surface capacitive type, a resistive type, an ultrasonic surface acoustic wave type, an optical type, or an electromagnetic induction type.

The controller IC 115 may include a sensor controller 221. The sensor controller 221 electrically connects to an optical sensor 222, and can measure the brightness and color tone of external light 223.

For example, the dimming circuit 212 can adjust the luminance of the display panel 111 in accordance with the measured brightness of the external light 223. In an environment where the brightness of the external light 223 is low, the luminance of the display panel 111 is set low to avoid dazzling display and reduce power consumption. In an environment where the brightness of the external light 223 is high, the luminance of the display panel 111 is set high to display a highly visible image. The adjustment may be made on the basis of the luminance a user has set. Here, the adjustment is referred to as dimming or dimming treatment. In addition, a circuit that performs the dimming treatment is referred to as a dimming circuit.

Furthermore, the toning circuit 213 can correct the color tone of the display panel 111 in accordance with the measured color tone of the external light 223. For example, in an environment with a reddish hue of sunset, the user of the display panel 111 recognizes the reddish hue as white because of chromatic adaptation. In that case, the display of the display panel 111 is seen bluish white. Thus, red (R) is emphasized in the display panel 111 so that the tone can be corrected. Here, the correction is referred to as toning or toning treatment. In addition, a circuit that performs the toning treatment is referred to as a toning circuit.

The image processing portion 210 may include another processing circuit such as an RGB-RGBW conversion circuit, depending on the specifications of the display panel 111. The RGB-RGBW conversion circuit has a function of converting image data of red, green, and blue (RGB) into image data of red, green, blue, and white (RGBW). In that case, the display panel 111 including pixels of four colors of RGBW can reduce power consumption by displaying a white (W) component of the image data using the white (W) pixel. Note that in the case where the display panel 111 includes pixels of four colors of RGBY, an RGB-RGBY (red, green, blue, and yellow) conversion circuit can be used, for example.

Note that which circuits the controller IC 115 has is determined as appropriate depending on the standards of the CPU 116, the specifications of the display panel 111, and the like.

<<Display Panel>>

The pixel array 311 includes a plurality of pixels 30. Each of the pixels 30 is an active element driven by a transistor. The pixel 30 includes a light-emitting element 30b.

The light-emitting element 30b is, for example, an organic electroluminescence (EL) element, an inorganic EL element, a quantum-dot light-emitting diode (QLED), or a light-emitting diode (LED).

The gate drivers 313 and 314 have a function of driving a gate line for selecting the pixel 30. The source driver that drives a source line for supplying a data signal to the pixel 30 is provided in the controller IC 115. The controller IC 115 has a function of overall control on the operation of the display panel 111. The number of controller ICs 115 is determined in accordance with the number of pixels of the pixel array 311.

FIG. 9 illustrates an example in which the gate drivers 313 and 314 and the pixel array 311 are collectively formed over the same substrate; however, the gate drivers 313 and 314 may be dedicated ICs. Alternatively, the gate driver 313 or 314 may be incorporated in the controller IC 115.

Like the gate drivers 313 and 314, the source driver 208 may have any of a variety of structures. In the examples of FIG. 8 and FIG. 9, the source driver 208 is incorporated in the controller IC 115; however, the source driver 208 may be a dedicated IC. Alternatively, the source driver 208 and the pixel array 311 may be collectively formed over the same substrate.

A transistor used for the pixel 30 is an OS transistor, which has a lower off-state current than a Si transistor.

The OS transistor preferably includes a metal oxide in its channel formation region. The metal oxide used for the OS transistor preferably contains at least one of indium (In) and zinc (Zn).

Typical examples of such oxide include In-M-Zn oxide, In-M oxide, Zn-M oxide, and In—Zn oxide (the element M is aluminum (Al), gallium (Ga), yttrium (Y), tin (Sn), boron (B), silicon (Si), titanium (Ti), iron (Fe), nickel (Ni), germanium (Ge), zirconium (Zr), molybdenum (Mo), lanthanum (La), cerium (Ce), neodymium (Nd), vanadium (V), beryllium (Be), hafnium (Hf), tantalum (Ta), or tungsten (W), for example). The off-state current per channel width of 1 μm of an OS transistor can be low and approximately from 1 yA/μm (y: yocto, $10^{-24}$) to 1 zA/μm (z: zepto, $10^{-21}$).

A cloud-aligned composite oxide semiconductor (CAC-OS) is preferably used for an OS transistor. Note that the details of the CAC-OS will be described in Embodiment 3.

The transistor used for the pixel 30 is not necessarily an OS transistor as long as its off-state current is low. For example, a transistor including a wide-bandgap semiconductor may be used. In some cases, the wide-bandgap semiconductor refers to a semiconductor with a bandgap of 2.2 eV or greater. Examples of the wide-bandgap semiconductor include silicon carbide, gallium nitride, and diamond.

By using the transistor having a low off-state current for the pixel 30, the gate driver 313, the gate driver 314, and the source driver 208 can be temporarily stopped (the temporary stop is referred to as "idling stop" or "IDS driving") in the case where rewriting of a display screen is not necessary (i.e., when a still image is displayed). The IDS driving can reduce the power consumption of the display panel 111.

Specific structure examples of the display panel 111, e.g., examples of cross-sectional structures, will be described in Embodiments 2 and 3. Although this embodiment describes the example where the pixel 30 includes the light-emitting element 30b, the structure of the pixel 30 is not limited thereto and the pixel 30 may include a transmissive element, a reflective element, or the like. Alternatively, the pixel 30 may include two or more elements.

This embodiment can be implemented in combination with any of the other embodiments as appropriate.

Embodiment 2

In this embodiment, examples of the display panel 111 described in Embodiment 1 is described with reference to FIG. 10, FIGS. 11A1, 11A2, and 11B, and FIGS. 12A1, 12A2, and 12B.

Figure 10:
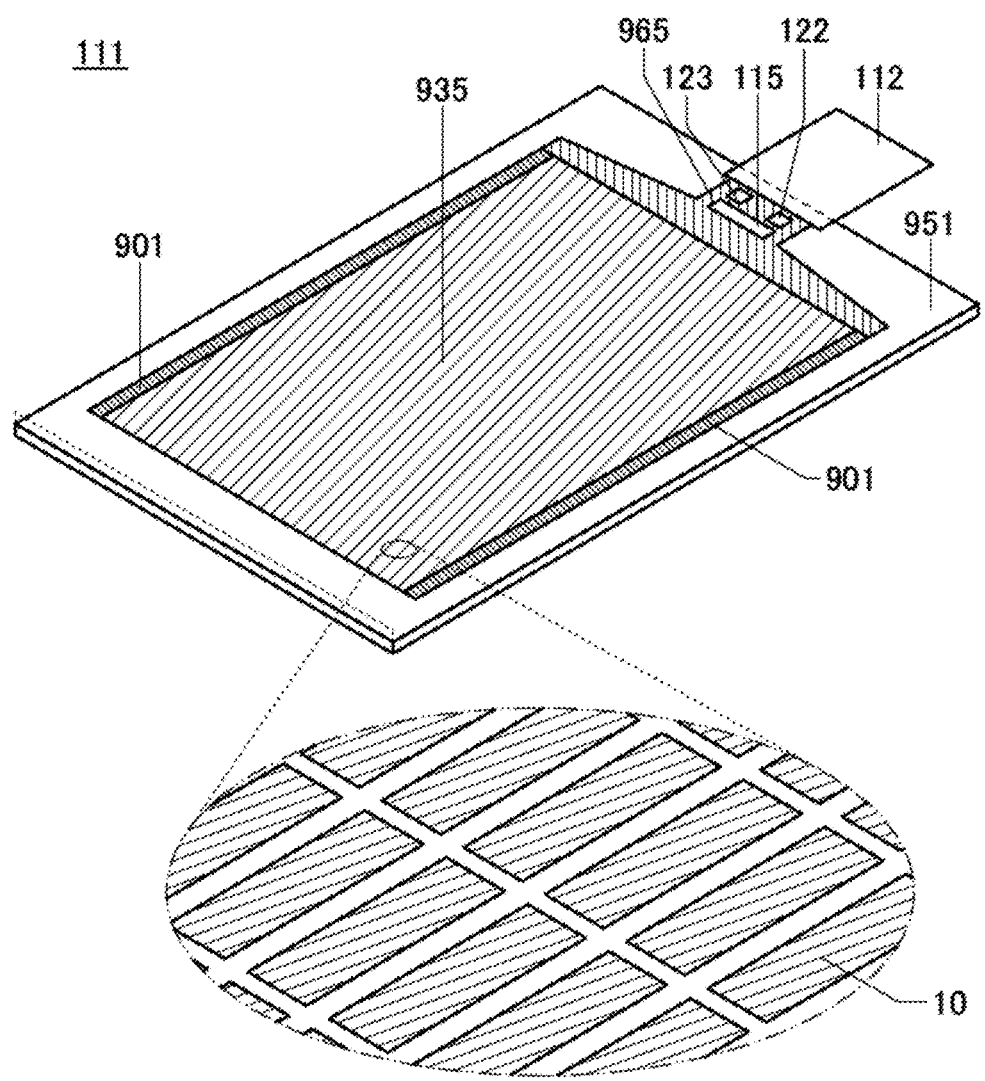
FIG. 10 is a schematic perspective view illustrating an example of a display panel.

FIG. 10 is a schematic perspective view of the display panel 111. The display panel 111 includes a display region 935, a peripheral circuit region 901, and a wiring 965 that are over a substrate 951. FIG. 10 shows an example where the controller IC 115, the phase shifter 122, the demodulator 123, and the FPC 112 are mounted on the display panel 111.

The peripheral circuit region 901 includes a circuit for supplying a signal to the display region 935. The circuit included in the peripheral circuit region 901 is, for example, a gate driver.

The wiring 965 has a function of supplying a signal and power to the display region 935 and the peripheral circuit region 901. The signal and power are input to the wiring 965 from the outside through the FPC 112 or from the controller IC 115.

In the example of FIG. 10, the controller IC 115 is provided over the substrate 951 by a COG method; however, the controller IC 115 may be mounted on an FPC by a COF method or the like. The controller IC 115 here corresponds to the controller IC 115 in Embodiment 1.

FIG. 10 also illustrates an enlarged view of part of the display region 935. In the display region 935, a plurality of pixels 10 are arranged in a matrix.

Next, the pixel 10 is described with reference to FIGS. 11A1, 11A2, and 11B.

FIG. 11A1 is a schematic top view of the pixel 10 seen from the display surface side. The pixel 10 in FIG. 11A1 includes three subpixels. Each of the subpixels includes a light-emitting element 940 (not illustrated in FIGS. 11A1 and 11A2), a transistor 910, and a transistor 912. In FIG. 11A1, each of the subpixels has a light-emitting region (a light-emitting region 916R, a light-emitting region 916G, or a light-emitting region 916B) of the light-emitting element 940. The light-emitting element 940 emits light toward the transistors 910 and 912; that is, it is a bottom-emission light-emitting element.

In addition, the pixel 10 includes a wiring 902, a wiring 904, a wiring 906, and the like. The wiring 902 serves as a scan line, for example. The wiring 904 serves as a signal line, for example. The wiring 906 serves as a power source line for supplying a potential to the light-emitting element, for example. The wiring 902 intersects with the wiring 904. The wiring 902 intersects with the wiring 906. Although the example here shows the structure where the wiring 902 intersects with the wirings 904 and 906, the structure is not limited thereto, and the wiring 904 may intersect with the wiring 906.

The transistor 910 serves as a selection transistor. A gate of the transistor 910 is electrically connected to the wiring 902. One of a source and a drain of the transistor 910 is electrically connected the wiring 904.

The transistor 912 controls a current flowing to the light-emitting element. A gate of the transistor 912 is electrically connected to the other of the source and the drain of the transistor 910. One of a source and a drain of the transistor 912 is electrically connected to the wiring 906, and the other is electrically connected to one of a pair of electrodes of the light-emitting element 940.

In FIG. 11A1, the light-emitting regions 916R, 916G, and 916B each have a strip shape long in the vertical direction, and they are arranged in the horizontal direction to form a striped pattern.

The wirings 902, 904, and 906 each have a light-blocking property. Layers included in the transistor 910, the transistor 912, a wiring connected to the transistor, a contact, a capacitor, and the like, that is, layers other than the layers included in the above wirings, are each preferably a light-transmitting film. In FIG. 11A2, a transmissive region 10t that transmits visible light and a light-blocking region 10s that blocks visible light, which are included in the pixel 10 of FIG. 11A1, are separately shown. As shown in the drawing, when the transistor is formed with a light-transmitting film, a portion other than the area where the wirings are provided can be the transmissive region 10t. Furthermore, the light-emitting region of the light-emitting element can overlap with the transistor, the wiring connected to the transistor, the contact, the capacitor, and the like, and thus the aperture ratio of the pixel can be increased.

The higher the proportion of the area of the transmissive region to the area of the pixel is, the higher the light extraction efficiency of the light-emitting element is. The proportion of the area of the transmissive region to the area of the pixel is, for example, greater than or equal to 1% and less than or equal to 95%, preferably greater than or equal to 10% and less than or equal to 90%, more preferably greater than or equal to 20% and less than or equal to 80%. A particularly preferable proportion is greater than or equal to 40% or greater than or equal to 50%, still preferably greater than or equal to 60% and less than or equal to 80%.

FIG. 11B is a cross-sectional view corresponding to a cross section along dashed-dotted line A-B in FIG. 11A2. FIG. 11B illustrates also cross sections of the light-emitting element 940, a capacitor 913, the peripheral circuit region 901, and the like that are not illustrated in the top views. The peripheral circuit region 901 can be used as a scan line driver circuit portion or a signal line driver circuit portion. The peripheral circuit region 901 includes a transistor 911.

As shown in FIG. 11B, the light-emitting element 940 emits light in the direction of a dashed arrow. The light from the light-emitting element 940 goes through the transistor 910, the transistor 912, the capacitor 913, and the like, and is extracted to the outside. Thus, a film included in the capacitor 913 or the like also preferably has a light-transmitting property. The increased area of the light-transmitting region of the capacitor 913 can decrease attenuation of light emitted from the light-emitting element 940.

The transistor 911 in the peripheral circuit region 901 may have a light-blocking property. When the transistor 911 and the like in the peripheral circuit region 901 have light-blocking properties, the reliability of a driver circuit portion and the drive capability can be heightened. Thus, it is preferable to use light-blocking conductive films for a gate electrode, a source electrode, and a drain electrode of the transistor 911. Wirings connected to them are also preferably formed with light-blocking conductive films.

Another example of the pixel 10 is described with reference to FIGS. 12A1, 12A2, and 12B.

FIG. 12A1 is a schematic top view of the pixel 10. The pixel 10 in FIG. 12A1 includes four subpixels. In the example of FIG. 12A1, the subpixels are arranged in two rows and two columns. Each of the subpixels includes a transmissive liquid-crystal element 930 (not illustrated in FIGS. 12A1 and 12A2), a transistor 914, and the like. In FIG. 12A1, the two wirings 902 and the two wirings 904 are provided in the pixel 10. In FIG. 12A1, each of the subpixels has a display region (a display region 918R, a display region 918G, a display region 918B, or a display region 918W) of the liquid crystal element. Light emitted from a backlight unit (BLU) enters the liquid-crystal element 930 through the transistor 914 and the like.

In addition, the pixel 10 includes the wiring 902, the wiring 904, and the like. The wiring 902 serves as a scan line, for example. The wiring 904 serves as a signal line, for example. The wiring 902 intersects with the wiring 904.

The transistor 914 serves as a selection transistor. A gate of the transistor 914 is electrically connected to the wiring 902. One of a source and a drain of the transistor 914 is electrically connected the wiring 904, and the other is electrically connected to the liquid-crystal element 930.

The wirings 902 and 904 each have a light-blocking property. Layers included in the transistor 914, a wiring connected to the transistor 914, a contact, a capacitor, and the like, that is, layers other than the layers included in the above wirings, are each preferably a light-transmitting film. In FIG. 12A2, the transmissive region 10t that transmits visible light and the light-blocking region 10s that blocks visible light, which are included in the pixel 10 of FIG. 12A1, are separately shown. As shown in the drawing, when the transistor is formed with a light-transmitting film, a portion other than the area where the wirings are provided can be the transmissive region 10t. Furthermore, the transmissive region of the liquid crystal element can overlap with the transistor, the wiring connected to the transistor, the contact, the capacitor, and the like, and thus the aperture ratio of the pixel can be increased.

The higher the proportion of the area of the transmissive region to the area of the pixel is, the larger the amount of transmitted light is. The proportion of the area of the transmissive region to the area of the pixel is, for example, greater than or equal to 1% and less than or equal to 95%, preferably greater than or equal to 10% and less than or equal to 90%, more preferably greater than or equal to 20% and less than or equal to 80%. A particularly preferable proportion is greater than or equal to 40% or greater than or equal to 50%, still preferably greater than or equal to 60% and less than or equal to 80%.

FIG. 12B is a cross-sectional view corresponding to a cross section along dashed-dotted line C-D in FIG. 12A2. FIG. 12B illustrates also cross sections of the liquid-crystal element 930, a coloring film 931, a light-blocking film 932, a capacitor 915, the peripheral circuit region 901, and the like that are not illustrated in the top views. The peripheral circuit region 901 can be used as a scan line driver circuit portion or a signal line driver circuit portion. The peripheral circuit region 901 includes the transistor 911.

As shown in FIG. 12B, the BLU emits light in the direction of a dashed arrow. The light from the BLU goes through the transistor 914, the capacitor 915, and the like, and is extracted to the outside. Thus, films included in the transistor 914 and the capacitor 915 also preferably have a light-transmitting property. The increased area of the light-transmitting region of the transistor 914, the capacitor 915, and the like enables further efficient use of light from the BLU.

The light from the BLU may be extracted through the coloring film 931 to the outside, as shown in FIG. 12B. The light through the coloring film 931 can be colored in a desired color. The coloring film 931 has a color selected from red (R), green (G), blue (B), cyan (C), magenta (M), yellow (Y), and the like.

Materials described below can be used for the substrates, transistors, wirings, capacitors, and the like shown in FIGS. 11A1, 11A2, and 11B and FIGS. 12A1, 12A2, and 12B.

The substrate 951 preferably has a light-transmitting property. For example, a glass substrate of barium borosilicate glass, aluminoborosilicate glass, or the like, a quartz substrate, or a sapphire substrate can be used as the substrate 951. Alternatively, a flexible substrate, an attachment film, a base film, or the like may be used.

A semiconductor film in the transistor can be formed with a light-transmitting semiconductor material. Examples of the light-transmitting semiconductor material include a metal oxide and an oxide semiconductor. An oxide semiconductor preferably contains at least indium. In particular, it preferably contains indium and zinc. In addition, one or more kinds of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

A conductive film in the transistor can be formed with a light-transmitting conductive material. The light-transmitting conductive material preferably contains one or more kinds of indium, zinc, and tin. Specifically, an In oxide, an In—Sn oxide (also referred to as an indium tin oxide or ITO), an In—Zn oxide, an In—W oxide, an In—W—Zn oxide, an In—Ti oxide, an In—Sn—Ti oxide, an In—Sn—Si oxide, a Zn oxide, a Ga—Zn oxide, or the like can be used.

The conductive film of the transistor may be an oxide semiconductor that includes an impurity element, for example, and has reduced resistance. The oxide semiconductor with the reduced resistance can be regarded as an oxide conductor (OC).

For example, to form an oxide conductor, oxygen vacancies are formed in an oxide semiconductor and then hydrogen is added to the oxygen vacancies, so that a donor level is formed in the vicinity of the conduction band. The oxide semiconductor having the donor level has an increased conductivity and becomes a conductor.

An oxide semiconductor has a large energy gap (e.g., an energy gap of 2.5 eV or larger), and thus has a visible light transmitting property. The oxide conductor also has a visible light transmitting property almost equivalent to that of the oxide semiconductor.

The oxide conductor preferably includes one or more kinds of metal elements included in the semiconductor film of the transistor. When two or more layers included in the transistor are formed using the oxide semiconductors including the same metal element, the same manufacturing apparatus (e.g., deposition apparatus or processing apparatus) can be used in two or more steps and manufacturing cost can thus be reduced.

The structures of the pixel in the display device shown in this embodiment enables efficient use of light emitted from one or both of the light-emitting element and the BLU. Thus, the excellent display device with reduced power consumption can be provided.

Next, structure examples of a transistor that can be employed in the display panel 111 will be described.

Structure Example 1 of OS Transistor

Figure 13A:
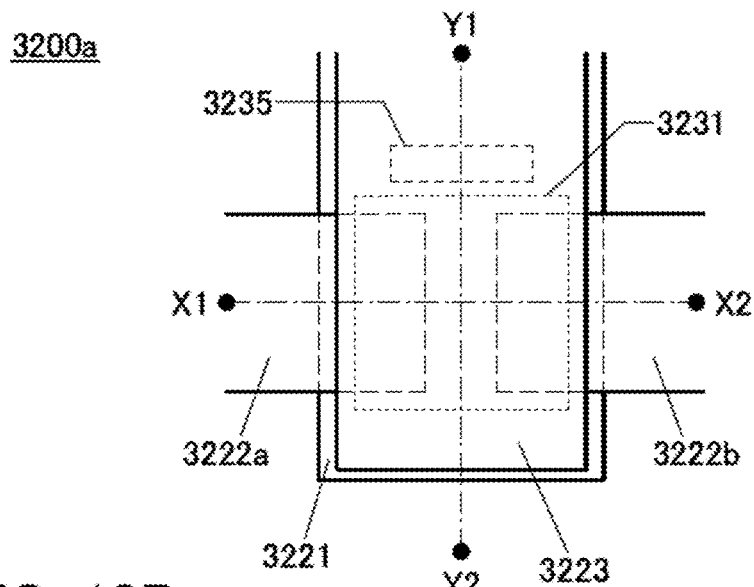
FIGS. 13A to 13C are a top view and cross-sectional views illustrating an example of a transistor used in a display device.
Figure 13B:
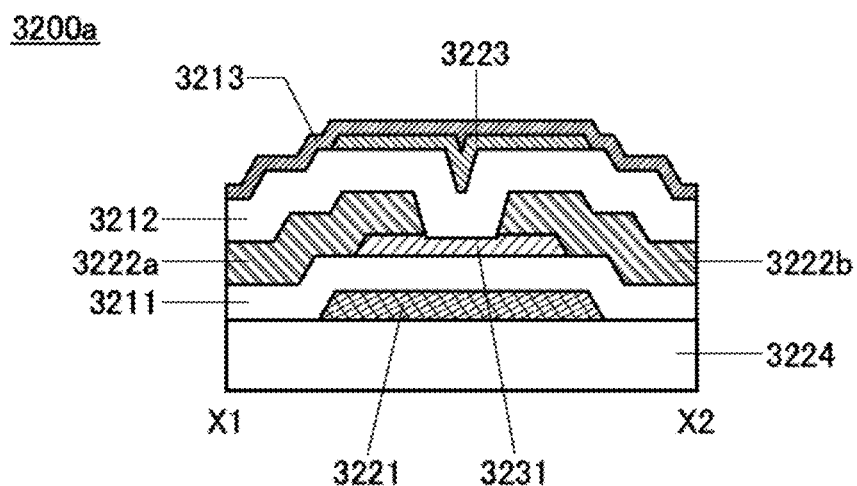
Figure 13C:
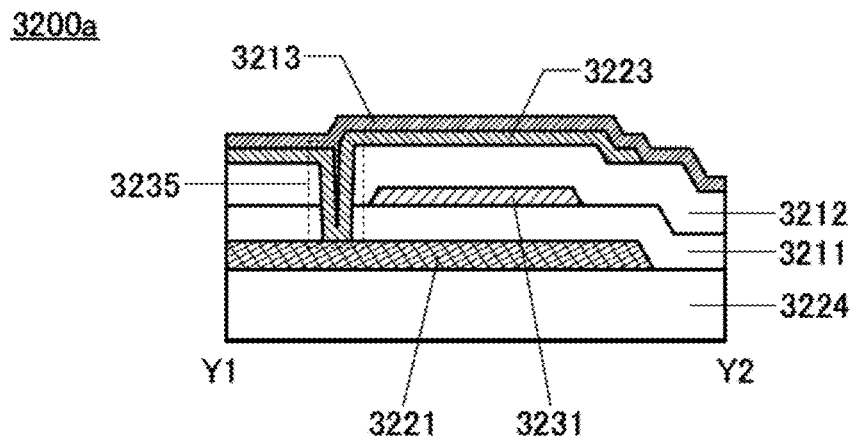

To show a structure example of a transistor, a transistor 3200*a* is described with reference to FIGS. 13A to 13C. FIG. 13A is a top view of the transistor 3200*a*. FIG. 13B is a cross-sectional view corresponding to a cross section along dashed-dotted line X1-X2 in FIG. 13A, and FIG. 13C is a cross-sectional view corresponding to a cross section along dashed-dotted line Y1-Y2 in FIG. 13A. Note that in FIG. 13A, some components of the transistor 3200*a* (e.g., an insulating layer serving as a gate insulating layer) are not illustrated to avoid complexity. Note that hereinafter, the direction of the dashed-dotted line X1-X2 may be called the channel length direction, and the direction of the dashed-dotted line Y1-Y2 may be called the channel width direction. As in FIG. 13A, some components are not illustrated in some cases in top views of transistors described below.

The transistor 3200*a* includes a conductive layer 3221 over an insulating layer 3224; an insulating layer 3211 over the insulating layer 3224 and the conductive layer 3221; a metal oxide layer 3231 over the insulating layer 3211; a conductive layer 3222*a* over the metal oxide layer 3231; a conductive layer 3222*b* over the metal oxide layer 3231; an insulating layer 3212 over the metal oxide layer 3231, the conductive layer 3222*a*, and the conductive layer 3222*b*; a conductive layer 3223 over the insulating layer 3212; and an insulating layer 3213 over the insulating layer 3212 and the conductive layer 3223.

The insulating layers 3211 and 3212 have an opening 3235. The conductive layer 3223 is electrically connected to the conductive layer 3221 in the opening 3235.

The insulating layer 3211 serves as a first gate insulating layer of the transistor 3200*a*. The insulating layer 3212 serves as a second gate insulating layer of the transistor 3200*a*. The insulating layer 3213 serves as a protective insulating layer of the transistor 3200*a*. The conductive layer 3221 serves as a first gate of the transistor 3200*a*. The conductive layer 3222*a* serves as one of a source and a drain of the transistor 3200*a* and the conductive layer 3222*b* serves as the other of the source and the drain. The conductive layer 3223 serves as a second gate of the transistor 3200*a*.

Note that the transistor 3200*a* is a channel-etched transistor, and has a dual-gate structure.

The transistor 3200*a* without the conductive layer 3223 is also available. In that case, the transistor 3200*a* is a channel-etched transistor, and has a bottom-gate structure.

As shown in FIGS. 13B and 13C, the metal oxide layer 3231 faces to the conductive layer 3221 and the conductive layer 3223, and is between the conductive layers serving as the two gates. The length of the conductive layer 3223 in the channel length direction is longer than the length of the metal oxide layer 3231 in the channel length direction. The length of the conductive layer 3223 in the channel width direction is longer than the length of the metal oxide layer 3231 in the channel width direction. The whole metal oxide layer 3231 is covered with the conductive layer 3223 with the insulating layer 3212 therebetween.

In other words, the conductive layers 3221 and 3223 are connected to each other in the opening 3235 provided in the insulating layers 3211 and 3212, and have a region located outside a side end portion of the metal oxide layer 3231.

With this structure, the metal oxide layer 3231 included in the transistor 3200*a* can be electrically surrounded by electric fields of the conductive layers 3221 and 3223. A device structure of a transistor in which electric fields of a first gate and a second gate electrically surround a metal oxide layer where a channel region is formed, like in the transistor 3200*a*, can be referred to as a surrounded channel (S-channel) structure.

Since the transistor 3200*a* has the S-channel structure, an electric field for inducing a channel can be effectively applied to the metal oxide layer 3231 by the conductive layer 3221 functioning as the first gate; therefore, the current drive capability of the transistor 3200*a* can be improved and high on-state current characteristics can be obtained. Since the on-state current can be increased, it is possible to reduce the size of the transistor 3200*a*. In addition, since the transistor 3200*a* has a structure in which the metal oxide layer 3231 is surrounded by the conductive layer 3221 serving as the first gate and the conductive layer 3223 serving as the second gate, the mechanical strength of the transistor 3200*a* can be increased.

For example, it is preferable that the metal oxide layer 3231 contain In, M (M is gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, or magnesium), and Zn.

The metal oxide layer 3231 preferably includes a region in which the atomic proportion of In is larger than the atomic proportion of M For example, the atomic ratio of In to M and Zn in the metal oxide layer 3231 is preferably In:M:Zn=4: 2:3 or in the neighborhood thereof. As for the range expressed by the term "vicinity" here, when In is 4, M ranges from 1.5 to 2.5 and Zn ranges from 2 to 4. Alternatively, the atomic ratio of In to M and Zn in each of the metal oxide layer 3231 is preferably 5:1:6 or in its neighborhood.

The metal oxide layer 3231 is preferably a CAC-OS. When the metal oxide layer 3231 is a CAC-OS and has a region in which the atomic proportion of In is higher than the atomic proportion of M, the transistor 3200a can have high field-effect mobility. Note that the details of the CAC-OS will be described later.

Since the transistor 3200a having the S-channel structure has high field-effect mobility and high driving capability, the use of the transistor 3200a in the driver circuit, a typical example of which is a gate driver that generates a gate signal, allows the display device to have a narrow bezel. The use of the transistor 3200a in a source driver (particularly in a demultiplexer connected to an output terminal of a shift register included in the source driver) that supplies a signal to a signal line included in the display device can reduce the number of wirings connected to the display device.

Furthermore, the transistor 3200a is a channel-etched transistor and thus can be fabricated through a smaller number of steps than a transistor formed using low-temperature polysilicon. In addition, the metal oxide layer is used for the channel region of the transistor 3200a; thus, a laser crystallization step is unnecessary unlike in the case of the transistor formed using low-temperature polysilicon. Accordingly, the manufacturing cost can be reduced even in the case of a display device formed using a large substrate. Transistors having high field-effect mobility like the transistor 3200a are preferably used in a driver circuit and a display portion of a large display device having high resolution such as ultra high definition (4K resolution, 4K2K, or 4K) or super high definition (8K resolution, 8K4K, or 8K), in which case writing can be performed in a short time and display defects can be reduced.

The insulating layers 3211 and 3212 in contact with the metal oxide layer 3231 are preferably oxide insulating films, and further preferably includes a region containing oxygen in excess of the stoichiometric composition (oxygen-excess region). In other words, the insulating layers 3211 and 3212 are insulating films from which oxygen can be released. In order to provide the oxygen-excess region in the insulating layers 3211 and 3212, the insulating layers 3211 and 3212 are formed in an oxygen atmosphere, or the deposited insulating layers 3211 and 3212 are subjected to heat treatment in an oxygen atmosphere, for example.

An oxide semiconductor, which is a kind of metal oxide, can be used as the metal oxide layer 3231.

In the case where the metal oxide layer 3231 includes an In-M-Zn oxide, it is preferable that the atomic ratio of metal elements of a sputtering target used for forming the In-M-Zn oxide satisfy In>M The atomic ratio of metal elements in such a sputtering target is, for example, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, In:M:Zn=5:2:5, or the like.

In the case where the metal oxide layer 3231 is formed using an In-M-Zn oxide, it is preferable to use a target including a polycrystalline In-M-Zn oxide as the sputtering target. The use of the target including a polycrystalline In-M-Zn oxide facilitates formation of the metal oxide layer 3231 having crystallinity. Note that the atomic ratio of metal elements in the formed metal oxide layer 3231 varies from the above atomic ratios of metal elements of the sputtering targets in a range of ±40%. For example, when a sputtering target with an atomic ratio of In:Ga:Zn=4:2:4.1 is used for forming the metal oxide layer 3231, the atomic ratio of In to Ga and Zn in the formed metal oxide layer 3231 may be 4:2:3 or in the neighborhood of 4:2:3.

The energy gap of the metal oxide layer 3231 is 2 eV or more, preferably 2.5 eV or more. The use of such an oxide semiconductor having a wide energy gap leads to a reduction in off-state current of a transistor.

Furthermore, the metal oxide layer 3231 preferably has a non-single-crystal structure. The non-single-crystal structure includes a c-axis aligned crystalline (CAAC) structure, a polycrystalline structure, a microcrystalline structure, or an amorphous structure, for example. Among the non-single-crystal structures, the amorphous structure has the highest density of defect states, whereas the CAAC structure has the lowest density of defect states.

The metal oxide layer 3231 formed with a metal oxide film with low impurity concentration and low density of defect states can give the transistor excellent electrical characteristics. Thus, the use of such a metal oxide film is preferable. Here, the state in which impurity concentration is low and density of defect states is low (the number of oxygen vacancies is small) is referred to as "highly purified intrinsic" or "substantially highly purified intrinsic". Note that impurities in a metal oxide film are typically water, hydrogen, and the like. In this specification and the like, reducing or removing water and hydrogen from a metal oxide film is referred to as dehydration or dehydrogenation in some cases. Moreover, adding oxygen to a metal oxide film or an oxide insulating film is referred to as oxygen addition in some cases, and a state in which oxygen in excess of the stoichiometric composition is contained due to the oxygen addition is referred to as an oxygen-excess state in some cases.

A highly purified intrinsic or substantially highly purified intrinsic metal oxide film has few carrier generation sources, and thus has a low carrier density. Thus, a transistor in which a channel region is formed in the metal oxide film rarely has a negative threshold voltage (is rarely normally on). The highly purified intrinsic or substantially highly purified intrinsic metal oxide film has a low density of defect states and accordingly has a low density of trap states in some cases. Furthermore, the highly purified intrinsic or substantially highly purified intrinsic metal oxide film has an extremely low off-state current; even when the element has a channel width W of $1 \times 10^6$ μm and a channel length L of 10 μm, the off-state current can be, for example, less than or equal to $1 \times 10^{-13}$ A, at a voltage (drain voltage) between a source electrode and a drain electrode of from 1 V to 10 V.

The insulating layer 3213 includes one or both of hydrogen and nitrogen. Alternatively, the insulating layer 3213 includes nitrogen and silicon. The insulating layer 3213 has a function of blocking oxygen, hydrogen, water, alkali metal, alkaline earth metal, or the like. The insulating layer 3213 can prevent outward diffusion of oxygen from the metal oxide layer 3231, outward diffusion of oxygen from the insulating layer 3212, and entry of hydrogen, water, or the like into the metal oxide layer 3231 from the outside.

The insulating layer 3213 can be a nitride insulating film, for example. The nitride insulating film is formed of silicon nitride, silicon nitride oxide, aluminum nitride, aluminum nitride oxide, or the like.

Structure Example 2 of OS Transistor

Figure 14A:
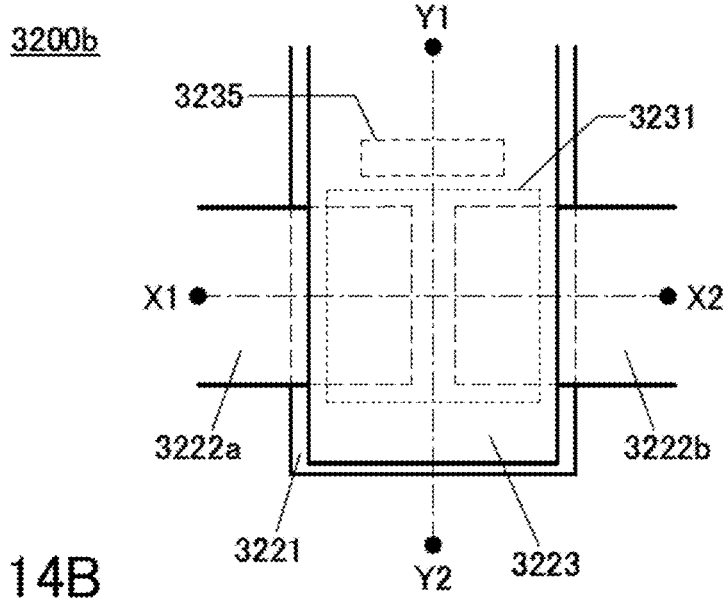
FIGS. 14A to 14C are a top view and cross-sectional views illustrating an example of a transistor used in a display device.
Figure 14B:
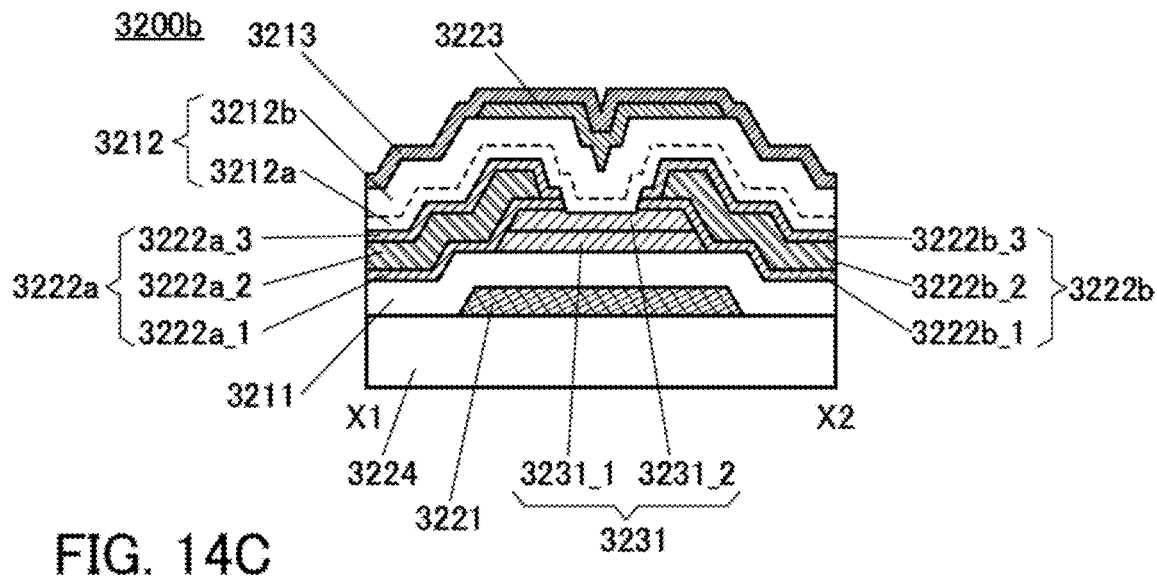
Figure 14C:
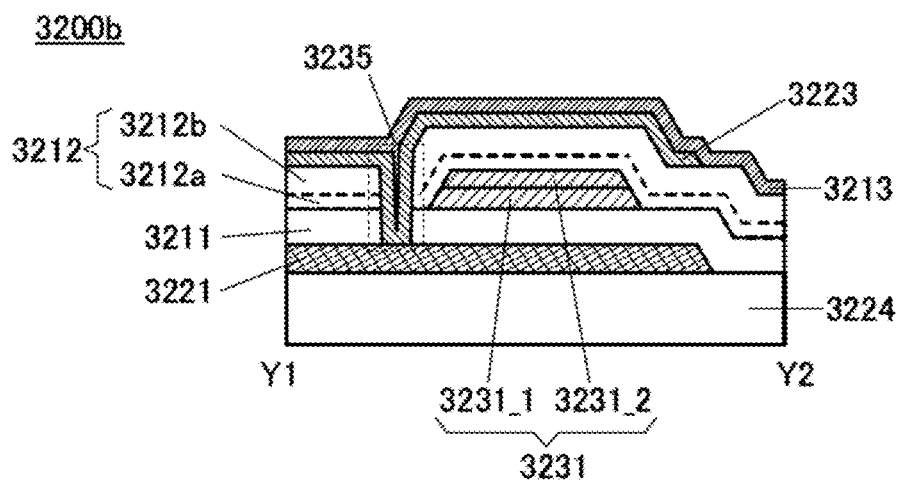

To show a structure example of a transistor, a transistor 3200b is described with reference to FIGS. 14A to 14C. FIG. 14A is a top view of the transistor 3200b. FIG. 14B is a cross-sectional view corresponding to a cross section along dashed-dotted line X1-X2 in FIG. 14A, and FIG. 14C is a cross-sectional view corresponding to a cross section along dashed-dotted line Y1-Y2 in FIG. 14A.

The transistor 3200b is different from the transistor 3200a in that the metal oxide layer 3231, the conductive layer 3222a, the conductive layer 3222b, and the insulating layer 3212 each have a multi-layer structure.

The insulating layer 3212 includes an insulating layer 3212a over the metal oxide layer 3231 and the conductive layers 3222a and 3222b, and an insulating layer 3212b over the insulating layer 3212a. The insulating layer 3212 has a function of supplying oxygen to the metal oxide layer 3231. That is, the insulating layer 3212 contains oxygen. The insulating layer 3212a is an insulating layer that allows oxygen to pass therethrough. Note that the insulating layer 3212a serves also as a film that relieves damage to the metal oxide layer 3231 at the time of forming the insulating layer 3212b.

A silicon oxide, a silicon oxynitride, or the like with a thickness greater than or equal to 5 nm and less than or equal to 150 nm, preferably greater than or equal to 5 nm and less than or equal to 50 nm can be used as the insulating layer 3212a.

Further, it is preferable that the number of defects in the insulating layer 3212a be small and typically, the spin density of a signal that appears at g=2.001 due to a dangling bond of silicon be lower than or equal to $3\times10^{17}$ spins/cm$^3$ by electron spin resonance (ESR) measurement. This is because if the density of defects in the insulating layer 3212a is high, oxygen is bonded to the defects and the property of transmitting oxygen of the insulating layer 3212a is lowered.

Note that not all oxygen that has entered the insulating layer 3212a from the outside moves to the outside of the insulating layer 3212a but some oxygen remains in the insulating layer 3212a. In some cases, movement of oxygen occurs in the insulating layer 3212a in such a manner that oxygen included in the insulating layer 3212a moves to the outside of the insulating layer 3212a upon the entry of oxygen into the insulating layer 3212a. When an oxide insulating layer that can transmit oxygen is formed as the insulating layer 3212a, oxygen released from the insulating layer 3212b provided over the insulating layer 3212a can be moved to the metal oxide layer 3231 through the insulating layer 3212a.

Note that the insulating layer 3212a can be formed using an oxide insulating layer having a low density of states due to nitrogen oxide. Note that the density of states due to nitrogen oxide can be formed between the valence band maximum (Ev_os) and the conduction band minimum (Ec_os) of the metal oxide film. A silicon oxynitride film that releases a small amount of nitrogen oxide, an aluminum oxynitride film that releases a small amount of nitrogen oxide, or the like can be used as the above oxide insulating layer.

Note that a silicon oxynitride film that releases a small amount of nitrogen oxide is a film which releases ammonia more than nitrogen oxide in thermal desorption spectroscopy (TDS) analysis; the amount of released ammonia is typically greater than or equal to $1\times10^{18}$/cm$^3$ and less than or equal to $5\times10^{19}$/cm$^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating layer 3212a, for example. The level is positioned in the energy gap of the metal oxide layer 3231. Therefore, when nitrogen oxide is diffused to the interface between the insulating layer 3212a and the metal oxide layer 3231, an electron is in some cases trapped by the level on the insulating layer 3212a side. As a result, the trapped electron remains in the vicinity of the interface between the insulating layer 3212a and the metal oxide layer 3231; thus, the threshold voltage of the transistor is shifted in the positive direction.

Nitrogen oxide reacts with ammonia and oxygen in heat treatment. Since nitrogen oxide contained in the insulating layer 3212a reacts with ammonia contained in the insulating layer 3212b in heat treatment, nitrogen oxide contained in the insulating layer 3212a is reduced. Therefore, an electron is hardly trapped at the interface between the insulating layer 3212a and the metal oxide layer 3231.

By using the above oxide insulating layer for the insulating layer 3212a, a shift in the threshold voltage of the transistor can be reduced, which leads to reduced fluctuations in the electrical characteristics of the transistor.

The concentration of nitrogen of the above oxide insulating layer measured by SIMS is lower than or equal to $6\times10^{20}$ atoms/cm$^3$.

The above oxide insulating layer is formed by a PECVD method at a substrate temperature higher than or equal to 220° C. and lower than or equal to 350° C. using silane and dinitrogen monoxide, whereby a dense and hard film can be formed.

The insulating layer 3212b is an oxide insulating layer that contains oxygen at a higher proportion than the stoichiometric composition. Part of oxygen is released from the above oxide insulating layer by heating. The amount of oxygen released from the oxide insulating layer in TDS is more than or equal to $1.0\times10^{19}$ atoms/cm$^3$, preferably more than or equal to $3.0\times10^{20}$ atoms/cm$^3$. Note that the amount of released oxygen is the total amount of oxygen released by heat treatment in a temperature range of 50° C. to 650° C. or 50° C. to 550° C. in TDS. In addition, the amount of released oxygen is the total amount of released oxygen converted into oxygen atoms in TDS.

A silicon oxide film, a silicon oxynitride film, or the like with a thickness greater than or equal to 30 nm and less than or equal to 500 nm, preferably greater than or equal to 50 nm and less than or equal to 400 nm can be used for the insulating layer 3212b.

It is preferable that the number of defects in the insulating layer 3212b be small and typically, the spin density corresponding to a signal that appears at g=2.001 due to a dangling bond of silicon be lower than $1.5\times10^{18}$ spins/cm$^3$, preferably lower than or equal to $1\times10^{18}$ spins/cm$^3$ by ESR measurement. Note that the insulating layer 3212b is provided more apart from the metal oxide layer 3231 than the insulating layer 3212a is; thus, the insulating layer 3212b may have higher density of defects than the insulating layer 3212a.

Furthermore, the insulating layer 3212 can include insulating layers including the same kind of material; thus, a boundary between the insulating layer 3212a and the insulating layer 3212b cannot be clearly observed in some cases. Thus, in this embodiment, the boundary between the insulating layer 3212a and the insulating layer 3212b is shown by a dashed line. Although a two-layer structure including the insulating layers 3212a and 3212b is described in this embodiment, the present invention is not limited to this. For example, a single-layer structure including only the insulating layer 3212a or a multi-layer structure including three or more layers may be employed.

The metal oxide layer 3231 in the transistor 3200b includes a metal oxide layer 3231_1 over the insulating layer 3211 and a metal oxide layer 3231_2 over the metal oxide layer 3231_1. The metal oxide layers 3231_1 and 3231_2 contain the same kind of element. For example, it is preferable that the metal oxide layers 3231_1 and 3231_2 each independently contain the same element as the element in the metal oxide layer 3231 that is described above.

Each of the metal oxide layers 3231_1 and 3231_2 preferably contains a region in which the atomic proportion of In is higher than the atomic proportion of M For example, the atomic ratio of In to M and Zn in each of the metal oxide layers 3231_1 and 3231_2 is preferably In:M:Zn=4:2:3 or in the neighborhood of 4:2:3. As for the range expressed by the term "vicinity" here, when In is 4, M ranges from 1.5 to 2.5 and Zn ranges from 2 to 4. Alternatively, the atomic ratio of In to M and Zn in each of the metal oxide layers 3231_1 and 3231_2 is preferably In:M:Zn=5:1:6 or in the neighborhood of 5:1:6. The metal oxide layers 3231_1 and 3231_2 having substantially the same composition as described above can be formed using the same sputtering target; thus, the manufacturing cost can be reduced. When the same sputtering target is used, the metal oxide layers 3231_1 and 3231_2 can be formed successively in the same vacuum chamber. This can suppress entry of impurities into the interface between the metal oxide layers 3231_1 and 3231_2.

Here, the metal oxide layer 3231_1 may include a region whose crystallinity is lower than that of the metal oxide layer 3231_2. Note that the crystallinity of the metal oxide layers 3231_1 and 3231_2 can be determined by analysis by X-ray diffraction (XRD) or with a transmission electron microscope (TEM), for example.

The region with low crystallinity in the metal oxide layer 3231_1 serves as a diffusion path of excess oxygen, through which excess oxygen can be diffused into the metal oxide layer 3231_2 having higher crystallinity than the metal oxide layer 3231_1. When a multi-layer structure including the metal oxide layers having different crystal structures is employed and the region with low crystallinity is used as a diffusion path of excess oxygen as described above, the transistor can be highly reliable.

The metal oxide layer 3231_2 having a region with higher crystallinity than the metal oxide layer 3231_1 can prevent impurities from entering the metal oxide layer 3231. In particular, the increased crystallinity of the metal oxide layer 3231_2 can reduce damage at the time of processing into the conductive layers 3222a and 3222b. The surface of the metal oxide layer 3231, i.e., the surface of the metal oxide layer 3231_2 is exposed to an etchant or an etching gas at the time of processing into the conductive layers 3222a and 3222b. However, when the metal oxide layer 3231_2 has a region with high crystallinity, the metal oxide layer 3231_2 has higher etching resistance than the metal oxide layer 3231_1. Thus, the metal oxide layer 3231_2 serves as an etching stopper.

By including a region having lower crystallinity than the metal oxide layer 3231_2, the metal oxide layer 3231_1 sometimes has a high carrier density.

When the metal oxide layer 3231_1 has a high carrier density, the Fermi level is sometimes high relative to the conduction band of the metal oxide layer 3231_1. This lowers the conduction band minimum of the metal oxide layer 3231_1, so that the energy difference between the conduction band minimum of the metal oxide layer 3231_1 and the trap level, which might be formed in a gate insulating film (here, the insulating layer 3211), is increased in some cases. The increase of the energy difference can reduce trap of charges in the gate insulating film and reduce variation in the threshold voltage of the transistor, in some cases. In addition, when the metal oxide layer 3231_1 has a high carrier density, the metal oxide layer 3231 can have high field-effect mobility.

Although the metal oxide layer 3231 in the transistor 3200b has a multi-layer structure including two layers in this example, the structure is not limited thereto, and the metal oxide layer 3231 may have a multi-layer structure including three or more layers.

The conductive layer 3222a in the transistor 3200b includes a conductive layer 3222a1, a conductive layer 3222a2 over the conductive layer 3222a1, and a conductive layer 3222a_3 over the conductive layer 3222a2. The conductive layer 3222b in the transistor 3200b includes a conductive layer 3222b_1, a conductive layer 3222b_2 over the conductive layer 3222b_1, and a conductive layer 3222b_3 over the conductive layer 3222b_2.

For example, it is favorable that the conductive layers 3222a_1, 3222b_1, 3222a_3, and 3222b_3 contain one or more elements selected from titanium, tungsten, tantalum, molybdenum, indium, gallium, tin, and zinc. Furthermore, it is preferable that the conductive layers 3222a_2 and 3222b_2 contain one or more elements selected from copper, aluminum, and silver.

Specifically, the conductive layers 3222a 1, 3222b_1, 3222a_3, and 3222b_3 can contain an In—Sn oxide or an In—Zn oxide and the conductive layers 3222a_2 and 3222b_2 can contain copper.

An end portion of the conductive layer 3222a1 has a region located outside an end portion of the conductive layer 3222a_2. The conductive layer 3222a_3 covers a top surface and a side surface of the conductive layer 3222a_2 and has a region that is in contact with the conductive layer 3222a_1. An end portion of the conductive layer 3222b_1 has a region located outside an end portion of the conductive layer 3222b_2. The conductive layer 3222b_3 covers a top surface and a side surface of the conductive layer 3222b_2 and has a region that is in contact with the conductive layer 3222b_1.

The above structure is preferred because the structure can reduce the wiring resistance of the conductive layers 3222a and 3222b and inhibit diffusion of copper to the metal oxide layer 3231.

Structure Example 3 of OS Transistor

Figure 15A:
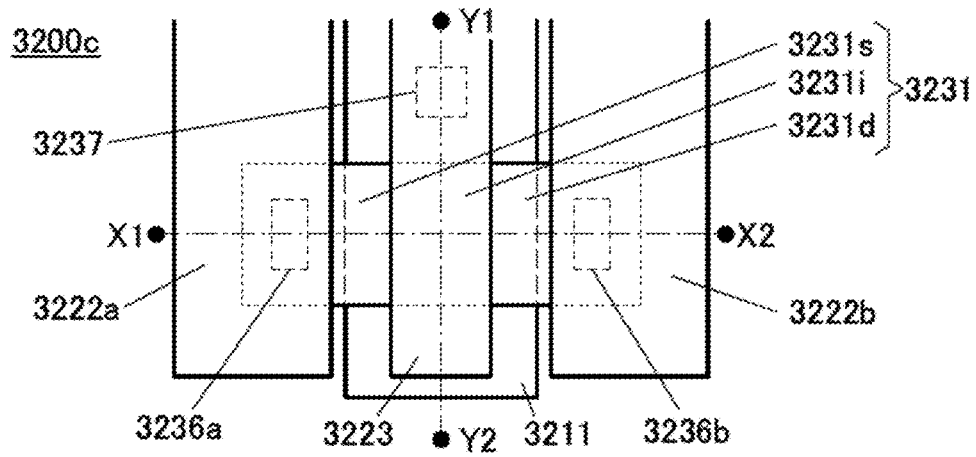
FIGS. 15A to 15C are a top view and cross-sectional views illustrating an example of a transistor used in a display device.
Figure 15B:
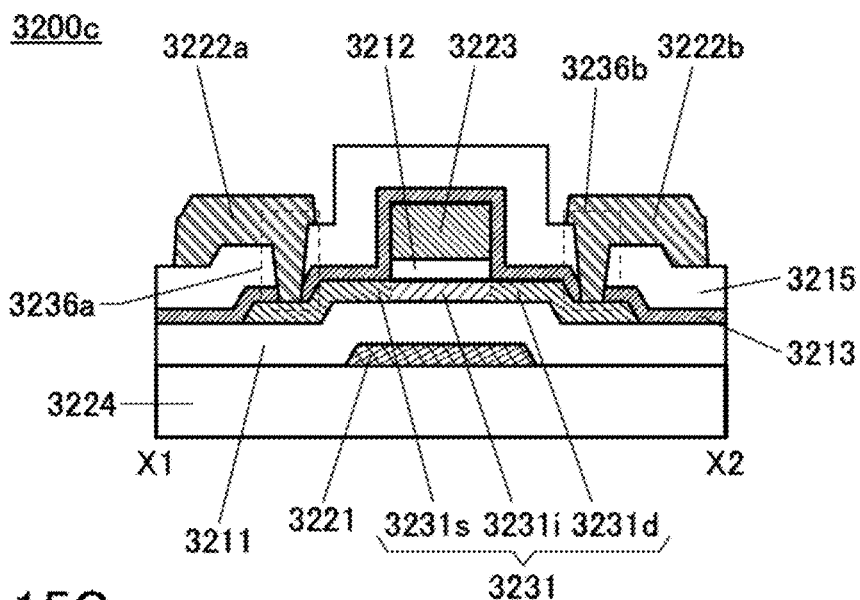

To show a structure example of a transistor, a transistor 3200c is described with reference to FIGS. 15A to 15C. FIG. 15A is a top view of the transistor 3200c. FIG. 15B is a cross-sectional view corresponding to a cross section along dashed-dotted line X1-X2 in FIG. 15A, and FIG. 15C is a cross-sectional view corresponding to a cross section along dashed-dotted line Y1-Y2 in FIG. 15A.

Figure 15C:
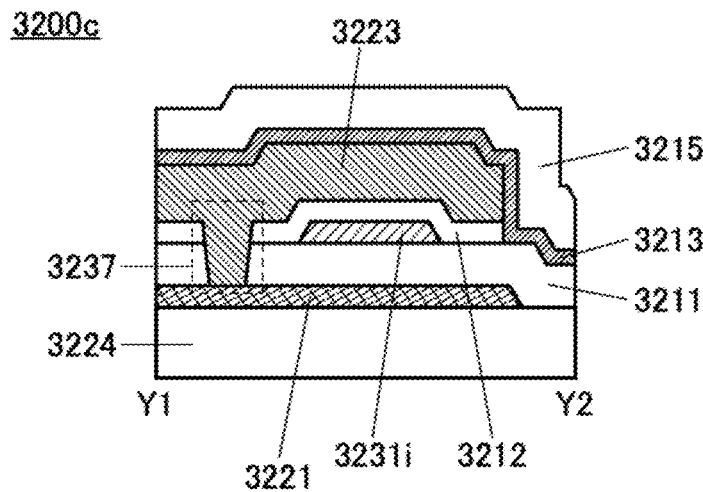

The transistor 3200c shown in FIGS. 15A to 15C includes the conductive layer 3221 over the insulating layer 3224; the insulating layer 3211 over the conductive layer 3221; the metal oxide layer 3231 over the insulating layer 3211; the insulating layer 3212 over the metal oxide layer 3231; the conductive layer 3223 over the insulating layer 3212; and the insulating layer 3213 over the insulating layer 3211, the metal oxide layer 3231, and the conductive layer 3223. The metal oxide layer 3231 include a channel region 3231i overlapping with the conductive layer 3223, a source region 3231s in contact with the insulating layer 3213, and a drain region 3231d in contact with the insulating layer 3213.

The insulating layer 3213 contains nitrogen or hydrogen. The insulating layer 3213 is in contact with the source region 3231s and the drain region 3231d, so that nitrogen or hydrogen that is contained in the insulating layer 3213 is added to the source region 3231s and the drain region 3231d. The source region 3231s and the drain region 3231d each have a high carrier density when nitrogen or hydrogen is added thereto.

The transistor 3200c may further include an insulating layer 3215 over the insulating layer 3213, the conductive layer 3222a electrically connected to the source region 3231s through an opening 3236a provided in the insulating layers 3213 and 3215, and the conductive layer 3222b electrically connected to the drain region 3231d through an opening 3236b provided in the insulating layers 3213 and 3215.

The insulating layer 3215 can be an oxide insulating film, for example. Alternatively, a multi-layer film including an oxide insulating film and a nitride insulating film can be used as the insulating layer 3215. The insulating layer 3215 can include, for example, silicon oxide, silicon oxynitride, silicon nitride oxide, aluminum oxide, hafnium oxide, gallium oxide, or Ga—Zn oxide. Furthermore, the insulating layer 3215 preferably functions as a barrier film against hydrogen, water, and the like from the outside.

The insulating layer 3211 serves as a first gate insulating film, and the insulating layer 3212 serves as a second gate insulating film. The insulating layers 3213 and 3215 serve as a protective insulating film.

The insulating layer 3212 includes an excess oxygen region. Since the insulating layer 3212 includes the excess oxygen region, excess oxygen can be supplied to the channel region 3231i included in the metal oxide layer 3231. As a result, oxygen vacancies that might be formed in the channel region 3231i can be filled with excess oxygen, which can provide a highly reliable semiconductor device.

To supply excess oxygen to the metal oxide layer 3231, excess oxygen may be supplied to the insulating layer 3211 that is formed below the metal oxide layer 3231. However, in that case, excess oxygen contained in the insulating layer 3211 might also be supplied to the source region 3231s and the drain region 3231d included in the metal oxide layer 3231. When excess oxygen is supplied to the source region 3231s and the drain region 3231d, the resistance of the source region 3231s and the drain region 3231d might be increased.

In contrast, in the structure in which the insulating layer 3212 formed over the metal oxide layer 3231 contains excess oxygen, excess oxygen can be selectively supplied only to the channel region 3231i. Alternatively, the carrier density of the source and drain regions 3231s and 3231d can be selectively increased after excess oxygen is supplied to the channel region 3231i and the source and drain regions 3231s and 3231d, in which case an increase in the resistance of the source and drain regions 3231s and 3231d can be prevented.

Furthermore, each of the source region 3231s and the drain region 3231d included in the metal oxide layer 3231 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas. Typical examples of the rare gas element are helium, neon, argon, krypton, and xenon. In the case where one or more of the elements that form oxygen vacancies are contained in the insulating layer 3213, the one or more of the elements are diffused from the insulating layer 3213 to the source region 3231s and the drain region 3231d. Alternatively, one or more of the elements that form oxygen vacancies may be added to the source region 3231s and the drain region 3231d by impurity addition treatment. One or more of the elements that form oxygen vacancies may be introduced in the source region 3231s and the drain region 3231d by both diffusion from the insulating layer 3213 and impurity addition treatment.

An impurity element added to the oxide semiconductor film cuts a bond between a metal element and oxygen in the oxide semiconductor film, so that an oxygen vacancy is formed. Alternatively, when the impurity element is added to the oxide semiconductor film, oxygen bonded to a metal element in the oxide semiconductor film is bonded to the impurity element, and the oxygen is released from the metal element, whereby an oxygen vacancy is formed. As a result, the oxide semiconductor film has a higher carrier density and thus the conductivity thereof becomes higher.

The conductive layer 3221 functions as a first gate electrode and the conductive layer 3223 functions as a second gate electrode. The conductive layer 3222a functions as a source electrode and the conductive layer 3222b functions as a drain electrode.

As shown in FIG. 15C, an opening 3237 is formed in the insulating layers 3211 and 3212. The conductive layer 3221 is electrically connected to the conductive layer 3223 in the opening 3237. Thus, the conductive layers 3221 and 3223 are supplied with the same potential. Note that different potentials may be applied to the conductive layers 3221 and 3223 without providing the opening 3237. Alternatively, the conductive layer 3221 may be used as a light-blocking film without providing the opening 3237. For example, light irradiating the channel region 3231i from the bottom can be reduced by the conductive layer 3221 formed with a light-blocking material.

As illustrated in FIGS. 15B and 15C, the metal oxide layer 3231 faces the conductive layer 3221 functioning as a first gate electrode and the conductive layer 3223 functioning as a second gate electrode and is positioned between the two conductive films functioning as the gate electrodes.

As with the transistors 3200a and 3200b, the transistor 3200c has the S-channel structure. Such a structure enables the metal oxide layer 3231 included in the transistor 3200c to be electrically surrounded by electric fields of the conductive layer 3221 functioning as the first gate electrode and the conductive layer 3223 functioning as the second gate electrode.

Since the transistor 3200c has the S-channel structure, an electric field for inducing a channel can be effectively applied to the metal oxide layer 3231 by the conductive layer 3221 or 3223; thus, the current drive capability of the transistor 3200c can be improved and high on-state current characteristics can be obtained. As a result of the high on-state current, it is possible to reduce the size of the transistor 3200c. Furthermore, since the transistor 3200c has a structure in which the metal oxide layer 3231 is surrounded by the conductive layers 3221 and 3223, the mechanical strength of the transistor 3200c can be increased.

The transistor 3200c may be called a top-gate self-aligned (TGSA) FET from the position of the conductive layer 3223 relative to the metal oxide layer 3231 or the formation method of the conductive layer 3223.

The metal oxide layer 3231 in the transistor 3200c may have a multi-layer structure including two or more layers, as in the transistor 3200b.

Although the insulating layer 3212 is present only in a portion overlapping with the conductive layer 3223 in the transistor 3200c, the structure is not limited thereto, and the insulating layer 3212 may cover the metal oxide layer 3231. Alternatively, the conductive layer 3221 may be omitted.

At least part of this embodiment can be implemented in appropriate combination with any of the other embodiments.

Embodiment 3

This embodiment will introduce a hybrid display panel that includes a light-emitting element and a reflective element as another example of the display panel 111 in Embodiment 1, and describe cross-sectional structure examples of the hybrid display panel.

Example 1 of Cross-Sectional Structure

Figure 16:
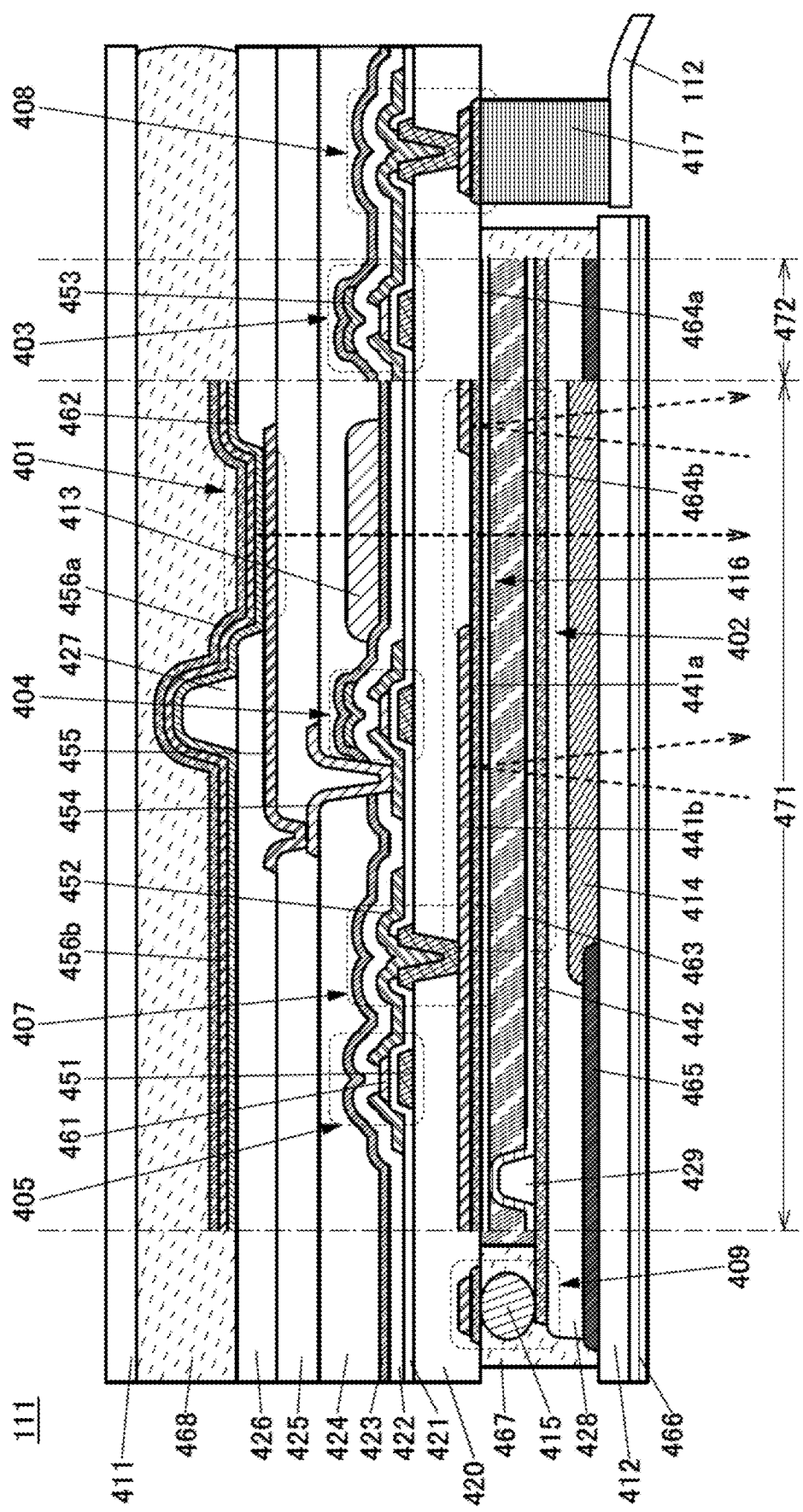
FIG. 16 is a cross-sectional view illustrating a structure example of a display panel.

FIG. 16 shows a cross-sectional structure example of the display panel 111. FIG. 16 illustrates an example of cross sections of a region including the FPC 112, a region 472 in the gate driver 313 or 314, and a region 471 in the pixel array 311.

The display panel 111 includes an insulating layer 420 between substrates 411 and 412. A light-emitting element 401, a transistor 403, a transistor 404, a transistor 405, a coloring layer 413, and the like are between the substrate 411 and the insulating layer 420. A liquid crystal element 402, a coloring layer 414, and the like are between the insulating layer 420 and the substrate 412. The substrate 412 and the insulating layer 420 are bonded to each other with an adhesive layer 467. The substrate 411 and the insulating layer 420 are bonded to each other with an adhesive layer 468.

A color filter that transmits light of red (R), green (G), blue (B), or the like can be used as each of the coloring layers 413 and 414. A color filter that transmits light of cyan (C), magenta (M), yellow (Y), or the like may be used as the coloring layer 414.

The transistor 405 is electrically connected to the liquid crystal element 402 and the transistor 404 is electrically connected to the light-emitting element 401. The transistor 404 and the transistor 405, which are both formed over a surface of the insulating layer 420 on the substrate 411 side, can be formed through the same process.

The coloring layer 414, a light-blocking layer 465, an insulating layer 428, a conductive layer 442 serving as a common electrode of the liquid crystal element 402, an alignment film 464b, an insulating layer 429, and the like are provided over the substrate 412. The insulating layer 429 serves as a spacer for holding a cell gap of the liquid crystal element 402.

An insulating layer 421, an insulating layer 422, an insulating layer 423, an insulating layer 424, an insulating layer 425, and the like are provided on the substrate 411 side of the insulating layer 420. Part of the insulating layer 421 serve as gate insulating layers of the transistors. The insulating layer 422, the insulating layer 423, and the insulating layer 424 cover the transistors. The insulating layer 425 covers the insulating layer 424. The insulating layers 424 and 425 each serve as a planarization layer. Note that the example here shows the case where the three insulating layers, the insulating layers 422, 423, and 424, are provided to cover the transistors and the like; however, one embodiment of the present invention is not limited to this example, and four or more insulating layers, a single insulating layer, or two insulating layers may be provided instead. When not needed, the insulating layer 424 functioning as a planarization layer is not necessarily provided.

The transistors 403, 404 and 405 each include a conductive layer 451 part of which functions as a gate, a conductive layer 452 part of which functions as a source or a drain, and a semiconductor layer 461. Here, a plurality of layers obtained by processing the same conductive film are shown with the same hatching pattern.

The liquid crystal element 402 is a reflective liquid crystal element. The liquid crystal element 402 has a multi-layer structure including a conductive layer 441a, a liquid crystal 463, and the conductive layer 442. In addition, a conductive layer 441b that reflects visible light is provided in contact with the substrate 411 side of the conductive layer 441a. The conductive layer 441b has an opening 416. The conductive layers 441a and 442 each contain a material transmitting visible light. An alignment film 464a is provided between the liquid crystal 463 and the conductive layer 441a, and the alignment film 464b is provided between the liquid crystal 463 and the conductive layer 442. A polarizing plate 466 is provided on an outer surface of the substrate 412.

In the liquid crystal element 402, the conductive layer 441b has a function of reflecting visible light, and the conductive layer 442 has a function of transmitting visible light. Light entering from the substrate 412 side is polarized by the polarizing plate 466, transmitted through the conductive layer 442 and the liquid crystal 463, and reflected by the conductive layer 441b. Then, the light goes through the liquid crystal 463 and the conductive layer 442 again and reaches the polarizing plate 466. At this time, alignment of the liquid crystal is controlled with a voltage that is applied between the conductive layer 441b and the conductive layer 442, by which optical modulation of light can be controlled. That is, the intensity of light that is ejected through the polarizing plate 466 can be controlled. Light other than one in a particular wavelength region of the incident light is absorbed by the coloring layer 414; thus, emitted light is, for example, red light.

The light-emitting element 401 is a bottom-emission light-emitting element. The light-emitting element 401 has a structure in which a conductive layer 455, an EL layer 462, and a conductive layer 456b are stacked in this order from the insulating layer 420 side. In addition, a conductive layer 456a is provided to cover the conductive layer 456b. The conductive layer 456b contains a material reflecting visible light, and the conductive layers 455 and 456a each contain a material transmitting visible light. Light is emitted from the light-emitting element 401 toward the substrate 412 through the coloring layer 413, the insulating layer 420, the opening 416, the conductive layer 442, and the like.

Here, as illustrated in FIG. 16, the conductive layer 441a transmitting visible light is preferably provided for the opening 416. Accordingly, the liquid crystal 463 in a region overlapping with the opening 416 is aligned in a similar manner as in the other regions, preventing undesired light leakage caused by an alignment defect of the liquid crystal in the boundary portion of the region overlapping with the opening 416 and the other regions.

As the polarizing plate 466 provided on an outer surface of the substrate 412, a linear polarizing plate or a circularly polarizing plate can be used. As the circularly polarizing plate, for example, a stack including a linear polarizing plate and a quarter-wave retardation plate can be used. Such a structure can reduce reflection of external light. A light diffusion plate may be provided to suppress reflection of external light. The cell gap, alignment, drive voltage, and the like of the liquid crystal element used as the liquid crystal element 402 are controlled depending on the kind of the polarizing plate so that desirable contrast is obtained.

An insulating layer 427 is provided over an insulating layer 426 covering an end portion of the conductive layer 455. The insulating layer 427 serves as a spacer for preventing the insulating layer 420 and the substrate 411 from getting closer than necessary. In addition, in the case where the EL layer 462 or the conductive layer 456a is formed using a blocking mask (metal mask), the insulating layer 427 may have a function of preventing the blocking mask from being in contact with a surface on which the EL layer 462 or the conductive layer 456a is formed. Note that the insulating layer 427 is not necessarily provided when not needed.

One of a source and a drain of the transistor 404 is electrically connected to the conductive layer 455 of the light-emitting element 401 through a conductive layer 454.

One of a source and a drain of the transistor 405 is electrically connected to the conductive layer 441b through a connection portion 407. The conductive layers 441b and 441a are in contact with and electrically connected to each other. Here, in the connection portion 407, the conductive layers provided on both surfaces of the insulating layer 420 are connected to each other in an opening in the insulating layer 420.

A connection portion 408 is provided in a region where the substrates 411 and 412 do not overlap with each other. The connection portion 408 is electrically connected to the FPC 112 through a connection layer 417. The connection portion 408 has a similar structure to the connection portion 407. On the top surface of the connection portion 408, a conductive layer obtained by processing the same conductive film as the conductive layer 441a is exposed. Thus, the connection portion 408 and the FPC 112 can be electrically connected to each other via the connection layer 417.

A connection portion 409 is provided in part of a region where the adhesive layer 467 is provided. In the connection portion 409, the conductive layer obtained by processing the same conductive film as the conductive layer 441a is electrically connected to the conductive layer 442 with a connector 415. Accordingly, a signal or a potential input from the FPC 112 connected on the substrate 411 side can be supplied to the conductive layer 442 formed on the substrate 412 side through the connection portion 409.

As the connector 415, a conductive particle can be used, for example. As the conductive particle, a particle of an organic resin, silica, or the like coated with a metal material can be used. Nickel or gold, which can reduce contact resistance, is preferably used as the metal material. It is also preferable to use a particle coated with layers of two or more kinds of metal materials, such as a particle coated with nickel and further with gold. As the connector 415, a material capable of elastic deformation or plastic deformation is preferably used. As illustrated in FIG. 16, the connector 415 that is the conductive particle has a shape that is vertically crushed in some cases. With the crushed shape, the contact area between the connector 415 and a conductive layer electrically connected to the connector 415 can be increased, thereby reducing contact resistance and suppressing the generation of problems such as disconnection.

The connector 415 is preferably provided to be covered with the adhesive layer 467. For example, the connectors 415 may be dispersed in the adhesive layer 467 that is not yet cured.

FIG. 16 illustrates the region 472 including the transistor 403, as an example of the region 472.

The structure in which the semiconductor layer 461 where a channel is formed is provided between two gates is used as an example of the transistors 403 and 404 in FIG. 16. One gate is formed by the conductive layer 451 and the other gate is formed by a conductive layer 453 overlapping with the semiconductor layer 461 with the insulating layer 422 provided therebetween. Such a structure enables control of threshold voltages of transistors. In that case, the two gate electrodes may be connected to each other and supplied with the same signal to operate the transistors. Such transistors can have a higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display panel in which the number of wirings is increased because of increase in size or definition.

Note that the transistor included in the region 472 and the transistor included in the region 471 may have the same structure. A plurality of transistors included in the region 472 may have the same structure or different structures. A plurality of transistors included in the region 471 may have the same structure or different structures.

A material through which impurities such as water or hydrogen do not easily diffuse is preferably used for at least one of the insulating layers 422 and 423 that cover the transistors. That is, the insulating layer 422 or the insulating layer 423 can serve as a barrier film. Such a structure can effectively suppress diffusion of the impurities into the transistors from the outside, and a highly reliable display panel can be provided.

The insulating layer 428 is provided on the substrate 412 side to cover the coloring layer 414 and the light-blocking layer 465. The insulating layer 428 may serve as a planarization layer. The insulating layer 428 enables the conductive layer 442 to have an almost flat surface, resulting in a uniform alignment state of the liquid crystal 463.

Example 2 of Cross-Sectional Structure

Figure 17:
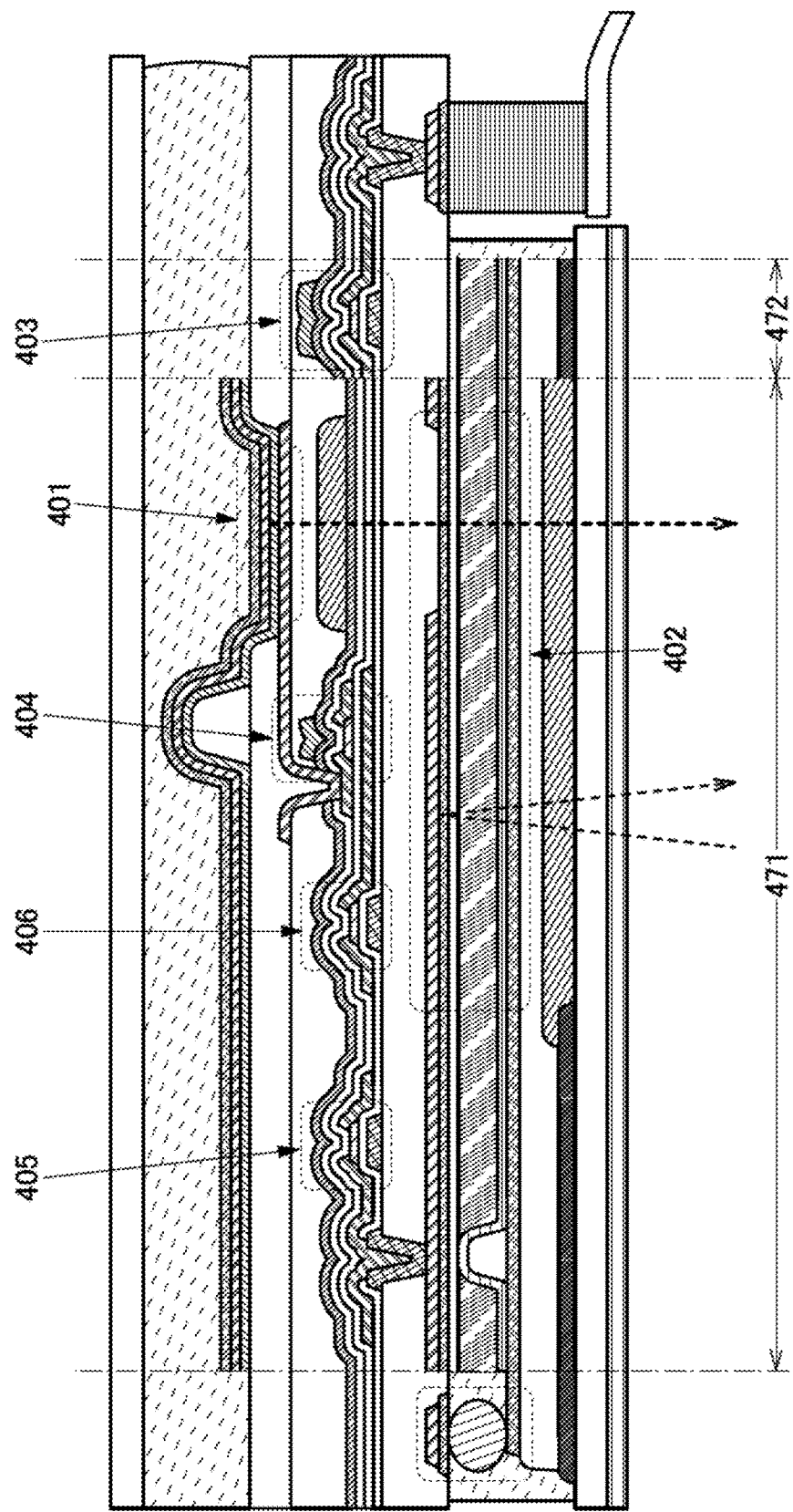
FIG. 17 is a cross-sectional view illustrating a structure example of a display panel.

The display panel of one embodiment of the present invention may include a region in which a first transistor and a second transistor that are provided in a pixel overlap with each other as illustrated in FIG. 17. Such a structure enables a fabrication of a display panel having a reduced area per pixel and a high pixel density that can display a high definition image.

For example, the display panel can include a region where the transistor 404 for driving the light-emitting element 401 and the transistor 406 overlap with each other. Alternatively, the display panel can include a region where the transistor 405 for driving the liquid crystal element 402 and one of the transistors 404 and 406 overlap with each other.

Example 3 of Cross-Sectional Structure

Figure 18:
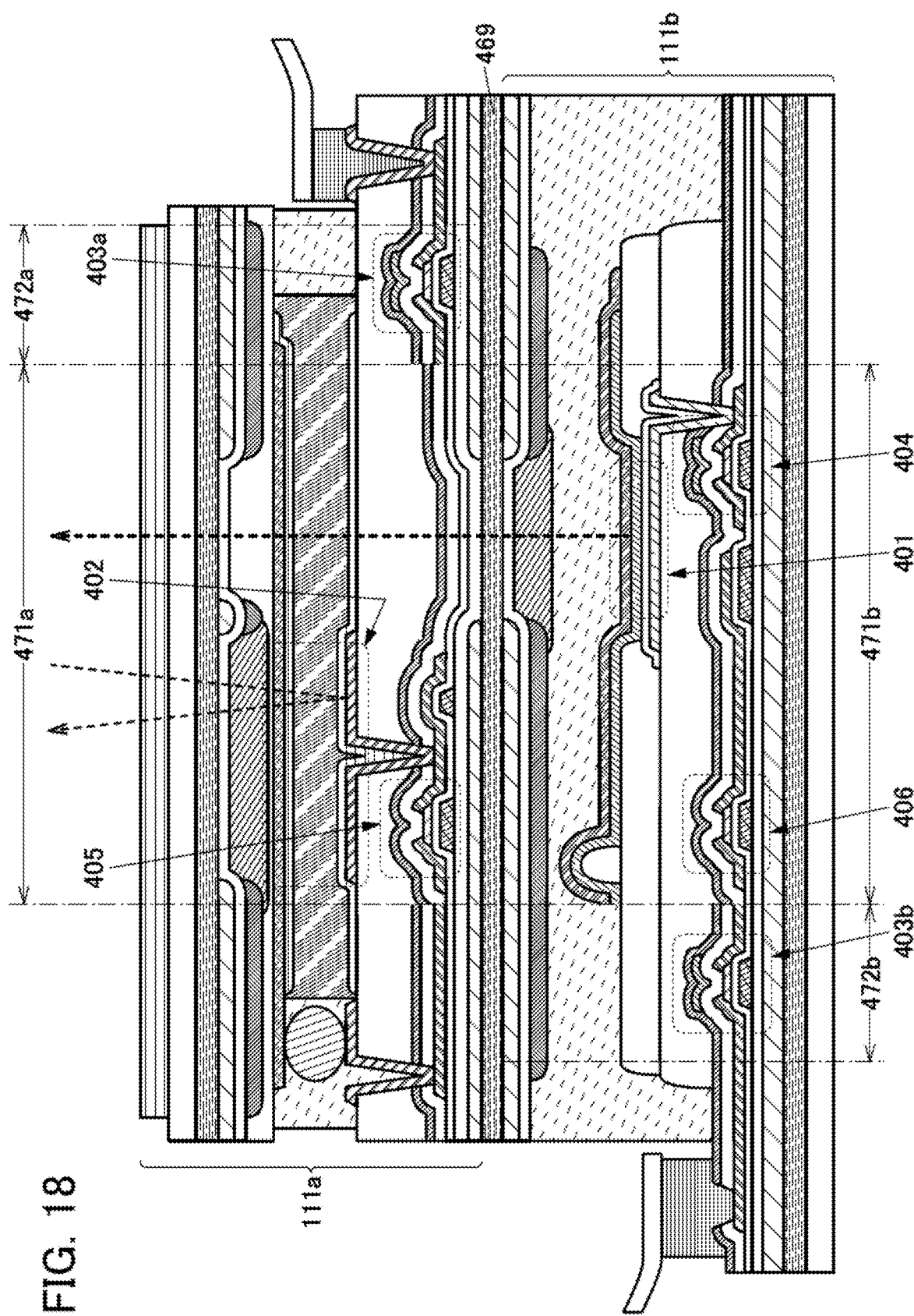
FIG. 18 is a cross-sectional view illustrating a structure example of a display panel.

A display panel of one embodiment of the present invention may have a structure in which a display panel 111a and a display panel 111b are bonded to each other with an adhesive layer 469 as illustrated in FIG. 18. The display panel 111a includes the liquid crystal element 402 and the transistor 405 in a region 471a and includes a transistor 403a in a region 472a for driving the region 471a. The display panel 111b includes the light-emitting element 401 and the transistors 404 and 406 in a region 471b and includes a transistor 403b in a region 472b for driving the region 471b.

Such a structure enables the display panel 111a and the display panel 111b to be manufactured through their respective proper processes, leading to improvement in manufacturing yield.

<<Components>>

The above components will be described below.

<Substrate>

A material having a flat surface can be used as the substrate included in the display panel. The substrate through which light emitted from the display element is extracted is formed using a material that transmits the light. For example, a material such as glass, quartz, ceramic, sapphire, or an organic resin can be used.

The weight and thickness of the display panel can be decreased by using a thin substrate. A flexible display panel can be obtained by using a substrate that is thin enough to have flexibility.

Since the substrate through which light emission is not extracted does not need to have a light-transmitting property, a metal substrate or the like can be used in addition to the above-mentioned substrates. A metal material, which has high thermal conductivity, is preferable because it can easily conduct heat to the whole substrate and accordingly can prevent a local temperature rise in the display panel. To obtain flexibility or bendability, the thickness of a metal substrate is preferably greater than or equal to 10 μm and less than or equal to 200 μm, more preferably greater than or equal to 20 μm and less than or equal to 50 μm.

Although there is no particular limitation on a material of a metal substrate, it is favorable to use, for example, a metal such as aluminum, copper, or nickel, an aluminum alloy, or an alloy such as stainless steel.

It is possible to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of a material that has flexibility and transmits visible light include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE). In particular, a material whose thermal expansion coefficient is low is preferred, and for example, a polyamide imide resin, a polyimide resin, or PET with a thermal expansion coefficient of $30 \times 10^{-6}$/K or less can be suitably used. A substrate in which a glass fiber is impregnated with an organic resin or a substrate whose thermal expansion coefficient is reduced by mixing an organic resin with an inorganic filler can also be used. A substrate using such a material is lightweight, and thus a display panel using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, a glass fiber using E glass, S glass, D glass, Q glass, and the like can be given. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against breaking due to bending or local pressure can be increased.

Alternatively, glass, metal, or the like that is thin enough to have flexibility can be used as the substrate. Alternatively, a composite material where glass and a resin material are attached to each other with an adhesive layer may be used.

A hard coat layer (e.g., a silicon nitride layer and an aluminum oxide layer) by which a surface of a display panel is protected from damage, a layer (e.g., an aramid resin layer) that can disperse pressure, or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. When a glass layer is included, a barrier property against water and oxygen can be improved and thus a highly reliable display panel can be provided.

<Transistor>

The transistors each include the conductive layer functioning as the gate electrode, the semiconductor layer, the conductive layer functioning as the source electrode, the conductive layer functioning as the drain electrode, and the insulating layer functioning as a gate insulating layer. In the above examples, a bottom-gate transistor is used.

Note that there is no particular limitation on the structure of the transistor included in the display panel of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor with a metal oxide having a larger band gap and a lower carrier density than silicon has a low off-state current; therefore, charges stored in a capacitor that is series-connected to the transistor can be held for a long time.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the metal oxide contained in the semiconductor layer contains an In-M-Zn-based oxide, it is preferable that the atomic ratio of metal elements of a sputtering target used for forming a film of the In-M-Zn oxide satisfy In≥M and Zn≥M The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the formed oxide semiconductor layer varies from the above atomic ratios of metal elements of the sputtering targets in a range of ±40%.

The bottom-gate transistor described in this embodiment is preferable because the number of manufacturing steps can be reduced. When a metal oxide, which can be formed at a lower temperature than polycrystalline silicon, is used, materials with low heat resistance can be used for a wiring, an electrode, or a substrate below the semiconductor layer, so that the range of choices of materials can be widened. For example, an extremely large glass substrate can be favorably used.

A metal oxide film with low carrier density is used as the semiconductor layer. For example, the semiconductor layer can include a metal oxide whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$, even more preferably lower than $1\times10^{10}/cm^3$, and higher than or equal to $1\times10^{-9}/cm^3$. Such a metal oxide is referred to as a highly purified intrinsic or substantially highly purified intrinsic metal oxide. The metal oxide has a low impurity concentration and a low density of defect states and can thus be referred to as a metal oxide having stable characteristics.

However, the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in the metal oxide contained in the semiconductor layer, oxygen vacancies are increased in the semiconductor layer, and the semiconductor layer becomes n-type. Thus, the concentration of silicon or carbon (measured by secondary ion mass spectrometry) in the semiconductor layer is set lower than or equal to $2\times10^{18}$ atoms/cm$^3$, preferably lower than or equal to $2\times10^{17}$ atoms/cm$^3$.

Alkali metal and alkaline earth metal might generate carriers when bonded to a metal oxide, in which case the off-state current of the transistor might be increased. Therefore, the concentration of alkali metal or alkaline earth metal of the semiconductor layer, which is measured by secondary ion mass spectrometry, is set lower than or equal to $1\times10^{18}$ atoms/cm$^3$, preferably lower than or equal to $2\times10^{16}$ atoms/cm$^3$.

When nitrogen is contained in the metal oxide contained in the semiconductor layer, electrons serving as carriers are generated and the carrier density increases, so that the semiconductor layer easily becomes n-type. Thus, a transistor including a metal oxide that contains nitrogen is likely to be normally on. Hence, the concentration of nitrogen which is measured by secondary ion mass spectrometry is preferably set lower than or equal to $5\times10^{18}$ atoms/cm$^3$.

The semiconductor layer may have a non-single-crystal structure, for example. The non-single-crystal structure includes CAAC-OS (c-axis aligned crystalline oxide semiconductor, or c-axis aligned a-b-plane-anchored crystalline oxide semiconductor) including a c-axis aligned crystal, a polycrystalline structure, a microcrystalline structure, or an amorphous structure, for example. Among the non-single-crystal structures, the amorphous structure has the highest density of defect states, whereas CAAC-OS has the lowest density of defect states.

A metal oxide film having an amorphous structure has disordered atomic arrangement and no crystalline component, for example. Alternatively, the oxide films having an amorphous structure have, for example, an absolutely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single crystal structure. The mixed film has, for example, a single-layer structure or a multi-layer structure including two or more of the above regions in some cases.

<Composition of CAC-OS>

The composition of a CAC-OS that can be used for a transistor disclosed in one embodiment of the present invention is described below.

In this specification and the like, a metal oxide means an oxide of metal in a broad sense. Metal oxides are classified into an oxide insulator, an oxide conductor (including a transparent oxide conductor), an oxide semiconductor, and the like. For example, a metal oxide used in an active layer of a transistor is called an oxide semiconductor in some cases. In other words, an OS FET is a transistor including a metal oxide or an oxide semiconductor.

In this specification, a metal oxide in which regions functioning as a conductor and regions functioning as a dielectric are mixed and which functions as a semiconductor as a whole is defined as a CAC-OS or a CAC-metal oxide.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 0.5 nm and less than or equal to 3 nm, or a similar size. Note that in the following description of an oxide semiconductor, a state in which one or more elements are unevenly distributed and regions including the element(s) are mixed is referred to as a mosaic pattern or a patch-like pattern. The region has a size of greater than or equal to 0.5 nm and less than or equal to 10 nm, preferably greater than or equal to 0.5 nm and less than or equal to 3 nm, or a similar size.

The physical properties of a region including an unevenly distributed element are determined by the properties of the element. For example, a region including an unevenly distributed element which relatively tends to serve as an insulator among elements included in a metal oxide serves as a dielectric region. In contrast, a region including an unevenly distributed element which relatively tends to serve as a conductor among elements included in a metal oxide serves as a conductive region. A material in which conductive regions and dielectric regions are mixed to form a mosaic pattern serves as a semiconductor.

That is, a metal oxide in one embodiment of the present invention is a kind of matrix composite or metal matrix composite, in which materials having different physical properties are mixed.

Note that an oxide semiconductor preferably contains at least indium. In particular, indium and zinc are preferably contained. In addition, an element M (M is one or more of gallium, aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a multi-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part thereof, and these nanoparticle regions are randomly dispersed to form a mosaic pattern in the CAC-OS.

<Analysis of CAC-OS>

Next, measurement results of an oxide semiconductor over a substrate by a variety of methods are described.

<Structure of Samples and Formation Method Thereof>

Nine samples of one embodiment of the present invention are described below. The samples are formed at different substrate temperatures and with different ratios of an oxygen gas flow rate in formation of the oxide semiconductor. Note that each sample includes a substrate and an oxide semiconductor over the substrate.

A method for forming the samples is described.

A glass substrate is used as the substrate. Over the glass substrate, a 100-nm-thick In—Ga—Zn oxide is formed in an oxide semiconductor with a sputtering apparatus. The formation conditions are as follows: the pressure in a chamber is 0.6 Pa, and an oxide target (with an atomic ratio of In:Ga:Zn=4:2:4.1) is used as a target. The oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as room temperature or R. T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

<Analysis by X-Ray Diffraction>

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg/min.

Figure 19:
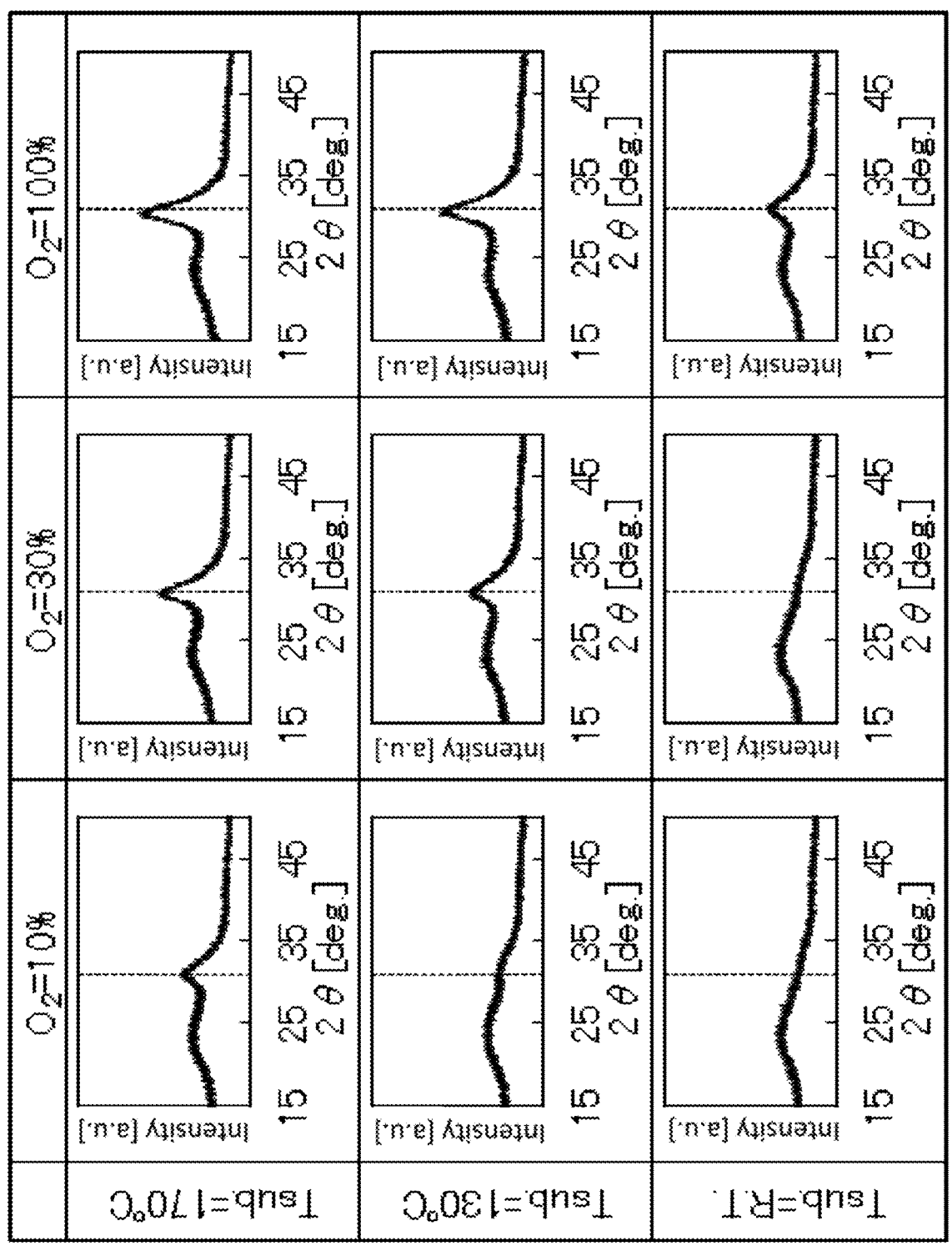
FIG. 19 shows measured XRD spectra of samples.

FIG. 19 shows XRD spectra measured by an out-of-plane method. In FIG. 19, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R. T. The left column shows the measurement results of the samples formed with an oxygen gas flow rate ratio of 10%; the middle column shows the measurement results of the samples formed with an oxygen gas flow rate ratio of 30%; the right column shows the measurement results of the samples formed with an oxygen gas flow rate ratio of 100%.

In the XRD spectra shown in FIG. 19, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 19, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

<Analysis with Electron Microscope>

This section describes the observation and analysis results of the samples formed at a substrate temperature of R. T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 20A is a plan-view TEM image of the sample formed at a substrate temperature of R. T. and with an oxygen gas flow rate ratio of 10%. FIG. 20B is a cross-sectional TEM image of the sample formed at a substrate temperature of R. T. and with an oxygen gas flow rate ratio of 10%.

<Analysis of Electron Diffraction Patterns>

This section describes electron diffraction patterns obtained by irradiation of the sample formed at a substrate temperature of R. T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 20A of the sample formed at a substrate temperature of R. T. and an oxygen gas flow rate ratio of 10% are observed. Note that the electron diffraction patterns are observed while electron beam irradiation is performed at a constant rate for 35 seconds. FIGS. 20C, 20D, 20E, 20F, and 20G show the results of the points indicated by the black dots a1, a2, a3, a4, and a5, respectively.

In FIGS. 20C, 20D, 20E, 20F, and 20G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 20B of the sample formed at a substrate temperature of R. T. and an oxygen gas flow rate ratio of 10% are observed. FIGS. 20H, 20I, 20J, 20K, and 20L show the results of the points indicated by the black dots b1, b2, b3, b4, and b5, respectively.

In FIGS. 20H, 20I, 20J, 20K, and 20L, regions with high luminance in a ring pattern can be shown. Furthermore, a plurality of spots can be shown in a ring-like shape.

For example, when an electron beam with a probe diameter of 300 nm is incident on a CAAC-OS including an $InGaZnO_4$ crystal in a direction parallel to the sample surface, a diffraction pattern including a spot derived from the (009) plane of the $InGaZnO_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R. T. and with an oxygen gas flow rate ratio of 10% has regions with high luminance in a ring pattern and a plurality of bright spots appear in the ring-like pattern. Accordingly, the sample formed at a substrate temperature of R. T. and with an oxygen gas flow rate ratio of 10% exhibits an electron diffraction pattern similar to that of the nc-OS and does not show alignment in the plane direction and the cross-sectional direction.

According to what is described above, an oxide semiconductor formed at a low substrate temperature or with a low oxygen gas flow rate ratio is likely to have characteristics distinctly different from those of an oxide semiconductor film having an amorphous structure and an oxide semiconductor film having a single crystal structure.

<Elementary Analysis>

This section describes the analysis results of elements included in the sample formed at a substrate temperature of R. T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this embodiment, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

FIGS. 21A to 21C show EDX mapping images in a cross section of the sample formed at a substrate temperature of R. T. and with an oxygen gas flow rate ratio of 10%. FIG. 21A shows an EDX mapping image of Ga atoms. The proportion of the Ga atoms in all the atoms is 1.18 atomic % to 18.64 atomic %. FIG. 21B shows an EDX mapping image of In atoms. The proportion of the In atoms in all the atoms is 9.28 atomic % to 33.74 atomic %. FIG. 21C shows an EDX mapping image of Zn atoms. The proportion of the Zn atoms in all the atoms is 6.69 atomic % to 24.99 atomic %. FIGS. 21A to 21C show the same region in the cross section of the sample formed at a substrate temperature of R. T. and with an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 21A to 21C is 7200000 times.

The EDX mapping images in FIGS. 21A to 21C show relative distribution of brightness indicating that each element has a distribution in the sample formed at a substrate temperature of R. T. and with an oxygen gas flow rate ratio of 10%. Areas surrounded by solid lines and areas surrounded by dashed lines in FIGS. 21A to 21C are examined.

In FIG. 21A, a relatively dark region occupies a large area in the area surrounded by the solid line, while a relatively bright region occupies a large area in the area surrounded by the dashed line. In FIG. 21B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 21C, the right portion of the area surrounded by the solid line is relatively bright and the left portion thereof is relatively dark. Thus, the area surrounded by the solid line is a region including $In_{x2}Zn_{y2}O_{z2}$, $InO_{x1}$, or the like as a main component.

The area surrounded by the solid line is a region including a relatively small number of Ga atoms and the area surrounded by the dashed line is a region including a relatively large number of Ga atoms. In FIG. 21C, the upper left portion of the area surrounded by the dashed line is relatively bright and the lower right portion thereof is relatively dark. Thus, the area surrounded by the dashed line is a region including $GaO_{x3}$, $Ga_{x4}Zn_{y4}O_{z4}$, or the like as a main component.

Furthermore, as shown in FIGS. 21A to 21C, the In atoms are relatively more uniformly distributed than the Ga atoms, and regions including $InO_{x1}$ as a main component are seemingly joined to each other through a region including $In_{x2}Zn_{y2}O_{z2}$ as a main component. Thus, the regions including $In_{x2}Zn_{y2}O_{z2}$ and $InO_{x1}$ as main components extend like a cloud.

An In—Ga—Zn oxide having a composition in which the regions including $GaO_{x3}$ or the like as a main component and the regions including $In_{x2}Zn_{y2}O_{z2}$ or $InO_{x1}$ as a main component are unevenly distributed and mixed can be referred to as a CAC-OS.

The crystal structure of the CAC-OS includes an nc structure. In an electron diffraction pattern of the CAC-OS with the nc structure, several or more bright spots appear in addition to bright sports derived from IGZO including a single crystal, a polycrystal, or a CAAC. Alternatively, the crystal structure is defined as having high luminance regions appearing in a ring pattern in addition to the several or more bright spots.

As shown in FIGS. 21A to 21C, each of the regions including $GaO_{x3}$ or the like as a main component and the regions including $In_{x2}Zn_{y2}O_{z2}$ or $InO_{x1}$ as a main component has a size of greater than or equal to 0.5 nm and less than or equal to 10 nm, or greater than or equal to 1 nm and less than or equal to 3 nm. Note that it is preferable that a diameter of a region including each metal element as a main component be greater than or equal to 1 nm and less than or equal to 2 nm in the EDX mapping images.

As described above, the CAC-OS has a structure different from that of an IGZO compound in which metal elements are evenly distributed, and has characteristics different from those of the IGZO compound. That is, in the CAC-OS, regions including $GaO_{x3}$ or the like as a main component and regions including $In_{x2}Zn_{y2}O_{z2}$ or $InO_{x1}$ as a main component are separated to form a mosaic pattern.

The conductivity of a region including $In_{x2}Zn_{y2}O_{z2}$ or $InO_{x1}$ as a main component is higher than that of a region including $GaO_{x3}$ or the like as a main component. In other words, when carriers flow through regions including $In_{x2}Zn_{y2}O_{z2}$ or $InO_{x1}$ as a main component, the conductivity of an oxide semiconductor is exhibited. Accordingly, when regions including $In_{x2}Zn_{y2}O_{z2}$ or $InO_{x1}$ as a main component are distributed in an oxide semiconductor like a cloud, high field-effect mobility ($\mu$) can be achieved.

In contrast, the insulating property of a region including $GaO_{x3}$ or the like as a main component is higher than that of a region including $In_{x2}Zn_{y2}O_{z2}$ or $InO_{x1}$ as a main component. In other words, when regions including $GaO_{x3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{x3}$ or the like and the conductivity derived from $In_{x2}Zn_{y2}O_{z2}$ or $InO_{x1}$ complement each other, whereby high on-state current ($I_{on}$) and high field-effect mobility ($\mu$) can be achieved.

A semiconductor element including a CAC-OS has high reliability. Thus, the CAC-OS is suitably used in a variety of semiconductor devices such as a display panel.

Since a transistor including a CAC-OS in the semiconductor layer has high field-effect mobility and high driving capability, a display device that includes the transistor in a driver circuit (a typical example of the driver circuit is a gate driver that drives a gate signal) can have a narrow bezel. Furthermore, the use of the transistor in a source driver that supplies a data signal to a source line of the display panel allows the display device to have a reduced number of connected wirings.

Furthermore, a transistor including a CAC-OS in the semiconductor layer does not need a laser crystallization step unlike a transistor including low-temperature polysilicon. Thus, the manufacturing cost of a display panel can be reduced, even when the display panel is formed using a large substrate. The transistors each including a CAC-OS in the semiconductor layer is preferably used in a driver circuit such as a gate driver and a pixel array of a large display device having high resolution such as ultra high definition (4K2K) or super high definition (8K4K), in which case writing time can be shortened.

Alternatively, silicon may be used as a semiconductor in which a channel of a transistor is formed. Silicon may be amorphous silicon but is preferably silicon having crystallinity, such as microcrystalline silicon, polycrystalline silicon, or single crystal silicon. In particular, polycrystalline silicon can be formed at a lower temperature than single crystal silicon and has higher field-effect mobility and higher reliability than amorphous silicon.

The bottom-gate transistor described in this embodiment is preferable in light of reduction in the number of manufacturing steps. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate can be favorably used. Meanwhile, a top-gate transistor is preferable because it enables easy formation of an impurity region in a self-aligned manner and reduces variation in characteristics. The top-gate transistor is particularly preferable in the case of using polycrystalline silicon, single crystal silicon, or the like.

<Conductive Layer>

As a gate, a source, and a drain of a transistor, and a wiring or an electrode included in a display panel, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because it increases controllability of shape processing by etching.

As a light-transmitting conductive material, a conductive oxide such as indium oxide, indium tin oxide, indium zinc oxide, zinc oxide, or zinc oxide to which gallium is added, or graphene can be used. It is also possible to use a metal material such as gold, silver, platinum, magnesium, nickel, tungsten, chromium, molybdenum, iron, cobalt, copper, palladium, or titanium; an alloy material containing any of these metal materials; or a nitride of any of these metal materials (e.g., titanium nitride). In the case of using the metal material or the alloy material (or the nitride thereof), the film thickness is set small enough to transmit light. Alternatively, a multi-layer film of any of the above materials can be used for the conductive layers. For example, a multi-layer film of indium tin oxide and an alloy of silver and magnesium is preferably used because it can increase the conductivity. They can be used for conductive layers such as a variety of wirings and electrodes included in a display panel.

<Insulating Layer>

Examples of an insulating material that can be used for the insulating layers include a resin such as acrylic or epoxy resin, a resin having a siloxane bond, and an inorganic insulating material such as silicon oxide, silicon oxynitride, silicon nitride oxide, silicon nitride, or aluminum oxide.

The light-emitting element is preferably provided between a pair of insulating films with low water permeability, in which case impurities such as water can be prevented from entering the light-emitting element. Thus, a decrease in device reliability can be prevented.

Examples of the insulating film with low water permeability include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

<Liquid Crystal Element>

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes. For example, a liquid crystal element using a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an electrically controlled birefringence (ECB) mode, or a guest-host mode can be used.

The liquid crystal element controls transmission or non-transmission of light utilizing an optical modulation action of liquid crystal. The optical modulation action of liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), polymer network liquid crystal (PNLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, either of a positive liquid crystal and a negative liquid crystal may be used, and an appropriate liquid crystal material can be used depending on the mode or design to be used.

An alignment film can be provided to adjust the alignment of a liquid crystal. In the case where a horizontal electric field mode is employed, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition which includes liquid crystal exhibiting a blue phase and a chiral material has a short response time and optical isotropy, which makes the alignment process unneeded. In addition, the liquid crystal composition which includes liquid crystal exhibiting a blue phase and a chiral material has a small viewing angle dependence. In addition, since an alignment film does not need to be provided and rubbing treatment is unnecessary, electrostatic discharge caused by the rubbing treatment can be prevented and defects and damage of the liquid crystal display panel can be reduced in the manufacturing process.

The liquid crystal element may be a transmissive liquid crystal element, a reflective liquid crystal element, a semi-transmissive liquid crystal element, or the like.

In one embodiment of the present invention, in particular, the reflective liquid crystal element can be used.

In the case where a transmissive or semi-transmissive liquid crystal element is used, two polarizing plates are provided such that a pair of substrates are sandwiched therebetween. Furthermore, a backlight is provided on the outer side of the polarizing plate. As the backlight, a direct-below backlight or an edge-light backlight may be used. A direct-below backlight including an LED, with which local dimming is easily performed and contrast can be increased, is preferably used. The edge-light backlight is preferably used to reduce the thickness of a module including the backlight.

In the case where a reflective liquid crystal element is used, a polarizing plate is provided on the display surface side. In addition, a light diffusion plate is preferably provided on the display surface side to improve visibility.

In the case where the reflective or the semi-transmissive liquid crystal element is used, a front light may be provided outside the polarizing plate. As the front light, an edge-light front light is preferably used. A front light including a light-emitting diode (LED) is preferably used to reduce power consumption.

<Light-Emitting Element>

As the light-emitting element, a self-luminous element can be used, and an element whose luminance is controlled by current or voltage is included in the category of the light-emitting element. For example, an organic EL, an inorganic EL, a QLED, or an LED can be used.

The light-emitting element has a top emission structure, a bottom emission structure, a dual emission structure, or the like. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, light-emitting substances are selected so that two or more kinds of light-emitting substances emit complementary colors to provide white light emission. Specifically, it is preferable to contain two or more selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). An emission spectrum of a material that emits light having a peak in a yellow wavelength range preferably includes spectral components also in green and red wavelength ranges.

A light-emitting layer containing a light-emitting material emitting light of one color and a light-emitting layer containing a light-emitting material emitting light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be used when formed thin enough to have a light-transmitting property. Alternatively, a multi-layer film of any of the above materials can be used for the conductive layers. For example, a multi-layer film of indium tin oxide and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the above conductive film that transmits visible light and a film containing a metal material may be stacked. For example, a stack of silver and indium tin oxide, a stack of an alloy of silver and magnesium and indium tin oxide, or the like can be used.

Each of the electrodes can be formed by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, the quantum dot used for the light-emitting layer can serve as a light-emitting material.

The quantum dot may be a colloidal quantum dot, an alloyed quantum dot, a core-shell quantum dot, a core quantum dot, or the like. The quantum dot containing elements belonging to Groups 12 and 16, elements belonging to Groups 13 and 15, or elements belonging to Groups 14 and 16, may be used. Alternatively, the quantum dot containing an element such as cadmium, selenium, zinc, sulfur, phosphorus, indium, tellurium, lead, gallium, arsenic, or aluminum may be used.

<Adhesive Layer>

For the adhesive layers, any of a variety of types of curable adhesives, e.g., a light curable adhesive such as a UV curable adhesive, a reactive curable adhesive, a heat curable adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like. In particular, a material with low moisture permeability, such as an epoxy resin, is preferred. Alternatively, a two-component resin may be used. Still alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, zirconium, or the like can be used.

<Connection Layer>

As the connection layers, an anisotropic conductive film (ACF), an anisotropic conductive paste (ACP), or the like can be used.

<Coloring Layer>

As examples of a material that can be used for the coloring layers, a metal material, a resin material, and a resin material containing a pigment or dye can be given.

<Light-Blocking Layer>

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Multi-layer films containing the material of the coloring layer can also be used for the light-blocking layer. For example, a multi-layer structure including a film containing a material of a coloring layer which transmits light of a certain color and a film containing a material of a coloring layer which transmits light of another color can be employed. The coloring layer and the light-blocking layer are preferably formed using the same material, in which case the same manufacturing apparatus can be used and the process can be simplified.

At least part of this embodiment can be implemented in appropriate combination with any of the other embodiments.

Embodiment 4

This embodiment will describe a data processing device in which the display device of any of the above embodiments can be used, with reference to FIGS. 22A to 22E and FIGS. 23A to 23E.

Figure 22A:
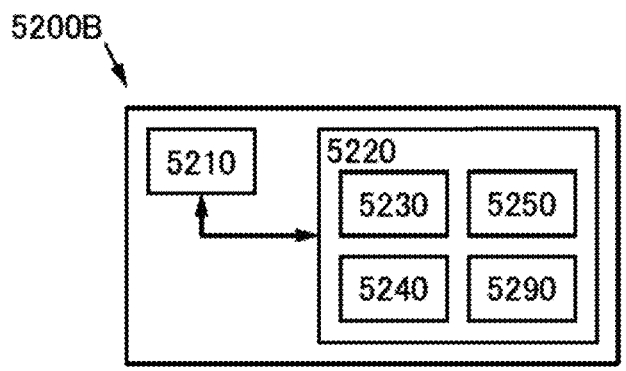
FIGS. 22A to 22E illustrate structures of data processing devices.

FIGS. 22A to 22E and FIGS. 23A to 23E each illustrates a structure of a data processing device of one embodiment of the present invention. FIG. 22A is a block diagram of the data processing device, and FIGS. 22B to 22E are perspective views each illustrating a structure of the data processing device. FIGS. 23A to 23E are perspective views each illustrating a structure of the data processing device.

<Data Processing Device>

A data processing device 5200B described in this embodiment includes an arithmetic device 5210 and an input-output device 5220 (see FIG. 22A).

The arithmetic device 5210 has a function of receiving operation data, and a function of supplying image data on the basis of the operation data.

The input-output device 5220 includes a display portion 5230, an input portion 5240, a sensor portion 5250, and a communication portion 5290. The input-output device 5220 has a function of supplying the operation data and a function of receiving the image data. Furthermore, the input-output device 5220 has a function of supplying sensing data, a function of supplying communication data, and a function of receiving communication data.

The input portion 5240 has a function of supplying the operation data. For example, the input portion 5240 supplies the operation data in accordance with an operation by a user of the data processing device 5200B.

Specifically, a keyboard, a hardware button, a pointing device, a touch sensor, an audio input device, an eye-gaze input device, or the like can be used for the input portion 5240.

The display portion 5230 has a function of displaying the image data. For example, the display panel 111 described in the above embodiment can be used in the display portion 5230.

The sensor portion 5250 has a function of supplying the sensing data. For example, the sensor portion 5250 has a function of sensing a circumstance environment where the data processing device is used, and supplying the data as the sensing data.

Specifically, an illuminance sensor, an imaging device, an attitude detection device, a pressure sensor, a human sensor, or the like can be used for the sensor portion 5250.

The communication portion 5290 has a function of receiving the communication data and a function of supplying the communication data. For example, the communication portion 5290 has a function of connecting to another electronic device or a communication network through wired or wireless communication. Specifically, the communication portion 5290 has a function of wireless local area network communication, telephone communication, near field communication, or the like.

Structure Example 1 of Data Processing Device

Figure 22B:
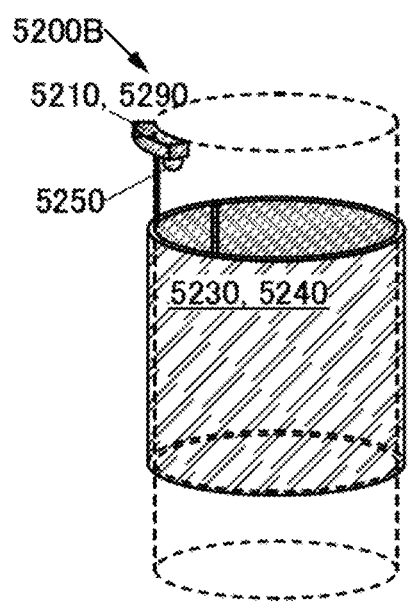

For example, the display portion 5230 can have an outer shape along a cylindrical column (see FIG. 22B). The display portion 5230 can change its display method in accordance with the illuminance of a usage environment. In addition, the display portion 5230 can change the displayed content in response to sensed existence of a person. This allows the data processing device 5200B to be provided on a column of a building, for example. The data processing device 5200B can display advertising, guidance, or the like. The data processing device 5200B can be used as digital signage.

Structure Example 2 of Data Processing Device

Figure 22C:
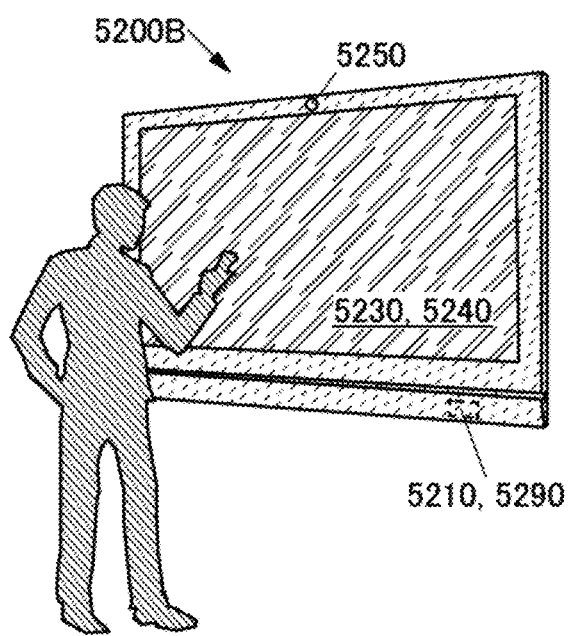

For example, the data processing device 5200B has a function of generating image data on the basis of the trajectory of a pointer used by a user (see FIG. 22C). Specifically, the display panel with a diagonal line of 20 inches or longer, preferably 40 inches or longer, more preferably 55 inches or longer can be used. Alternatively, a plurality of display panels can be arranged in one display region. Alternatively, a plurality of display panels can be arranged and used for multiscreen. Thus, the data processing device 5200B can be used for an electronic blackboard, an electronic bulletin board, or digital signage, for example.

Structure Example 3 of Data Processing Device

Figure 22D:
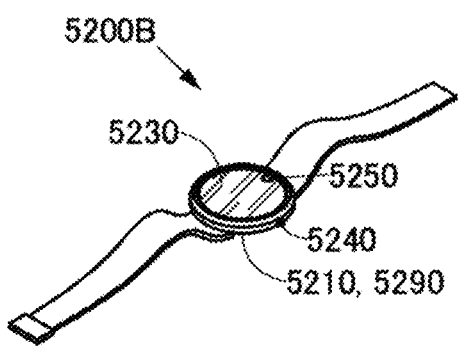

For example, the data processing device 5200B has a function of changing a display method in accordance with the illuminance of a usage environment (see FIG. 22D). Thus, for example, the power consumption of a smartwatch can be reduced. Alternatively, for example, a smartwatch can display an image in such a manner that the smartphone can be suitably used in an environment under strong external light, e.g., outdoors in fine weather.

Structure Example 4 of Data Processing Device

Figure 22E:
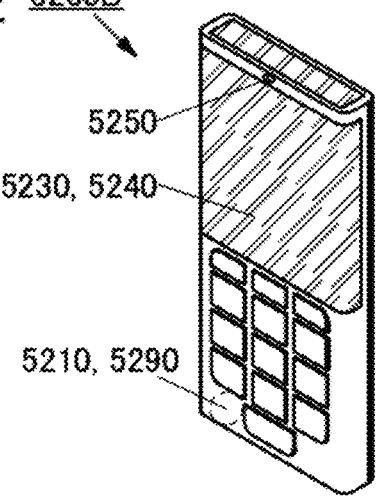

For example, the display portion 5230 has a curved surface that gently curves along a side surface of a housing (see FIG. 22E). Alternatively, the display portion 5230 has a display panel that can display an image on the front surface, the side surfaces, and the top surface, for example. Accordingly, the image data can be displayed on the side surfaces and the top surface of a mobile phone in addition to the front surface, for example.

Structure Example 5 of Data Processing Device

Figure 23A:
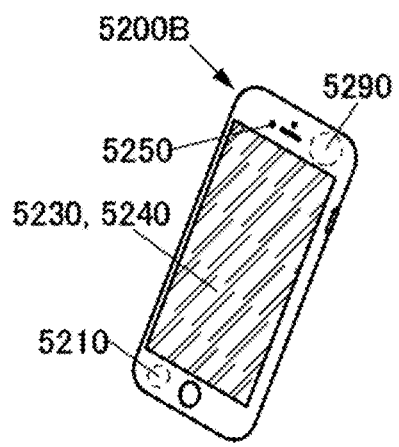
FIGS. 23A to 23E illustrate structures of data processing devices.

For example, the data processing device 5200B has a function of changing a display method in accordance with the illuminance of a usage environment (see FIG. 23A). Thus, for example, the power consumption of a smartphone can be reduced. Alternatively, for example, a smartphone can display an image in such a manner that the smartphone can be suitably used in an environment under strong external light, e.g., outdoors in fine weather.

Structure Example 6 of Data Processing Device

Figure 23B:
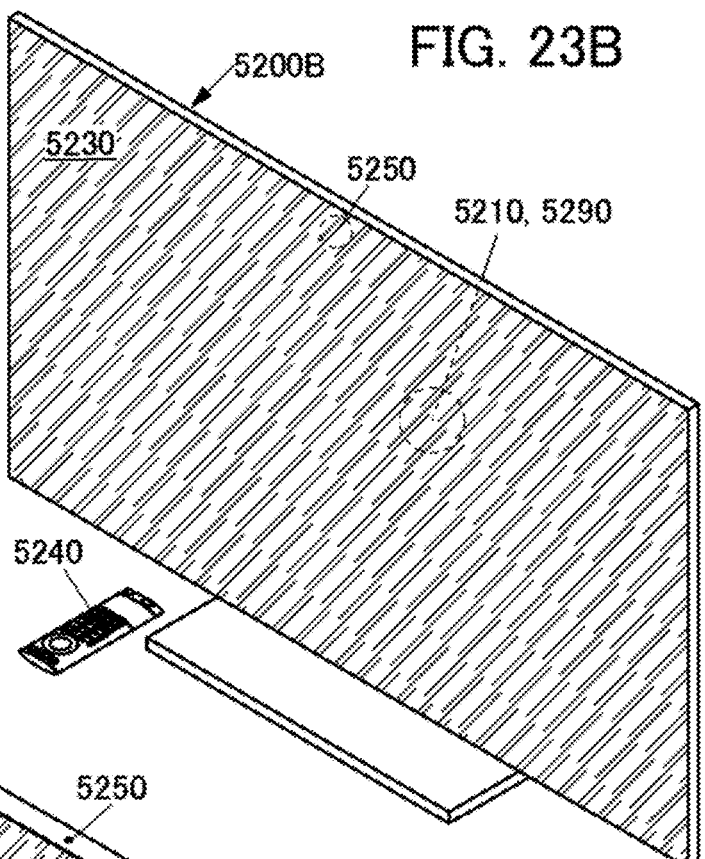

For example, the data processing device 5200B has a function of changing a display method in accordance with the illuminance of a usage environment (see FIG. 23B). Accordingly, a television system can display an image in such a manner that the television system can be suitably used even when irradiated with strong external light that enters the room from the outside in fine weather.

Structure Example 7 of Data Processing Device

Figure 23C:
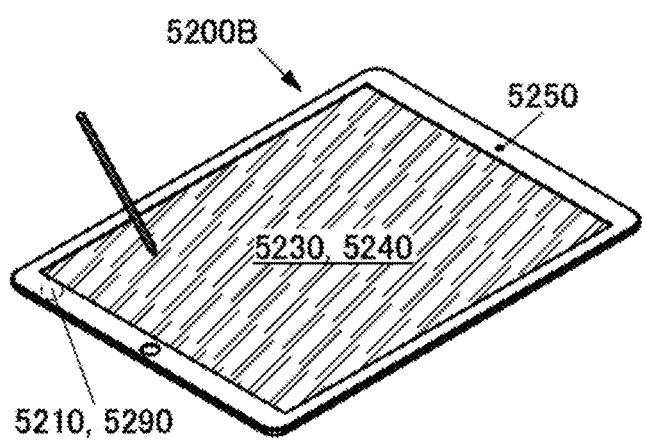

For example, the data processing device 5200B has a function of changing a display method in accordance with the illuminance of a usage environment (see FIG. 23C). Accordingly, for example, a tablet computer can display an image in such a manner that the tablet computer can be suitably used in an environment under strong external light, e.g., outdoors in fine weather.

Structure Example 8 of Data Processing Device

Figure 23D:
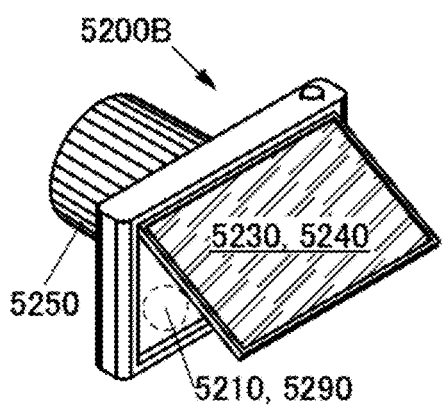

For example, the data processing device 5200B has a function of changing a display method in accordance with the illuminance of a usage environment (see FIG. 23D). Accordingly, for example, a digital camera can display an image of an object to be captured in such a manner that the displayed image can be clearly seen in an environment under strong external light, e.g., outdoors in fine weather.

Structure Example 9 of Data Processing Device

Figure 23E:
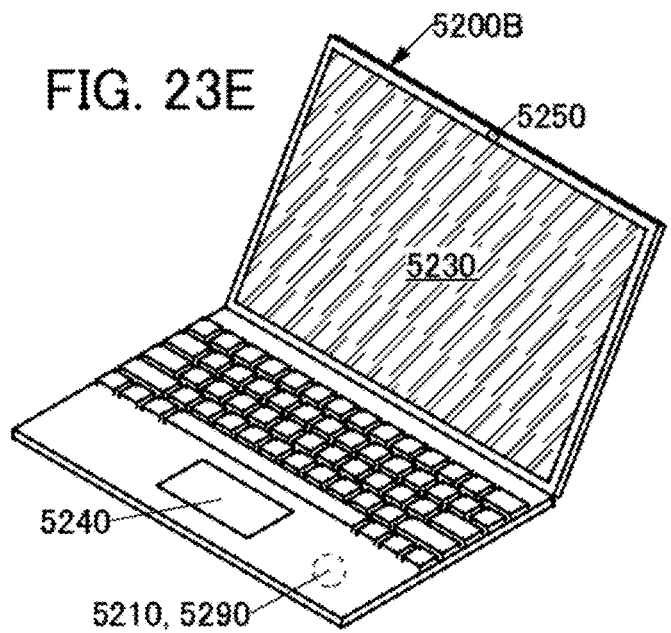

For example, the data processing device 5200B has a function of changing a display method in accordance with the illuminance of a usage environment (see FIG. 23E). Accordingly, for example, a personal computer can display an image in such a manner that the personal computer can be suitably used in an environment under strong external light, e.g., outdoors in fine weather.

Note that this embodiment can be implemented in appropriate combination with any of the other embodiments.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

In the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y, for example. Note that the switch is controlled to be turned on or off. That is, the switch is conducting or not conducting (is turned on or off) to determine whether current flows therethrough. Alternatively, the switch has a function of selecting and changing a current path. Note that the case where X and Y are electrically connected includes the case where X and Y are directly connected.

In the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y, for example. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X through at least Z1 on a first connection path, the first connection path does not include a second connection path, the second connection path includes a connection path on which the transistor is present, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

This application is based on Japanese Patent Application Serial No. 2016-214967 filed with Japan Patent Office on Nov. 2, 2016 and Japanese Patent Application Serial No. 2017-002285 filed with Japan Patent Office on Jan. 11, 2017, the entire contents of which are hereby incorporated by reference.

What is claimed is:

1. A display device comprising:
a display panel;
a controller;
a phase modulation portion; and
a phase demodulation portion,
wherein the phase modulation portion includes a phase regulating portion,
wherein the phase demodulation portion includes a first phase shifter, a first mixer and a second mixer,
wherein the phase modulation portion includes a second phase shifter, a third mixer and a fourth mixer,
wherein a high-frequency signal including image data is input to the first mixer and the second mixer,
wherein a first carrier wave is input to the first phase shifter, which produces a first phase-shifted carrier wave that is input to the first mixer,
wherein the first carrier wave is input to the second mixer,
wherein a second carrier wave is input to the third mixer, the second carrier wave having properties matching the first carrier wave,
wherein the second carrier wave is input to the second phase shifter, which produces a second phase-shifted carrier wave that is input to the fourth mixer,
wherein the phase modulation portion transmits the high-frequency signal and the second carrier wave to the phase demodulation portion through a flexible printed circuit (FPC),
wherein the phase regulating portion adjusts a phase of the high-frequency signal and a phase of the second carrier wave in accordance with characteristics of the FPC,
wherein the phase demodulation portion demodulates the high-frequency signal and extracts the image data,
wherein an output of the first mixer is input to a first filter configured to remove high-frequency components to produce first extracted image data,
wherein an output of the second mixer is input to a second filter configured to remove high-frequency components to produce second extracted image data, and
wherein the controller makes the display panel display an image on the basis of the image data extracted by the phase demodulation portion including the first extracted image data and the second extracted image data.

2. The display device according to claim 1,
wherein the first phase shifter is provided over a substrate included in the display panel.

3. The display device according to claim 1,
wherein a transistor in the phase demodulation portion is a silicon transistor.

4. The display device according to claim 1,
wherein the FPC has a stripline structure or a microstripline structure.

5. The display device according to claim 1,
wherein the FPC has a coplanar line structure.

6. The display device according to claim 1,
wherein the high-frequency signal is phase-shift keying modulated.

7. The display device according to claim 1,
wherein the controller includes a source driver,
wherein the source driver is configured to generate a first data signal and a second data signal on the basis of the image data extracted by the phase demodulation portion,
wherein the display panel includes a reflective element and a light-emitting element,
wherein the reflective element performs display in accordance with the first data signal, and
wherein the light-emitting element performs display in accordance with the second data signal.

8. The display device according to claim 7,
wherein the reflective element is a liquid crystal element, and
wherein the light-emitting element is an organic EL element.

9. The display device according to claim 1,
wherein the display panel includes a transistor including a metal oxide in a channel formation region of the transistor.

10. A semiconductor device comprising:
a phase modulation portion;
a flexible printed circuit (FPC);
a phase demodulation portion;
a controller; and
a display panel,
wherein the phase modulation portion includes a phase regulating portion,
wherein the phase regulating portion is configured to adjust a signal phase in accordance with an electric signal,
wherein image data is input to the phase modulation portion,
wherein the phase modulation portion generates a high-frequency signal including the image data,
wherein the phase regulating portion adjusts a phase of the high-frequency signal in accordance with characteristics of the FPC,
wherein the phase modulation portion transmits the high-frequency signal adjusted by the phase regulating portion to the phase demodulation portion through the FPC,
wherein the phase demodulation portion demodulates the high-frequency signal and extracts the image data, and
wherein the controller makes the display panel display an image on the basis of the image data extracted by the phase demodulation portion.

11. The semiconductor device according to claim 10,
wherein the phase regulating portion includes one or more phase shifters.

12. The semiconductor device according to claim 10,
wherein the phase demodulation portion includes a phase shifter, and
wherein the phase shifter is provided over a substrate included in the display panel.

13. The semiconductor device according to claim 10,
wherein the phase regulating portion includes a transistor including a metal oxide in a channel formation region of the transistor.

14. The semiconductor device according to claim 10,
wherein a transistor in each of the phase modulation portion and the phase demodulation portion is a silicon transistor.

15. The semiconductor device according to claim 10,
wherein the controller includes a source driver,
wherein the source driver is configured to generate a first data signal and a second data signal on the basis of the image data extracted by the phase demodulation portion,
wherein the display panel includes a reflective element and a light-emitting element,
wherein the reflective element performs display in accordance with the first data signal, and wherein the light-emitting element performs display in accordance with the second data signal.

16. The semiconductor device according to claim 15, wherein the reflective element is a liquid crystal element, and
wherein the light-emitting element is an organic EL element.

17. The semiconductor device according to claim 10, wherein the FPC has a stripline structure or a microstripline structure.

18. The semiconductor device according to claim 10, wherein the FPC has a coplanar line structure.

19. The semiconductor device according to claim 10, wherein the phase modulation portion performs phase-shift keying.

20. The semiconductor device according to claim 10, wherein the display panel includes a transistor including a metal oxide in a channel formation region of the transistor.

21. A method for manufacturing a semiconductor device including a phase modulation portion, a flexible printed circuit (FPC), a phase demodulation portion, a controller, and a display panel, comprising:

forming a transistor in a pixel of the display panel and a transistor in the phase demodulation portion simultaneously,
wherein the phase modulation portion includes a phase regulating portion,
wherein the phase regulating portion is configured to adjust a signal phase in accordance with an electric signal,
wherein image data is input to the phase modulation portion,
wherein the phase modulation portion generates a high-frequency signal including the image data,
wherein the phase regulating portion adjusts a phase of the high-frequency signal in accordance with characteristics of the FPC,
wherein the phase modulation portion transmits the high-frequency signal adjusted by the phase regulating portion to the phase demodulation portion through the FPC,
wherein the phase demodulation portion demodulates the high-frequency signal and extracts the image data, and
wherein the controller makes the display panel display an image on the basis of the image data extracted by the phase demodulation portion.

* * * * *